(12) United States Patent
Iwami

(10) Patent No.: US 9,541,785 B2
(45) Date of Patent: Jan. 10, 2017

(54) CONDUCTIVE SHEET, TOUCH PANEL, DISPLAY DEVICE, METHOD FOR PRODUCING CONDUCTIVE SHEET, AND RECORDING MEDIUM

(71) Applicant: FUJIFILM Corporation, Tokyo (JP)

(72) Inventor: Kazuchika Iwami, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 228 days.

(21) Appl. No.: 14/245,831

(22) Filed: Apr. 4, 2014

(65) Prior Publication Data

US 2014/0218642 A1   Aug. 7, 2014

Related U.S. Application Data

(63) Continuation of application No. PCT/JP2012/075486, filed on Oct. 2, 2012.

(30) Foreign Application Priority Data

Oct. 5, 2011   (JP) .................................. 2011-221432

(51) Int. Cl.
*G02F 1/1335*   (2006.01)
*G02F 1/1333*   (2006.01)
(Continued)

(52) U.S. Cl.
CPC ........... *G02F 1/13338* (2013.01); *G06F 3/044* (2013.01); *G06T 7/0004* (2013.01); *H05K 1/0296* (2013.01);
(Continued)

(58) Field of Classification Search
CPC ..... G02F 1/13338; H05K 1/0296; H05K 3/12; G06F 1/13338; G06T 7/0004; G06T 2207/30141; G06T 2207/30121
(Continued)

(56) References Cited

U.S. PATENT DOCUMENTS

2003/0052867 A1   3/2003   Shigetaka et al.
2012/0031746 A1   2/2012   Hwang et al.
(Continued)

FOREIGN PATENT DOCUMENTS

JP   2003-99185 A   4/2003
JP   2004-20482 A   1/2004
(Continued)

OTHER PUBLICATIONS

International Search Report issued in PCT/JP2012/075486, dated Nov. 13, 2012.
(Continued)

*Primary Examiner* — Gustavo Polo
(74) *Attorney, Agent, or Firm* — Birch, Stewart, Kolasch & Birch, LLP

(57) ABSTRACT

The conductive sheet according to the present invention includes a base and a conductive portion that is formed on at least one main surface of the base and is formed from a plurality of thin metal wires, where a mesh pattern in which different mesh shapes are arrayed in plan view is formed by the conductive portion, and the mesh pattern is configured such that, in a power spectrum of a two-dimensional distribution of centroid positions of the mesh shapes, an average intensity on a higher spatial frequency band side than a predetermined spatial frequency is larger than an average intensity on a lower spatial frequency band side than the predetermined spatial frequency. The conductive sheet can reduce the granular feeling of noise due to pattern which the conductive sheet has and greatly improve the visibility of an object for observation.

19 Claims, 43 Drawing Sheets

(51) Int. Cl.
*G06F 3/044* (2006.01)
*G06T 7/00* (2006.01)
*H05K 1/02* (2006.01)
*H05K 3/12* (2006.01)
*G06F 3/045* (2006.01)

(52) U.S. Cl.
CPC .............. *H05K 3/12* (2013.01); *G06F 3/045* (2013.01); *G06F 2203/04112* (2013.01); *G06T 2207/30121* (2013.01); *G06T 2207/30141* (2013.01)

(58) Field of Classification Search
USPC .......................................................... 349/12
See application file for complete search history.

(56) References Cited

U.S. PATENT DOCUMENTS

| | | |
|---|---|---|
| 2013/0028503 A1 | 1/2013 | Wakui et al. |
| 2013/0255998 A1 | 10/2013 | Iwami et al. |

FOREIGN PATENT DOCUMENTS

| | | |
|---|---|---|
| JP | 2009-16700 A | 1/2009 |
| JP | 2009-137455 A | 6/2009 |
| JP | 2009-302439 A | 12/2009 |
| JP | 2011-216377 A | 10/2011 |
| JP | 2011-216379 A | 10/2011 |
| KR | 10-2010-0090669 A | 8/2010 |
| WO | WO 95/27334 A1 | 10/1995 |
| WO | WO 97/18508 A1 | 5/1997 |
| WO | WO 2011/125597 A1 | 10/2011 |
| WO | WO 2012/073858 A1 | 6/2012 |

OTHER PUBLICATIONS

International Preliminary Report on Patentability dated Apr. 17, 2014 (Forms PCT/IB/338, PCT/IB/373 and PCT/IB/237) issued in PCT/JP2012/075486.
Korean Office Action, issued Nov. 26, 2015, for Korean Application No. 10-2014-7009013, along with a partial English translation.
Korean Office Action with a partial English translation thereof, dated May 28, 2015, for Korean Application No. 10-2014-7009013.
Extended European Search Report, dated Sep. 29, 2015, for European Application No. 12838744.6.
Partial Supplementary European Search Report dated Jun. 9, 2015, for European Application No. 12838744.6.
Japanese Office Action dated Apr. 7, 2015, issued in corresponding Japanese Patent Application No. 2011-221432.
Taiwanese Office Action, issued Apr. 26, 2016, in corresponding Taiwanese Application No. 101136704, along with a partial English translation.
Chinese Office Action issued on May 5, 2016 in corresponding Chinese Application No. 201280059581.5.

ImgInit

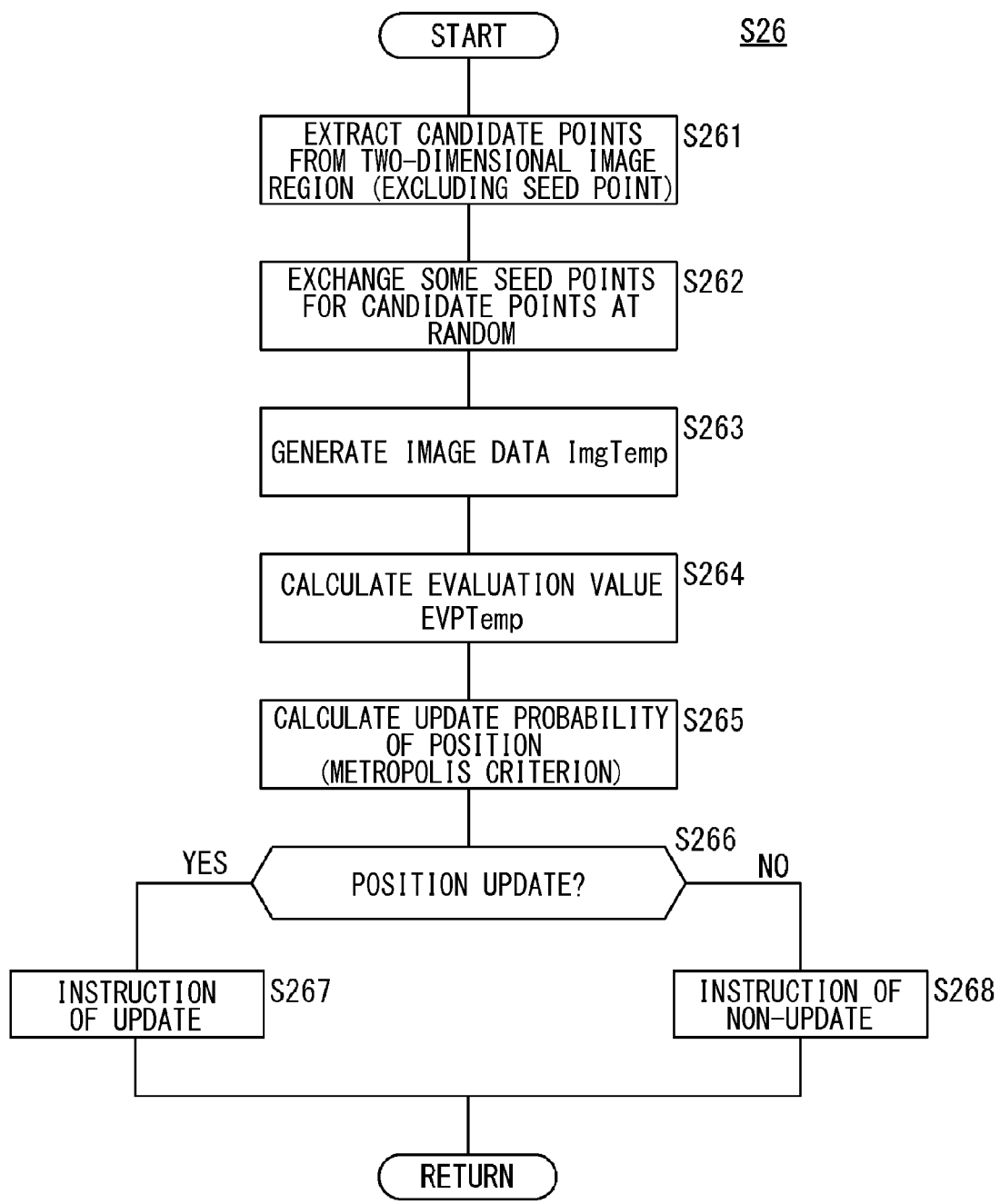

FIG. 37
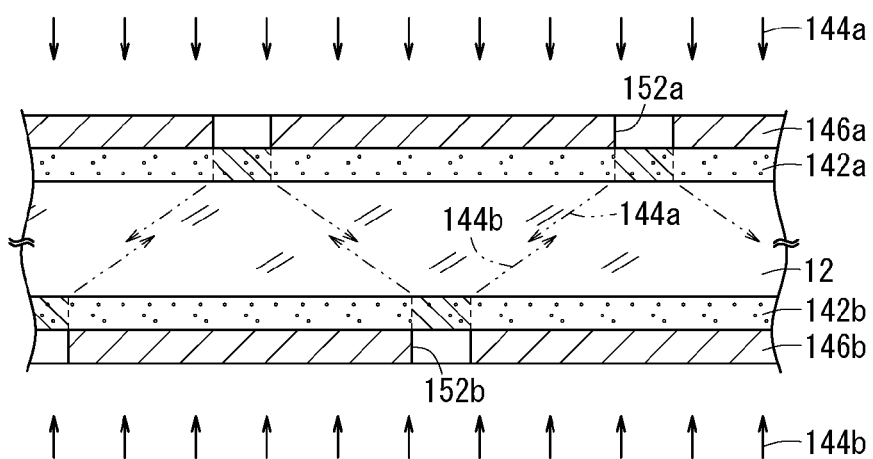
FIG. 38
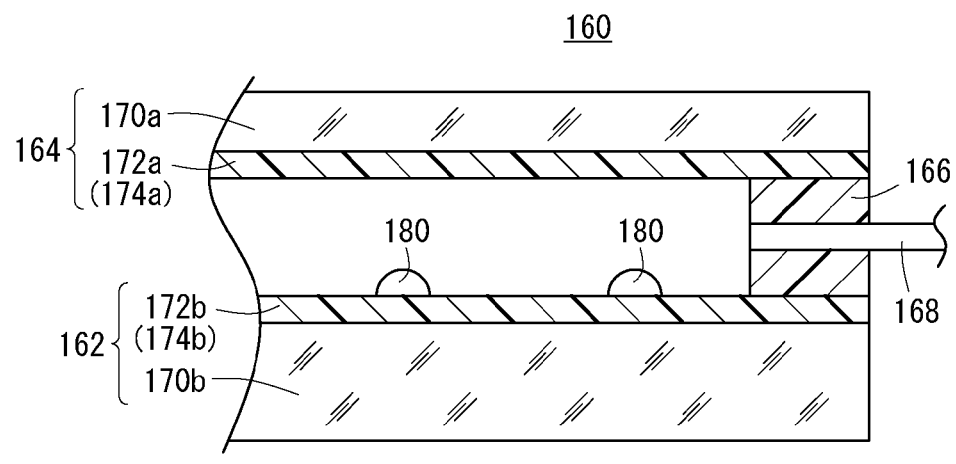
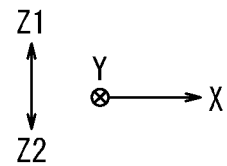

(COMPARATIVE EXAMPLE)

(COMPARATIVE EXAMPLE)

(COMPARATIVE EXAMPLE)

CONDUCTIVE SHEET, TOUCH PANEL, DISPLAY DEVICE, METHOD FOR PRODUCING CONDUCTIVE SHEET, AND RECORDING MEDIUM

CROSS REFERENCE TO RELATED APPLICATIONS

This application is a continuation application of International Application PCT/JP2012/075486 filed on Oct. 2, 2012, which claims priority under 35 U.S.C. 119(a) to Application No. 2011-221432 filed in Japan on Oct. 5, 2011, all of which are hereby expressly incorporated by reference into the present application.

BACKGROUND OF THE INVENTION

The present invention relates to a conductive sheet, a touch panel and a display device including the conductive sheet, a method for producing the conductive sheet, and a recording medium on which a program is recorded.

In recent years, electronic apparatuses including a touch panel have become widely used. The touch panel is mounted in many apparatuses including a small-size screen, such as a mobile phone or a personal digital assistant (PDA). In the future, the mounting of the touch panel in apparatuses including a large-size screen, such as a display for a personal computer (PC), is adequately expected.

As a conventional touch panel electrode, in terms of optical transparency, an indium tin oxide (ITO) is mainly used. It is known that the electric resistance per unit area of the ITO is relatively high compared with those of metals and the like. That is, in the case of the ITO, as the size of the screen (total area of the touch panel) increases, the surface resistance of the entire electrode increases. As a result, since the transmission rate of the current between electrodes is reduced, a problem that the time until the contact position is detected after touching the touch panel (that is, response speed) increases becomes noticeable.

Therefore, various techniques for reducing the surface resistance by configuring electrodes by forming a number of lattices with a thin wire (thin metal wire) that is formed of a metal with low electric resistance have been proposed (refer to Pamphlet of WO 1995/27334, Pamphlet of WO 1997/18508 and JP 2003-099185 A).

Incidentally, when the same mesh shape is regularly arrayed, there is a disadvantage in that moire (interference fringes) is easily generated in relation to pixels constituting a display screen. Therefore, various techniques for improving the visibility of an object for observation by arraying the respective mesh shapes regularly or irregularly to suppress the granular feeling of noise (also referred to as feeling of roughness) have been proposed.

For example, as shown in FIG. 46A, JP 2009-137455 A ([0029]) discloses a window for a movable body for riding including a mesh layer 4 and the pattern PT1 of the shape thereof in plan view. In the mesh layer 4, an arc-shaped conductive wire 2 obtained by eliminating a part of the circle is repeatedly disposed in a lattice shape and the end of the arc-shaped wire 2 is connected near the center of the adjacent arc-shaped wires 2. JP 2009-137455 A describes that not only visibility but also the electromagnetic wave shielding property and the resistance to breakage can be improved thereby.

As shown in FIG. 46B, JP 2009-16700 A ([0022] to [0024]) discloses a transparent conductive substrate produced using a solution that forms a mesh-like structure on a substrate naturally when left after being coated on one surface of the substrate, that is, a self-organizing metal particle solution, and the pattern PT2 of the shape thereof in plan view. JP 2009-16700 A describes that the irregular mesh-like structure, which does not cause a moire phenomenon, is obtained thereby.

As shown in FIG. 46C, JP 2009-302439 A ([0011] to [0015]) discloses a light-transmissive electromagnetic wave shielding material and the pattern PT3 of the shape thereof in plan view. In the material, an electromagnetic wave shielding layer 6 has a structure of a sea region of a sea island structure and the shapes of island regions 8 as openings surrounded by the electromagnetic wave shielding layer 6 are mutually different. JP 2009-302439 A describes that thereby, the optical transparency and the electromagnetic wave shielding property are improved without occurrence of moire.

However, when further reducing the granular feeling of noise and improve the visibility in the patterns PT1 and PT2 disclosed in Patent Literatures 4 and 5, there is a structural problem of the patterns.

For example, in the mesh-like pattern PT1 disclosed in JP 2009-137455 A, the arc-shaped wire 2 is repeatedly disposed in a lattice shape. Accordingly, the periodicity of the wire 2 is very high. That is, when the power spectrum of the pattern PT1 is calculated, it is predicted that a sharp peak is present in a spatial frequency band corresponding to the inverse of the arrangement interval of the wire 2. Here, in order to further improve the visibility of the pattern PT1, it is necessary to reduce the size (diameter) of the arc of the wire 2.

In the mesh-like pattern PT2 disclosed in JP 2009-16700 A, the shape or size of the mesh is irregular, and accordingly, irregularity is very high. That is, when the power spectrum of the pattern PT2 is calculated, it is predicted that an approximately fixed value (close to white noise characteristics) is obtained regardless of a spatial frequency band. Here, in order to further improve the visibility of the pattern PT2, it is necessary to reduce the size of self-organization.

Therefore, in both the patterns PT1 and PT2, when further improving the visibility, there is a disadvantage in that the light transmittance or productivity is reduced.

Further, the pattern PT3 disclosed in JP 2009-302439 A does not form a mesh shape. Accordingly, a variation occurs in the wiring shape of the cut edge. Therefore, when the pattern PT3 is used, for example, as an electrode, there is a disadvantage in that stable current transmission performance is not obtained.

SUMMARY OF THE INVENTION

The present invention has been made in order to solve the above-described problems, and an object of the present invention is to provide a conductive sheet, a touch panel, and a display device capable of reducing the granular feeling of noise due to the pattern and capable of significantly improving the visibility of an object for observation, a method for producing the conductive sheet, and a recording medium on which a program is recorded.

The conductive sheet according to the present invention includes: a base; and a conductive portion that is formed on at least one main surface of the base and is formed from a plurality of thin metal wires, wherein a mesh pattern in which different mesh shapes are arrayed in plan view is formed by the conductive portion, and the mesh pattern is configured such that, in a power spectrum of a two-dimensional distribution of centroid positions of the mesh shapes, an average intensity on a higher spatial frequency band side than a predetermined spatial frequency is larger than an average intensity on a lower spatial frequency band side than the predetermined spatial frequency.

Preferably, the predetermined spatial frequency is a spatial frequency at which visual response characteristics of human are equivalent to 5% of a maximum response.

Preferably, the visual response characteristics of human are visual response characteristics obtained based on a Dooley-Shaw function at a distance of distinct vision of 300 mm, and the predetermined spatial frequency is 6 cycles/mm.

Preferably, the predetermined spatial frequency is a spatial frequency at which a value of the power spectrum is maximized.

Preferably, each of the mesh shapes is a polygonal shape.

Preferably, each of the mesh shapes is determined in accordance with a Voronoi diagram based on a plurality of positions in a planar region.

Preferably, each of the mesh shapes is determined in accordance with a Delaunay diagram based on a plurality of positions in a planar region.

Preferably, in a two-dimensional distribution of the centroid positions, a root mean square deviation of the centroid positions which are disposed along a predetermined direction with respect to a direction perpendicular to the predetermined direction is equal to or greater than 15 μm and equal to or less than 65 μm.

Preferably, the mesh pattern is formed by arraying the mesh shapes without a space.

The mesh pattern may include repeated shapes.

Preferably, the conductive portion includes a first conductive portion, which is formed on one main surface of the base and is formed from a plurality of thin metal wires, and a second conductive portion, which is formed on the other main surface of the base and is formed from a plurality of thin metal wires, and the mesh pattern is formed by combining the first and second conductive portions.

Preferably, the conductive sheet further includes: a first protective layer that is provided on the one main surface and covers the first conductive portion; and a second protective layer that is provided on the other main surface and covers the second conductive portion, and a relative refractive index of the base with respect to the first protective layer and/or a relative refractive index of the base with respect to the second protective layer are equal to or greater than 0.86 and equal to or less than 1.15.

Preferably, the conductive sheet further includes: a first dummy electrode portion that is formed on the one main surface and is formed from a plurality of thin metal wires electrically insulated from the first conductive portion, and the first conductive portion includes a plurality of first conductive patterns which are disposed in one direction and to which a plurality of first sensing portions are respectively connected, the first dummy electrode portion includes a plurality of first dummy patterns disposed in an opening portion between the first conductive patterns adjacent to each other, and a wiring density of the first dummy patterns is equal to a wiring density of the first conductive patterns.

Preferably, the conductive portion is formed on one main surface of the base.

The touch panel according to the present invention includes: the conductive sheet according to any one of the above-described conductive sheets; and a detection control unit that detects a contact position or a proximity position from a main surface side of the conductive sheet.

The display device according to the present invention includes: the conductive sheet according to any one of the above-described conductive sheets; a detection control unit that detects a contact position or a proximity position from the one main surface side of the conductive sheet; and a display unit that displays an image on a display screen based on a display signal, wherein the conductive sheet is disposed on the display screen with the other main surface side facing the display unit.

The method for producing a conductive sheet according to the present invention includes: a generation step of generating image data representing a design of a mesh pattern in which different mesh shapes are arrayed; a calculation step of calculating an evaluation value, which quantifies a degree of variation of centroid positions of the mesh shapes, based on the generated image data; a determination step of determining a piece of the image data as output image data based on the calculated evaluation value and predetermined evaluation conditions; and an output step of obtaining a conductive sheet, in which the mesh pattern is formed on a base in plan view, by outputting and forming a conductive wire on the base based on the determined output image data.

The program according to the present invention causes a computer to function as: an image data generation unit for generating image data representing a design of a mesh pattern in which different mesh shapes are arrayed; an evaluation value calculation unit for calculating an evaluation value, which quantifies a degree of variation of centroid positions of the mesh shapes, based on the image data generated by the image data generation unit; and an image data determination unit for determining a piece of the image data as output image data based on the evaluation value calculated by the evaluation value calculation unit and predetermined evaluation conditions.

Preferably, the evaluation value calculation unit calculates the evaluation value based on a power spectrum of a two-dimensional distribution of the centroid positions.

Preferably, the evaluation value calculation unit calculates, in a two-dimensional distribution of the centroid positions, a statistical value of the centroid positions, which are disposed along a predetermined direction, with respect to a direction perpendicular to the predetermined direction as the evaluation value.

The recording medium according to the present invention is a computer-readable recording medium that records the program described above.

The recording medium according to the present invention is a computer-readable recording medium that causes a computer to execute as a procedure: a generation step of generating image data representing a design of a mesh pattern in which different mesh shapes are arrayed; a calculation step of calculating an evaluation value, which quantifies a degree of variation of centroid positions of the mesh shapes, based on the generated image data; and a determination step of determining a piece of the image data as output image data based on the calculated evaluation value and predetermined evaluation conditions.

Preferably, in the calculation step, the evaluation value is calculated based on a power spectrum of a two-dimensional distribution of the centroid positions.

Preferably, in the calculation step, in a two-dimensional distribution of the centroid positions, a statistical value of the centroid positions, which are disposed along a predetermined direction, with respect to a direction perpendicular to the predetermined direction is calculated as the evaluation value.

According to the conductive sheet, the touch panel, and the display device of the present invention, the mesh pattern is formed such that the average intensity on the side of the higher spatial frequency band than the predetermined spatial frequency is larger than the average intensity on the side of the lower spatial frequency band than the predetermined spatial frequency in the power spectrum of the two-dimensional distribution of the centroid positions of the respective mesh shapes. Therefore, the amount of noise on the side of the higher spatial frequency band is relatively larger compared with that on the side of the lower spatial frequency band. Since the visual perception of human has a property in which the response characteristics in the low spatial frequency band are superior, but the response characteristics abruptly deteriorate in the middle to high spatial frequency bands, feeling of noise that human feels visually is lowered. Accordingly, it is possible to reduce the granular feeling of noise due to pattern which the conductive sheet has and to greatly improve the visibility of an object for observation.

According to the method for producing a conductive sheet and the recording medium on which the program is recorded of the present invention, image data representing the design of the mesh pattern in which different mesh shapes are arrayed is generated, an evaluation value quantifying the degree of variation of the centroid position of each of the mesh shapes is calculated based on the image data, and a piece of the image data is determined as output image data based on the evaluation value and predetermined evaluation conditions. Therefore, it is possible to determine each mesh shape having noise characteristics satisfying the predetermined evaluation conditions. In other words, by controlling the pattern shape appropriately, it is possible to reduce the granular feeling of noise and to greatly improve the visibility of an object for observation.

BRIEF DESCRIPTION OF THE DRAWINGS

FIG. 32 is a flowchart showing the detail of step S26 shown in FIG. 27.

FIG. 37 is a schematic explanatory diagram showing the execution state of first exposure processing and second exposure processing.

FIG. 38 is a schematic cross-sectional view of a touch panel according to a first modification.

DETAILED DESCRIPTION OF THE INVENTION

Hereinafter, a preferred embodiment of a conductive sheet according to the present invention will be described in detail in relation to a touch panel and a display device in which the conductive sheet is used and with reference to the accompanying diagrams. In the present specification, the term "to" is used to represent a numerical range, and this means a numerical range including the numerical values described before and after "to" as lower and upper limits.

[The Present Embodiment]

Figure 1A:
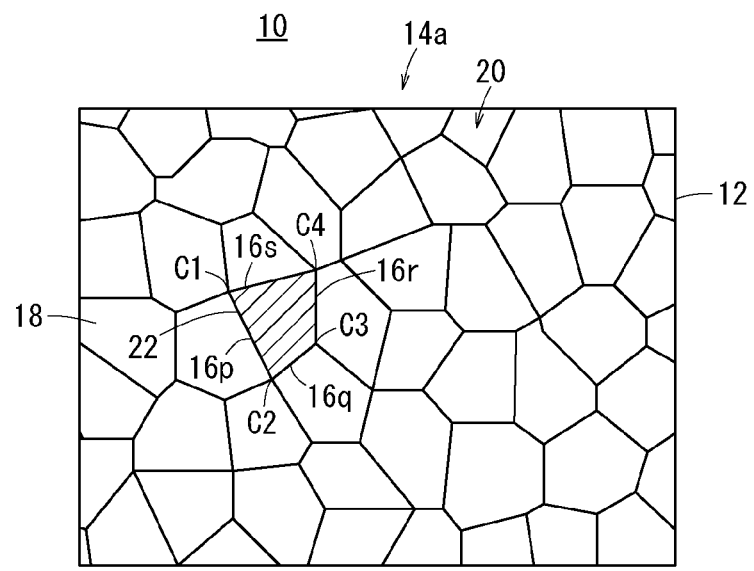
FIG. 1A is a schematic plan view showing an example of a conductive sheet according to the present embodiment.
Figure 1B:
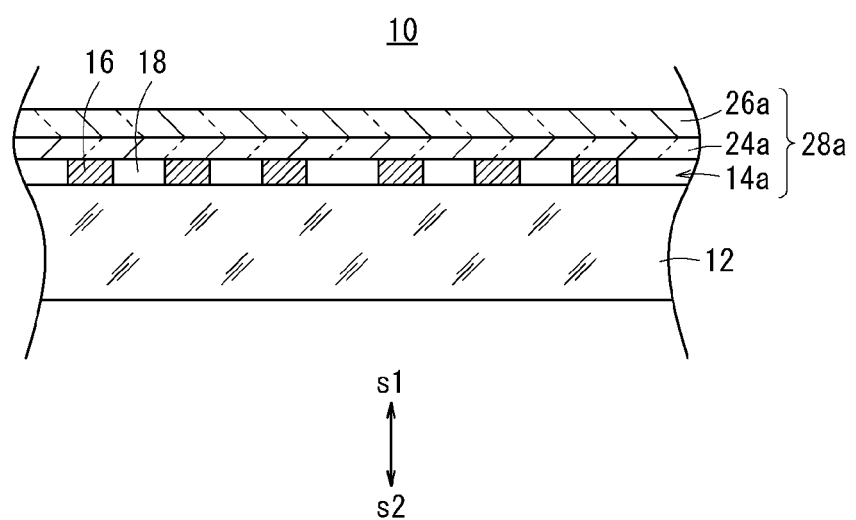
FIG. 1B is a cross-sectional view of the conductive sheet shown in FIG. 1A in which a part of the conductive sheet is omitted.

As shown in FIGS. 1A and 1B, a conductive sheet 10 according to the present embodiment includes a transparent base 12 (base). The transparent base 12 having insulation properties and high translucency is formed of a material such as a resin, a glass, and silicon. As examples of the resin, polyethylene terephthalate (PET), polymethyl methacrylate (PMMA), polypropylene (PP), polystyrene (PS), and the like can be mentioned.

A first conductive portion 14a and a first dummy electrode portion 15a (refer to FIGS. 2A and 2B) are formed on one main surface (arrow s1 direction side in FIG. 1B) of the transparent base 12. The first conductive portion 14a and the first dummy electrode portion 15a have a mesh pattern 20 formed by a thin wire made of metal (hereinafter, referred to as a thin metal wire 16 and also referred to as thin metal wire $16p$, $16q$, $16r$, or $16s$ in some cases) and an opening 18. The thin metal wire 16 is made of gold (Au), silver (Ag), or copper (Cu), for example. The line width of the thin metal wire 16 can be selected from 30 µm or less.

Specifically, the first conductive portion 14a and the first dummy electrode portion 15a have the mesh pattern 20 in which different mesh shapes 22 are arrayed without any space. In other words, the mesh pattern 20 is a random pattern with no regularity (uniformity) for each mesh shape 22. For example, the hatched mesh shape 22 in the mesh pattern 20 is a quadrangular shape, and is formed by a thin metal wire $16p$ linearly connecting the apices C1 and C2 to each other, a thin metal wire $16q$ linearly connecting the apices C2 and C3 to each other, a thin metal wire $16r$ linearly connecting the apices C3 and C4 to each other, and a thin metal wire $16s$ linearly connecting the apices C4 and C1 to each other. As is understood from FIG. 1B, all of the mesh shapes 22 are polygonal shapes having at least three sides.

The "polygon" hereinafter described in this specification includes not only a geometrically perfect polygon but also a "substantial polygon" in which the above perfect polygon is slightly changed. As examples of the slight change, addition of a point element and a line element that are small compared with the mesh shape 22, partial defect of each side (thin metal wire 16) that forms the mesh shape 22, and the like can be mentioned.

A first protective layer 26a is bonded to approximately the entire surface of the first conductive portion 14a with a first adhesive layer 24a interposed therebetween so as to cover the thin metal wire 16. As materials of the first adhesive layer 24a, a wet lamination adhesive, a dry laminate adhesive, a hot melt adhesive, or the like can be mentioned.

Similarly to the transparent base 12, the first protective layer 26a is formed of a material having high translucency, such as a resin, a glass, and silicon. The refractive index n1 of the first protective layer 26*a* is a value that is equal to or close to the refractive index n0 of the transparent base 12. In this case, the relative refractive index nr1 of the transparent base 12 with respect to the first protective layer 26*a* is a value close to 1.

Here, the refractive index in this specification means a refractive index for light with a wavelength of 589.3 nm (D line of sodium). For example, in regard to resins, the refractive index is defined by ISO 14782: 1999 (corresponding to JIS K 7105) that is an international standard. In addition, the relative refractive index nr1 of the transparent base 12 with respect to the first protective layer 26*a* is defined as nr1=(n1/n0). Here, it is preferable that the relative refractive index nr1 be in a range of 0.86 or more and 1.15 or less, and a range of 0.91 or more and 1.08 or less is more preferable.

The conductive sheet 10 is used as electrodes for various devices such as an inorganic EL device, an organic EL device, or a solar cell, for example. Other than the application to electrodes, the conductive sheet 10 can also be applied to a transparent heating element that generates heat when a current is caused to flow (for example, a defroster of a vehicle) and an electromagnetic shielding material to block electromagnetic waves.

Figure 2A:
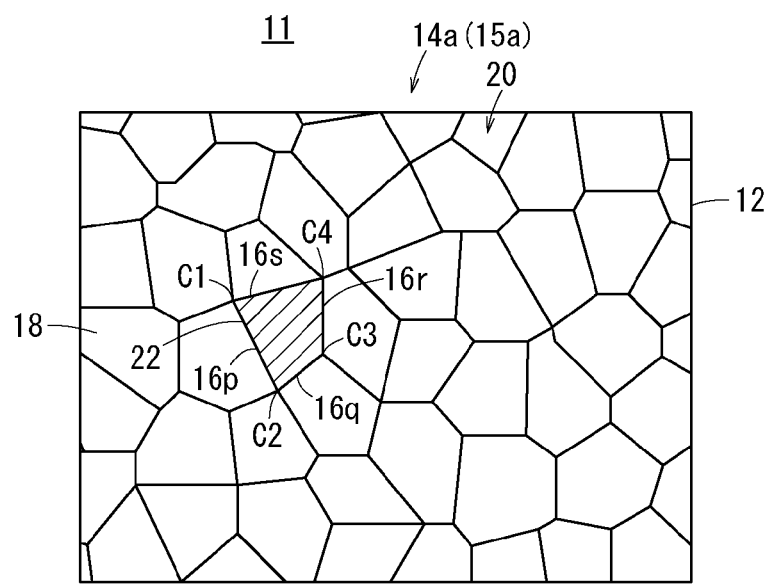
FIG. 2A is a schematic plan view showing another example of the conductive sheet according to the present embodiment.
Figure 2B:
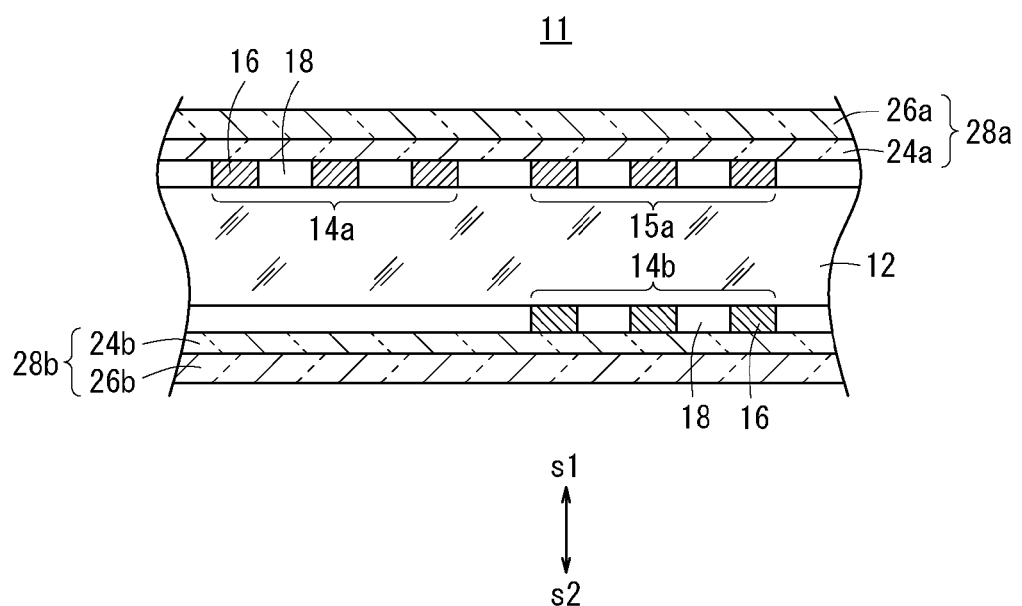
FIG. 2B is a cross-sectional view of the conductive sheet shown in FIG. 2A in which a part of the conductive sheet is omitted.

In a conductive sheet 11 according to the present embodiment, as shown in FIGS. 2A and 2B, not only the first conductive portion 14*a* but also the first dummy electrode portion 15*a* is formed on one main surface (arrow s1 direction side in FIG. 2B) of the transparent base 12. The first conductive portion 14*a* and the first dummy electrode portion 15*a* has the mesh pattern 20 formed by the thin metal wire 16 and the opening 18. In the conductive sheet 11 applied to the touch panel, the line width of the thin metal wire 16 is preferably in the range of 0.1 μm or more and 15 μm or less, more preferably in the range of 1 μm or more and 9 μm or less, and even more preferably in the range of 2 μm or more and 7 μm or less.

Here, the first dummy electrode portion 15*a* is disposed so as to be spaced apart from the first conductive portion 14*a* by a predetermined distance. That is, the first dummy electrode portion 15*a* is in a state where it is electrically insulated from the first conductive portion 14*a*. The first protective layer 26*a* is bonded to approximately the entire surfaces of the first conductive portion 14*a* and the first dummy electrode portion 15*a* via the first adhesive layer 24*a* so as to cover the thin metal wire 16.

Hereinafter, the respective portions (including the first conductive portion 14*a*, the first dummy electrode portion 15*a*, the first adhesive layer 24*a*, and the first protective layer 26*a*) formed on the one main surface (arrow s1 direction side in FIGS. 1B and 2B) of the transparent base 12 is collectively referred to as a first laminate portion 28*a* in some cases.

A second conductive portion 14*b* is formed on the other main surface (arrow s2 direction side in FIG. 2B) of the transparent base 12. Similarly to the first conductive portion 14*a*, the second conductive portion 14*b* has the mesh pattern 20 formed by the thin metal wire 16 and the opening 18. The transparent base 12 is formed of an insulating material, and the second conductive portion 14*b* is in a state where it is electrically insulated from the first conductive portion 14*a* and the first dummy electrode portion 15*a*.

A second protective layer 26*b* is bonded to approximately the entire surface of the second conductive portion 14*b* with a second adhesive layer 24*b* interposed therebetween so as to cover the thin metal wire 16. The material of the second adhesive layer 24*b* may be the same as that of the first adhesive layer 24*a*, or may be different from that of the first adhesive layer 24*a*. The material of the second protective layer 26*b* may be the same as that of the first protective layer 26*a*, or may be different from that of the first protective layer 26*a*.

The refractive index n2 of the second protective layer 26*b* is a value that is equal to or close to the refractive index n0 of the transparent base 12. In this case, the relative refractive index nr2 of the transparent base 12 with respect to the second protective layer 26*b* is a value close to 1. Here, the definitions of the refractive index and the relative refractive index are as described above. The relative refractive index nr2 of the transparent base 12 with respect to the second protective layer 26*b* is defined as nr2=(n2/n0). Here, it is preferable that the relative refractive index nr2 be in a range of 0.86 or more and 1.15 or less, and a range of 0.91 or more and 1.08 or less is more preferable.

Hereinafter, the respective portions (including the second conductive portion 14*b*, the second adhesive layer 24*b*, and the second protective layer 26*b*) formed on the other main surface (arrow s2 direction side in FIG. 2B) of the transparent base 12 is collectively referred to as a second laminate portion 28*b* in some cases.

The conductive sheet 11 is applied to a touch panel of a display unit 30 (display unit), for example. The display unit 30 may be formed of a liquid crystal panel, a plasma panel, an organic electro-luminescence (EL) panel, an inorganic EL panel, and the like.

Figure 3:
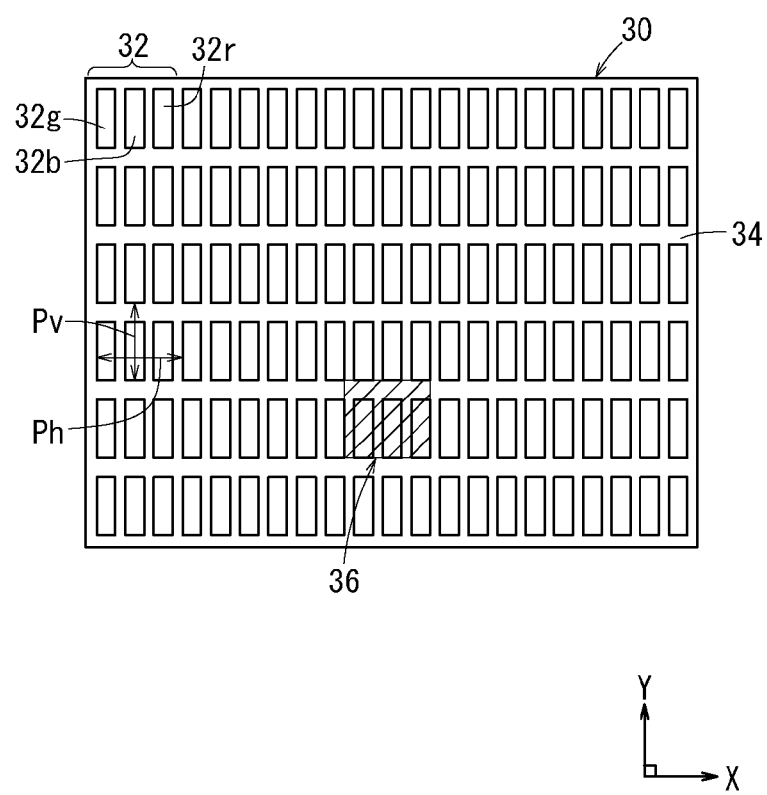
FIG. 3 is a schematic explanatory diagram showing the pixel arrangement of a display unit.

As shown in FIG. 3 in which a part thereof is omitted, the display unit 30 is constituted by arraying a plurality of pixels 32 in a matrix form. One pixel 32 is formed by arraying three subpixels (a red subpixel 32*r*, a green subpixel 32*g*, and a blue subpixel 32*b*) in a horizontal direction. Each subpixel has a rectangular shape that is long in a vertical direction. The arrangement pitch of the pixels 32 in the horizontal direction (horizontal pixel pitch Ph) and the arrangement pitch of the pixels 32 in the vertical direction (vertical pixel pitch Pv) are approximately the same. That is, a shape (refer to a shaded region 36) including one pixel 32 and a black matrix 34 (light blocking material) surrounding the one pixel 32 is a square. In addition, the aspect ratio of one pixel 32 is not 1, and the horizontal length is larger than the vertical length. When the conductive sheet 10 is disposed on the display panel of the display unit 30 having the pixel arrangement described above, there is almost no interference of the spatial frequency between the arrangement period of the pixels 32 and the thin metal wire 16 formed at random, and thus the generation of moire is suppressed.

Next, a display device 40 including the conductive sheet 11 according to the present embodiment will be described with reference to FIGS. 4 to 8. Here, a projected capacitive touch panel will be described as an example.

Figure 4:
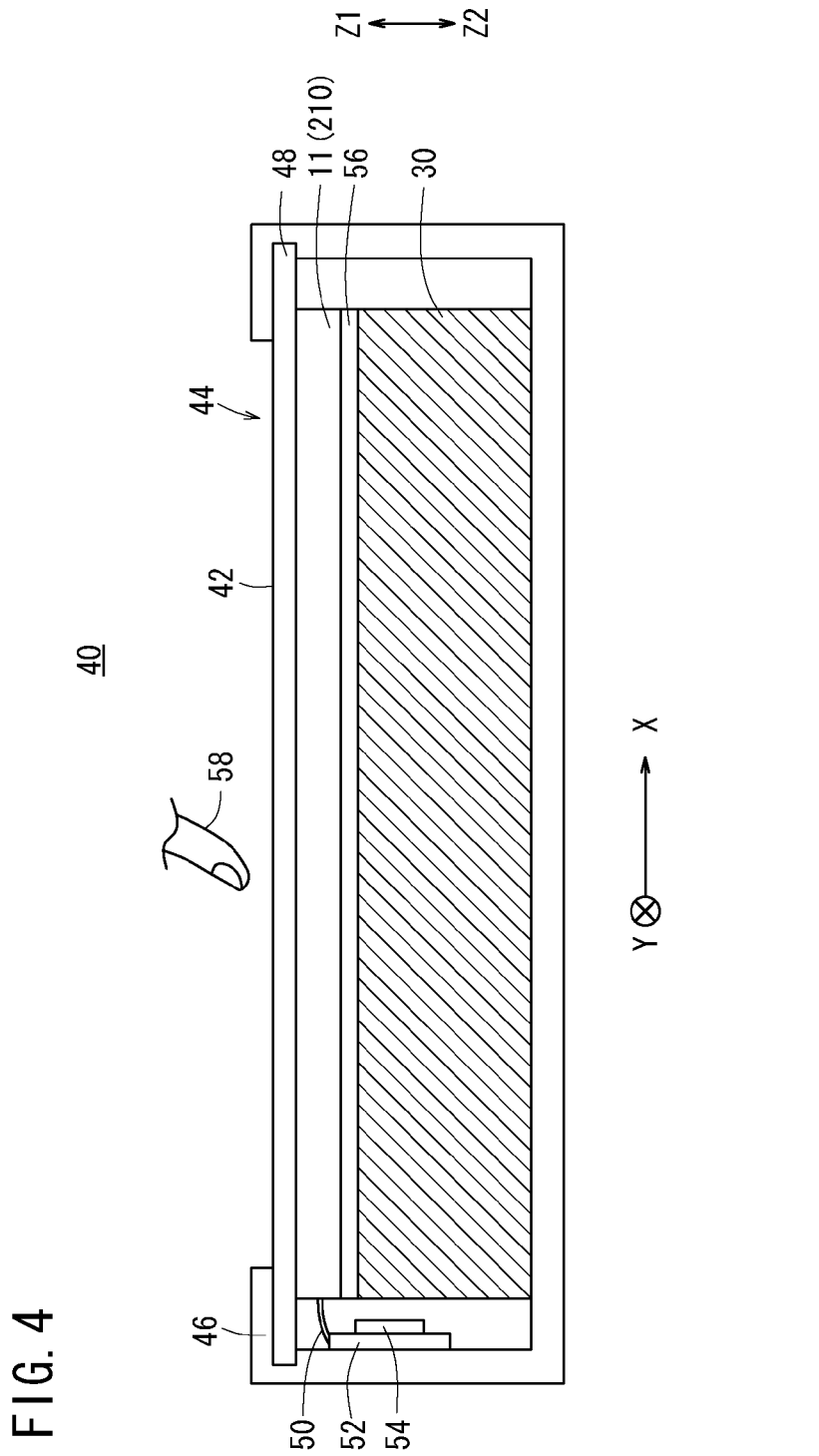
FIG. 4 is a schematic cross-sectional view of a display device including the conductive sheet shown in FIG. 2A.

As shown in FIG. 4, the display device 40 includes the display unit 30 (refer to FIG. 3) that can display a color image and/or a monochrome image, a touch panel 44 that detects a contact position from an input screen 42 (arrow Z1 direction side), and a housing 46 in which the display unit 30 and the touch panel 44 are housed. The user can access the touch panel 44 through a large opening provided on the surface (arrow Z1 direction side) of the housing 46.

The touch panel 44 includes not only the conductive sheet 11 (refer to FIGS. 2A and 2B) described above but also a cover member 48 laminated on the surface (arrow Z1 direction side) of the conductive sheet 11, a flexible substrate 52 electrically connected to the conductive sheet 11 through a cable 50, and a detection control unit 54 disposed on the flexible substrate 52.

The conductive sheet 11 is bonded to the surface (arrow Z1 direction side) of the display unit 30 through an adhesive layer 56. The conductive sheet 11 is disposed on the display screen such that the other main surface side (second conductive portion 14b side) faces the display unit 30.

The cover member 48 functions as the input screen 42 by covering the surface of the conductive sheet 11. In addition, by preventing direct contact of a contact body 58 (for example, a finger or a stylus pen), it is possible to suppress the occurrence of a scratch, adhesion of dust, and the like, and thus it is possible to stabilize the conductivity of the conductive sheet 11.

For example, the material of the cover member 48 may be a glass or a resin film. One surface (arrow Z2 direction side) of the cover member 48 may be coated with silicon oxide or the like and be bonded to one surface (arrow Z1 direction side) of the conductive sheet 11. In order to prevent damage due to rubbing or the like, the conductive sheet 11 and the cover member 48 may be pasted together.

The flexible substrate 52 is an electronic substrate having flexibility. In the example shown in this diagram, the flexible substrate 52 is fixed to the inner wall of the side surface of the housing 46, but the position fixedly set up may be changed in various ways. The detection control unit 54 constitutes an electronic circuit that catches a change in the capacitance between the contact body 58 and the conductive sheet 11 and detects the contact position (or the proximity position) when the contact body 58 that is a conductor is brought into contact with (or comes close to) the input screen 42.

Figure 5A:
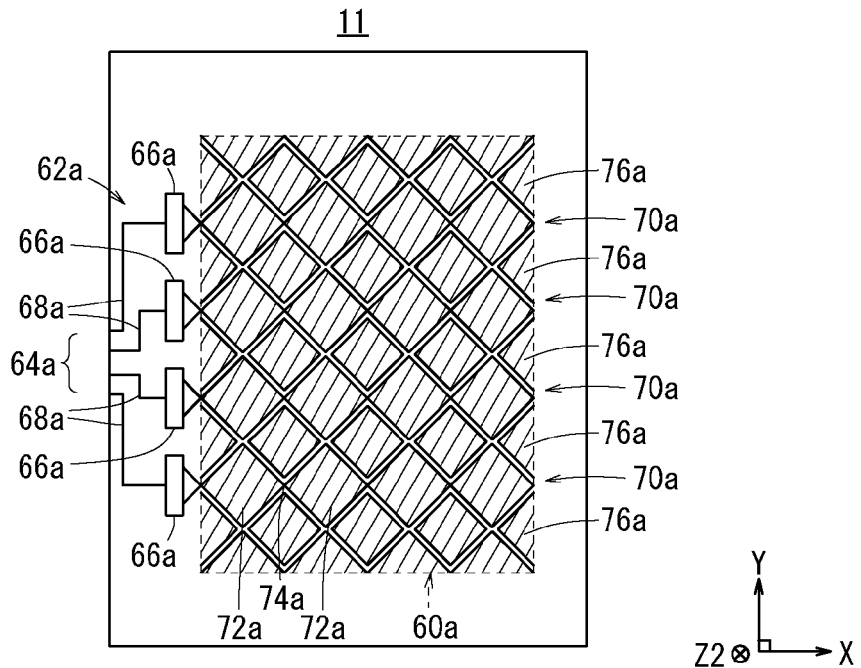
FIG. 5A is a plan view showing an example of the pattern of a first conductive portion shown in FIG. 2A.

As shown in FIG. 5A, a first sensor portion 60a, which is disposed in the display region of the display unit 30 (refer to FIGS. 3 and 4), and a first terminal wiring portion 62a (so-called frame), which is disposed in the outer peripheral region of the display region, are provided on one main surface of the conductive sheet 11 in plan view in the arrow Z2 direction.

The external shape of the conductive sheet 11 in plan view is a rectangular, and the external shape of the first sensor portion 60a is also a rectangular. In a peripheral portion of the first terminal wiring portion 62a on one side of the conductive sheet 11 parallel to the arrow Y direction, a plurality of first terminals 64a are formed in a central portion in the longitudinal direction so as to be arrayed in the arrow Y direction. A plurality of first connection portions 66a are arrayed in approximately one row along one side (side parallel to the arrow Y direction in the example shown in this diagram) of the first sensor portion 60a. A first terminal wiring pattern 68a derived from each of the first connection portions 66a is drawn toward the first terminal 64a in the outer peripheral region of the display region described above, and is electrically connected to the corresponding first terminal 64a.

In a portion corresponding to the first sensor portion 60a, two or more first conductive patterns 70a (mesh pattern) formed by a plurality of thin metal wires 16 (refer to FIGS. 2A and 2B) are provided. The first conductive pattern 70a extends in the arrow X direction (first direction), and is arrayed in the arrow Y direction (second direction) perpendicular to the arrow X direction. In addition, each of the first conductive patterns 70a is formed by connecting two or more first sensing portions 72a in series to each other in the arrow X direction. The respective first sensing portions 72a, each of which has a contour of almost a rhombic shape, have the same contour shape. Between the first sensing portions 72a adjacent to each other, a first connection portion 74a that electrically connects the first sensing portions 72a to each other is formed. More specifically, an apex angle portion of one first sensing portion 72a is connected to an apex angle portion of another first sensing portion 72a, which is adjacent to the one first sensing portion 72a described above in the arrow X direction, through the first connection portion 74a.

At one end side of the first conductive pattern 70a, the first connection portion 74a is not formed at the open end of the first sensing portion 72a. At the other end side of the first conductive pattern 70a, the first connection portion 66a is provided at the end of the first sensing portion 72a. Then, the first conductive pattern 70a is electrically connected to the first terminal wiring pattern 68a through the first connection portion 66a.

In a portion corresponding to the first sensor portion 60a, two or more first dummy patterns 76a (mesh pattern) formed by a plurality of thin metal wires 16 (refer to FIGS. 2A and 2B) are provided. Each of the first dummy patterns 76a is disposed in a first opening portion 75a (refer to FIG. 6) between the adjacent first conductive patterns 70a. The first dummy pattern 76a having a contour of almost a rhombic shape is disposed so as to be spaced apart from the first conductive pattern 70a (the first sensing portion 72a and the first connection portion 74a) by a predetermined distance. This distance (width) is very small compared with the length of one side of the first sensing portion 72a. Therefore, the thin metal, wires 16 are wired in an approximately uniform density on the entire surface of the first sensor portion 60a.

Figure 6:
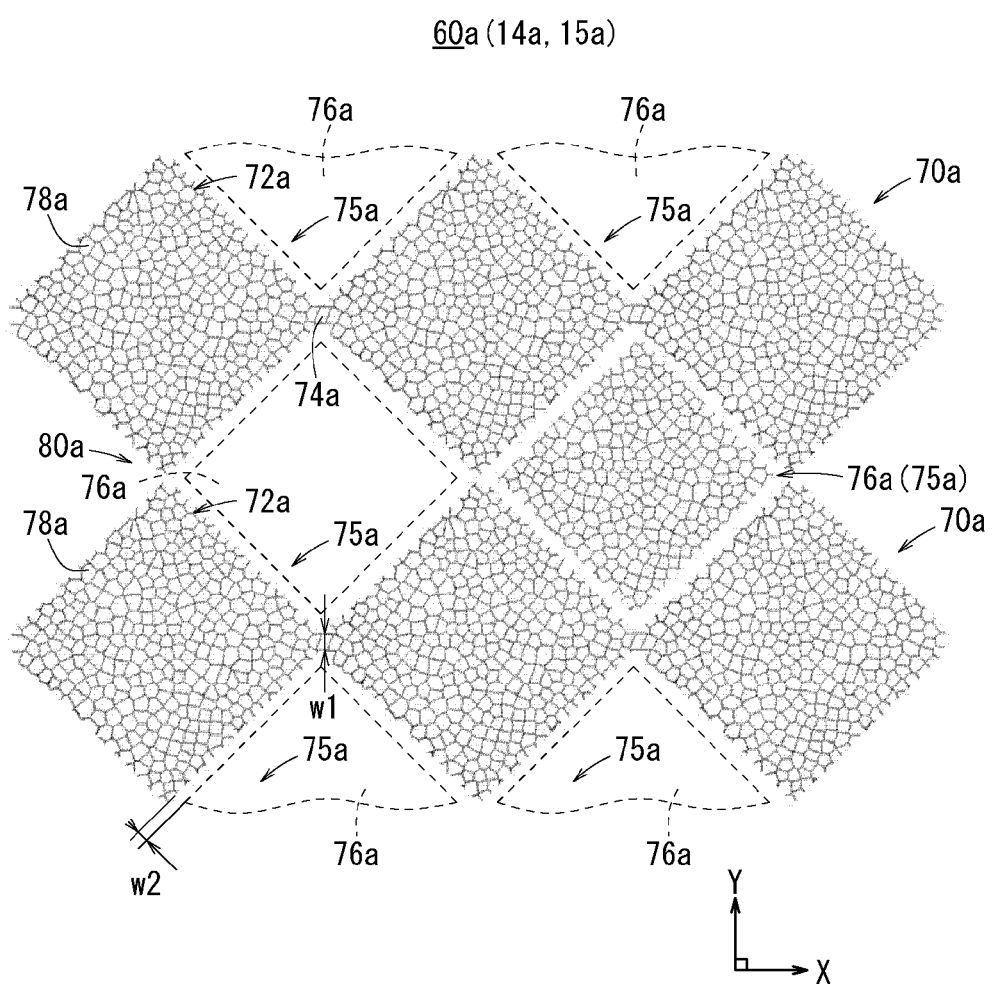
FIG. 6 is a partially enlarged plan view of a first sensor portion shown in FIG. 5A.

For convenience of explanation, in FIG. 6, each mesh shape is shown in detail for only one first dummy pattern 76a (middle right portion of the diagram). The contours of the other first dummy patterns 76a are shown by a dotted line, and the shape of the inside thereof is omitted.

As shown in FIG. 6, each of the first sensing portions 72a and each of the first dummy patterns 76a are formed by combining two or more first mesh elements 78a. Similarly to the mesh shape 22 (refer to FIG. 2B) described above, the shape of the first mesh element 78a is a polygonal shape having at least three sides. In addition, the first connection portion 74a that connects the adjacent first sensing portions 72a to each other is formed by at least one first mesh element 78a.

The first mesh element 78a that forms a peripheral portion of each of the first sensing portions 72a and each of the first dummy patterns 76a may be a topologically closed space or a topologically open space. This is the same for the first connection portion 74a.

Further, between the adjacent first conductive patterns 70a, a first insulation portion 80a that is electrically insulated is disposed.

Here, the wiring density of the first dummy pattern 76a is equal to the wiring density of the first conductive pattern 70a (the first sensing portion 72a and the first connection portion 74a). In this case, the light reflectance in the planar region of the first dummy pattern 76a agrees with the light reflectance in the planar region of the first conductive pattern 70a. This is because there is a high correlation between the wiring density and the light reflectance when the line width of the thin metal wire 16 is fixed.

In this description, the wording of "wiring densities are equal" is a concept including not only the case where the wiring densities are completely equal but also the case where the wiring densities are substantially equal (the density ratio is in a range of approximately 0.8 to 1.2). That is, the difference in light reflectance has only to be a degree that cannot be detected by the visual perception of human (viewer). Further, the measurement area of the wiring density of the thin metal wire 16 has only to be equal to or greater than 1 mm² in consideration of the measurement accuracy and the like.

In addition, the distance between the first conductive pattern 70a and the first dummy pattern 76a may be fixed regardless of the position ("approximately fixed" is also included). This is preferable since the wiring density of the thin metal wire 16 becomes almost uniform.

Further, it is preferable that the coverage (arrangement ratio) of the first dummy pattern 76a with respect to the first opening portion 75a be in a range of approximately 30% to 95%, and a range of 70% to 95% is more preferable.

Moreover, the contour of the first dummy pattern 76a can be various shapes including a triangle, a rectangle, and a circle. For example, the contour of the first dummy pattern 76a may be the same as or similar to the contour shape of the first sensing portion 72a (approximately rhombic shape in the example shown in FIG. 5A).

Figure 5B:
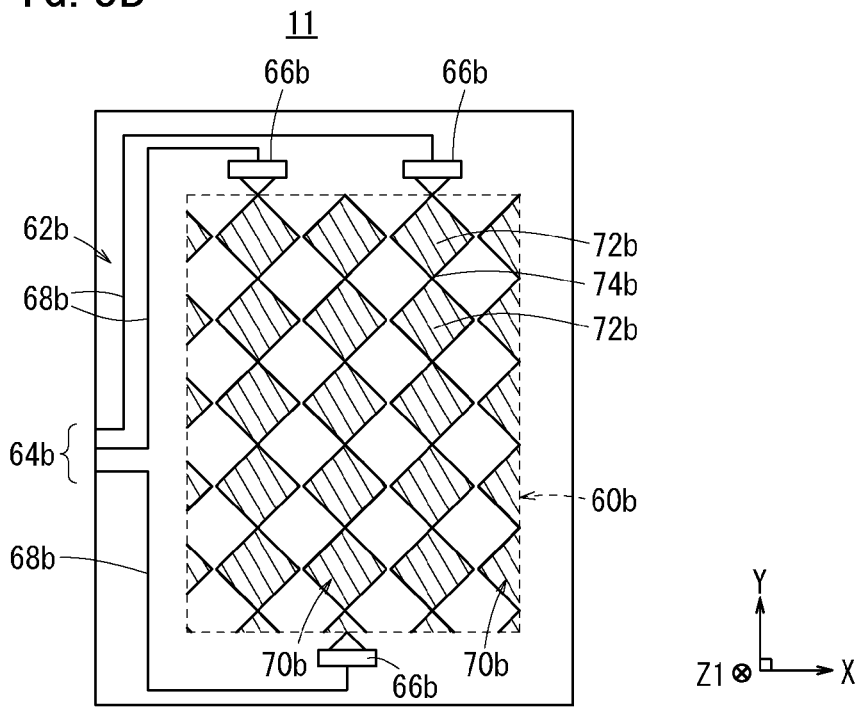
FIG. 5B is a plan view showing an example of the pattern of a second conductive portion shown in FIG. 2A.

On the other hand, as shown in FIG. 5B, a second sensor portion 60b, which is disposed in the display region of the display unit 30 (refer to FIGS. 3 and 4), and a second terminal wiring portion 62b (so-called frame), which is disposed in the outer peripheral region of the display region, are provided on the other main surface of the conductive sheet 11 in plan view in the arrow Z1 direction.

The external shape of the conductive sheet 11 in plan view is a rectangular, and the external shape of the second sensor portion 60b is also a rectangular. In a peripheral portion of the second terminal wiring portion 62b on one side of the conductive sheet 11 parallel to the arrow Y direction, a plurality of second terminals 64b are formed in a central portion in the longitudinal direction so as to be arrayed in the arrow Y direction. A plurality of second connection portions 66b (for example, odd-numbered second connection portions 66b) are arrayed in approximately one row along one side (side parallel to the arrow X direction in the example shown in this diagram) of the second sensor portion 60b. A plurality of second connection portions 66b (for example, even-numbered second connection portions 66b) are arrayed in approximately one row along the other side (opposite side to the side described above) of the second sensor portion 60b. A second terminal wiring pattern 68b derived from each of the second connection portions 66b is drawn toward the second terminal 64b in the outer peripheral region of the display region described above, and is electrically connected to the corresponding second terminal 64b.

In a portion corresponding to the second sensor portion 60b, two or more second conductive patterns 70b (mesh pattern) formed by a plurality of thin metal wires 16 (refer to FIGS. 2A and 2B) are provided. The second conductive pattern 70b extends in the arrow Y direction (second direction), and is arrayed in the arrow X direction (first direction) perpendicular to the arrow Y direction. In addition, each of the second conductive patterns 70b is formed by connecting two or more second sensing portions 72b in series to each other in the arrow Y direction. The respective second sensing portions 72b, each of which has a contour of almost a rhombic shape, have the same contour shape. Between the second sensing portions 72b adjacent to each other, a second connection portion 74b that electrically connects the second sensing portions 72b to each other is formed. More specifically, an apex angle portion of one second sensing portion 72b is connected to an apex angle portion of another second sensing portion 72b, which is adjacent to the one second sensing portion 72b described above in the arrow Y direction, through the second connection portion 74b.

At one end side of the second conductive pattern 70b, the second connection portion 74b is not formed at the open end of the second sensing portion 72b. At the other end side of the second conductive pattern 70b, the second connection portion 66b is provided at the end of the second sensing portion 72b. Then, the second conductive pattern 70b is electrically connected to the second terminal wiring pattern 68b through the second connection portion 66b.

In addition, in the second sensor portion 60b, unlike the first sensor portion 60a (refer to FIGS. 5A and 6), no dummy pattern is disposed in a second opening portion 75b between the adjacent second conductive patterns 70b.

Figure 7:
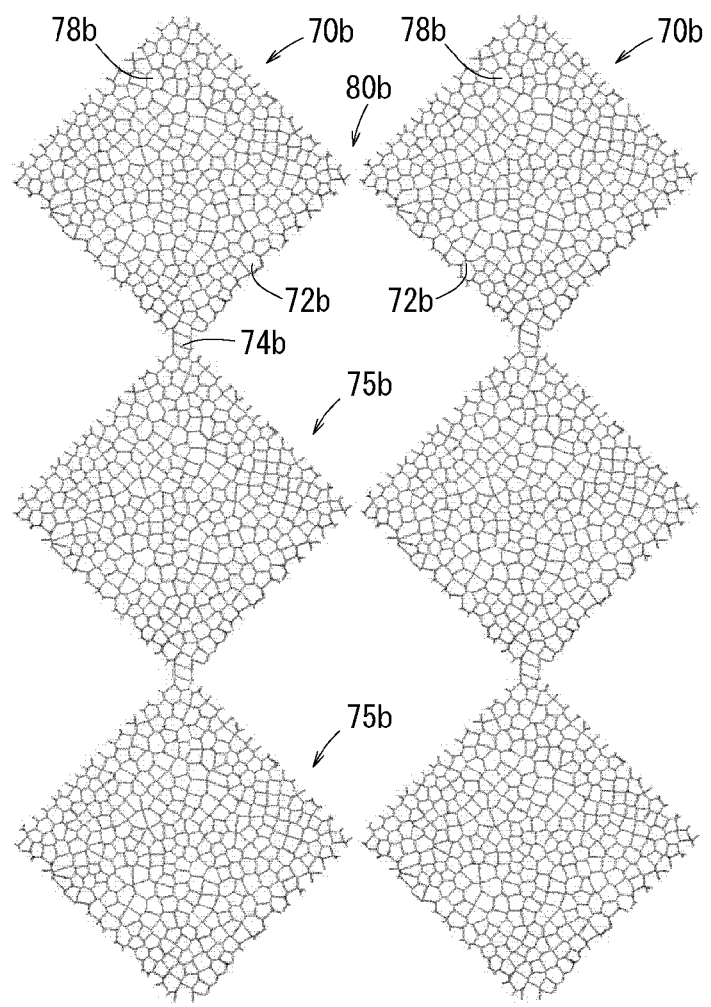
FIG. 7 is a partially enlarged plan view of a second sensor portion shown in FIG. 5B.

As shown in FIG. 7, each of second sensing portions 72b is formed by combining two or more second mesh elements 78b. Similarly to the mesh shape 22 (refer to FIG. 2A) described above, the shape of the second mesh element 78b is a polygonal shape having at least three sides. The second connection portion 74b that connects the adjacent second sensing portions 72a to each other is formed by at least one second mesh element 78b.

In addition, the second mesh element 78b that forms a peripheral portion of the second sensing portion 72b may be a topologically closed space or a topologically open space. This is the same for the second connection portion 74b.

Further, between the adjacent second conductive patterns 70b, a second insulation portion 80b that is electrically insulated is disposed.

Figure 8:
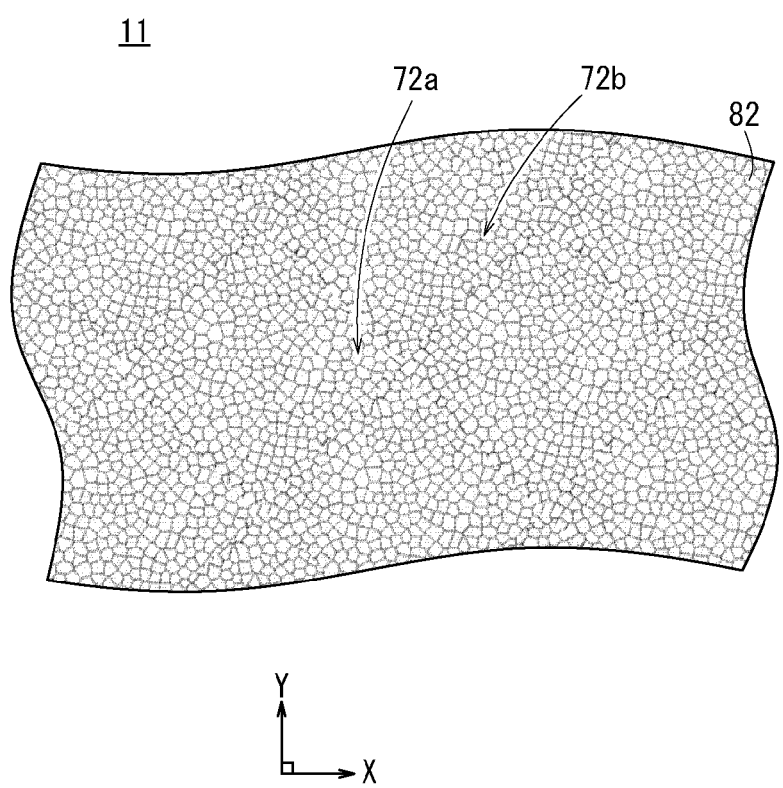
FIG. 8 is a schematic plan view of a conductive sheet in a state where first and second conductive portions are combined.

As shown in FIG. 8, the second conductive pattern 70b formed on the other surface (arrow Z2 direction side) is arrayed such that an opening (a part of the first opening portion 75a) between the first conductive pattern 70a and the first dummy pattern 76a formed on the one surface (arrow Z1 direction side) is embedded in plan view of the conductive sheet 11. In addition, in a planar region where the contour of the first conductive pattern 70a and the contour of the second conductive pattern 70b overlap each other, the positions of the thin metal wires 16 of both the first and second conductive patterns 70a and 70b completely match each other. Further, in a planar region where the contour of the first dummy pattern 76a and the contour of the second conductive pattern 70b overlap each other, the positions of the thin metal wires 16 of both the first dummy pattern 76a and the second conductive pattern 70b completely match each other. As a result, the entire surface of the conductive sheet 11 is filled with a number of polygons 82 (mesh shapes) in plan view of the conductive sheet 11.

It is preferable that the length of one side of the first sensing portion 72a (and the second sensing portion 72b) be 3 mm to 10 mm, and 4 mm to 6 mm is more preferable. When the conductive sheet 11 is applied to the touch panel, if the length of one side is less than the lower limit described above, the capacitance of the first sensing portion 72a (and the second sensing portion 72b) at the time of detection is reduced, and accordingly, a possibility of detection failure is increased. On the other hand, if the length of one side exceeds the upper limit described above, there is a possibility that the detection accuracy of the contact position will be reduced. From the same point of view, as described above, it is preferable that the average length of one side of the polygon 82 (first and second mesh elements 78a and 78b) be 100 µm to 400 µm, 150 µm to 300 µm is more preferable, and 210 µm to 250 µm is most preferable. When one side of the polygon 82 is in the range described above, it is also possible to maintain the transparency more satisfactorily. Accordingly, when the conductive sheet 11 is attached to the front surface of the display unit 30, it is possible to view the display without uncomfortable feeling.

Referring back to FIG. 6, it is preferable that the width w1 of the first connection portion 74a be 0.2 mm to 1.0 mm, and 0.4 mm to 0.8 mm is more preferable. When w1 is less than the lower limit described above, the number of wiring lines for connecting the first sensing portions 72a is reduced, and accordingly, the resistance between electrodes is increased. On the other hand, when w1 exceeds the upper limit described above, the overlapping area between the first and second sensing portions 72a and 72b is increased, and accordingly, the amount of noise is increased. The same is true regarding the width of the second connection portion 74b (refer to FIG. 7).

It is preferable that the separation width w2 between the first and second sensing portions 72a and 72b be 0.1 mm to 0.6 mm, and 0.2 mm to 0.5 mm is more preferable. When w2 is less than the lower limit described above, the variation in capacitance due to the contact (or the proximity) of the contact body 58 is reduced, and accordingly, the amount of signal is reduced. On the other hand, when w2 exceeds the upper limit described above, the density of the first sensing portions 72a is reduced, and accordingly, the resolution of the sensor is reduced.

Figure 9A:
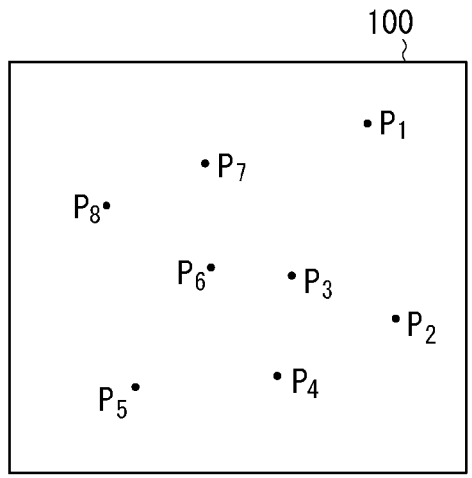
FIG. 9A is a schematic explanatory diagram showing a result of the selection of eight points from one planar region.

Subsequently, an example of a method of determining the wiring shapes of the first conductive portion 14a, the first dummy electrode portion 15a, and the second conductive portion 14b will be described with reference to FIGS. 9A to 9C.

In the present embodiment, the mesh pattern 20 is determined from a plurality of positions that exist in one planar region 100. As shown in FIG. 9A, it is assumed that eight seed points $P_1$ to $P_8$ are randomly selected from the square planar region 100.

Figure 9B:
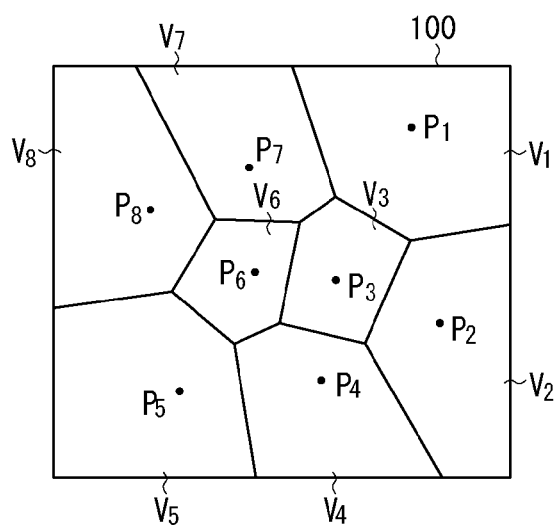
FIG. 9B is a schematic explanatory diagram showing a result of the determination of the wiring shape according to the Voronoi diagram.

FIG. 9B is a schematic explanatory diagram showing a result of the determination of the wiring shape according to the Voronoi diagram (Voronoi tessellation method). In this way, eight regions $V_1$ to $V_8$ surrounding the eight seed points $P_1$ to $P_8$ are determined. Here, the region $V_i$ (i=1 to 8) divided by the Voronoi diagram indicates an aggregate of points that are points to which the seed point $P_i$ is closest. Here, the Euclidean distance is used as a distance function, but it is possible to use various functions.

Figure 9C:
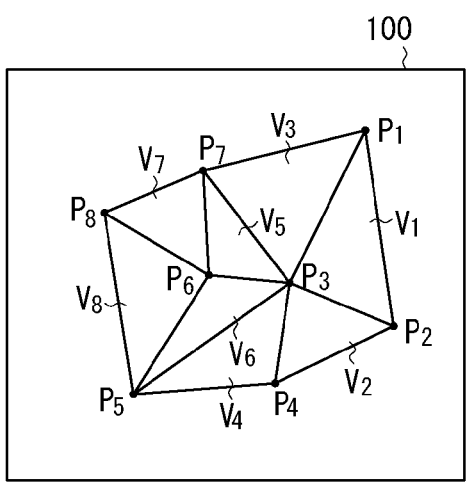
FIG. 9C is a schematic explanatory diagram showing a result of the determination of the wiring shape according to the Delaunay diagram.

FIG. 9C is a schematic explanatory diagram showing a result of the determination of the wiring shape according to the Delaunay diagram (Delaunay triangulation method). The Delaunay triangulation method is a method of determining a triangular region by connecting the adjacent points among the seed points $P_1$ to $P_8$. By the method, the eight regions $V_1$ to $V_8$ having the eight seed points $P_1$ to $P_8$ as the apices are determined.

In this manner, a wiring shape having the thin metal wire 16 as each boundary line shown in FIG. 9B (or FIG. 9C) and the opening 18 as each region $V_i$, that is, each mesh shape 22 when the first conductive portion 14a, the first dummy electrode portion 15a, and the second conductive portion 14b overlap each other is determined.

Subsequently, an evaluation value quantifying the noise characteristics (for example, granular noise) of the conductive sheets 10 and 11 according to the present invention will be described in detail with reference to FIGS. 10A to 18B. In order to mathematically evaluate the wiring shape of the mesh pattern 20, it is necessary to acquire image data to visualize the design of the mesh pattern 20 in advance. This image data Img may be color value data of the conductive sheets 10 and 11 read using an input device such as a scanner, or may be image data that is actually used in forming the output of the mesh pattern 20. In any case, it is preferable that the image data Img have a high resolution (small pixel size) that can express the average line width of the thin metal wire 16 with one or more pixels.

[First Evaluation Value]

A first evaluation value EV1 is an index that quantifies predetermined physical characteristics on the basis of a two-dimensional power spectrum at the centroid position of the mesh shape 22. Hereinafter, the first evaluation value EV1 will be described with reference to FIGS. 10A to 17B.

Figure 10A:
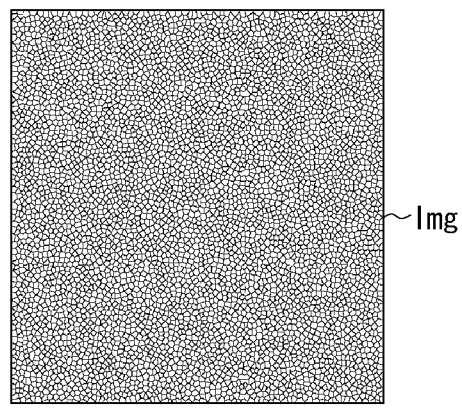
FIG. 10A is a schematic explanatory diagram visualizing image data representing the design of the mesh pattern.

FIG. 10A is a schematic explanatory diagram visualizing the image data Img representing the design of the mesh pattern 20. First, a Fourier transformation (for example, fast Fourier transformation; FFT) is performed on the image data Img. Accordingly, the shape of the mesh pattern 20 can be grasped not as a partial shape but as an overall tendency (spatial frequency distribution).

Figure 10B:
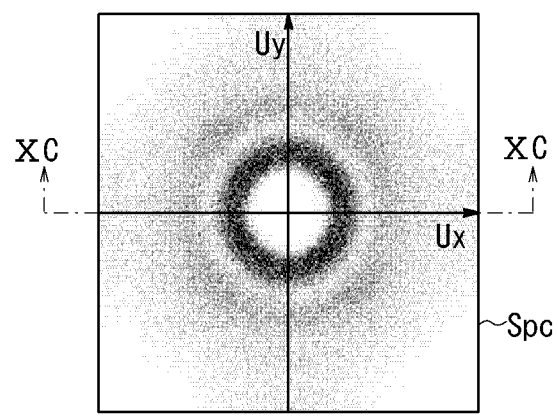
FIG. 10B is a distribution map of the power spectrum obtained by performing the FFT on the image data shown in FIG. 10A.

FIG. 10B is a distribution map of the two-dimensional power spectrum (hereinafter, simply referred to as a spectrum Spc) obtained by performing the FFT on the image data Img shown in FIG. 10A. Here, the horizontal axis of the distribution map indicates a spatial frequency with respect to the X-axis direction, and the vertical axis thereof indicates a spatial frequency with respect to the Y-axis direction. In addition, the intensity level (value of the spectrum) decreases as the display density of each spatial frequency band decreases, and the intensity level increases as the display density increases. In the example of this diagram, the distribution of the spectrum Spc is isotropic and has two circular peaks.

Figure 10C:
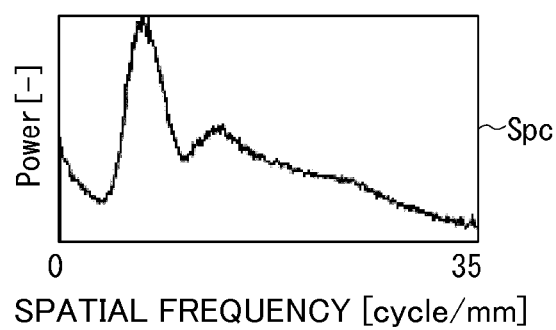
FIG. 10C is a cross-sectional view taken along the line XC-XC of the power spectrum distribution shown in FIG. 10B.

FIG. 10C is a cross-sectional view taken along the line XC-XC of the distribution of the spectrum Spc shown in FIG. 10B. Since the spectrum Spc is isotropic, FIG. 10C is equivalent to the radial distribution for all angular directions. As is understood from this diagram, the spectrum Spc has so-called band-pass type characteristics in which the intensity levels in the low spatial frequency band and the high spatial frequency band are low and the intensity level is high only in the middle spatial frequency band. That is, according to the terminology of the image engineering, the image data Img shown in FIG. 10A can be said to represent a design having the characteristics of "green noise".

Figure 11:
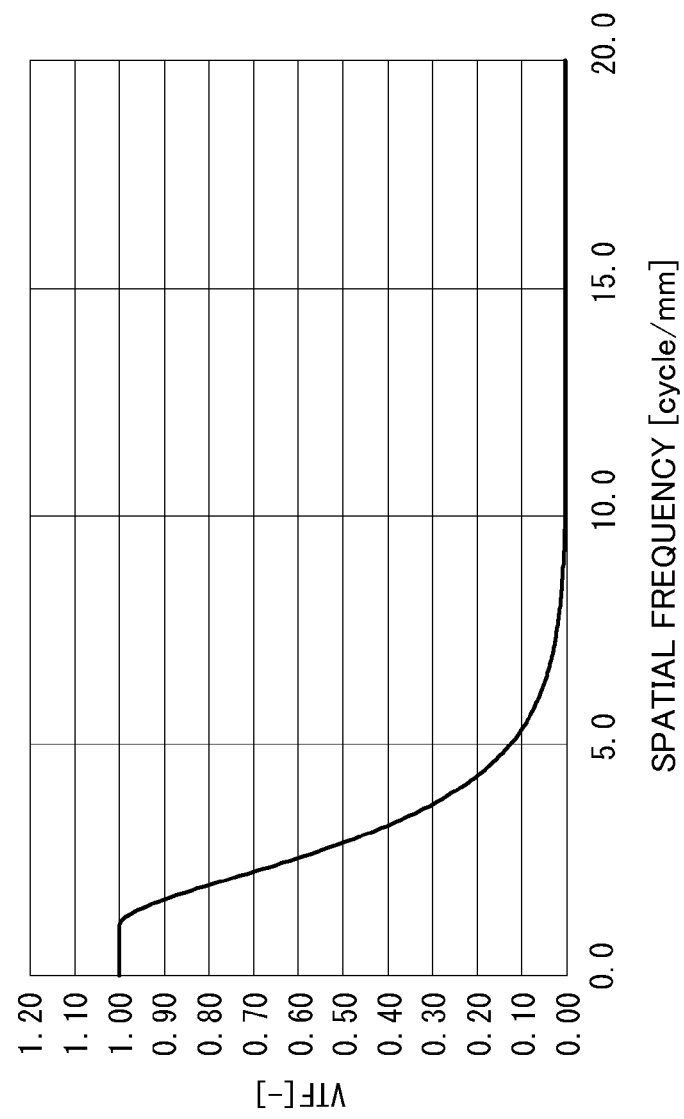
FIG. 11 is a graph showing an example of the standard visual response characteristics of human.

FIG. 11 is a graph showing an example of the standard visual response characteristics of human.

In the present embodiment, the Dooley-Shaw function at the viewing distance of 300 mm under the distinct vision state is used as the standard visual response characteristics of human. The Dooley-Shaw function is a kind of visual transfer function (VTF), and is a typical function imitating the standard visual response characteristics of human. Specifically, this is equivalent to the square value of the contrast ratio characteristic of brightness. The horizontal axis of the graph is a spatial frequency (unit: cycle/mm), and the vertical axis thereof is a value of the VTF (unit: no dimension).

Assuming that the viewing distance is 300 mm, the value of the VTF is fixed (equal to 1) in the range of 0 to 1.0 cycle/mm, and the value of the VTF tends to decrease gradually as the spatial frequency increases. That is, this function functions as a low pass filter to cut off the middle to high spatial frequency bands.

Figure 12:
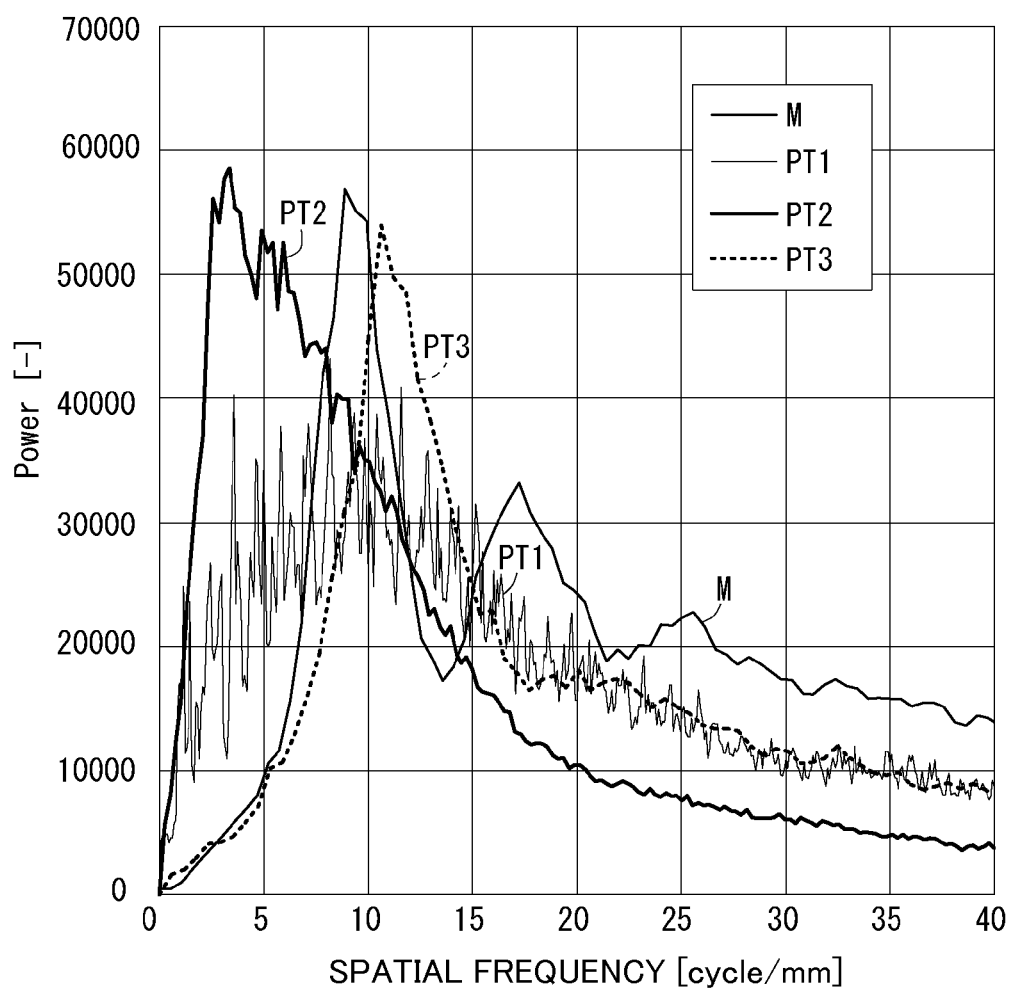
FIG. 12 is a cross-sectional view taken along the X axis of the power spectrum obtained by performing the FFT on the image data of the mesh pattern according to the present embodiment and various patterns according to conventional examples.

FIG. 12 is a cross-sectional view taken along the X axis of the spectrum Spc obtained by performing the FFT on the image data Img representing the designs of the mesh pattern 20 according to the present embodiment and various patterns PT1 to PT3 according to conventional examples.

Figure 46A:
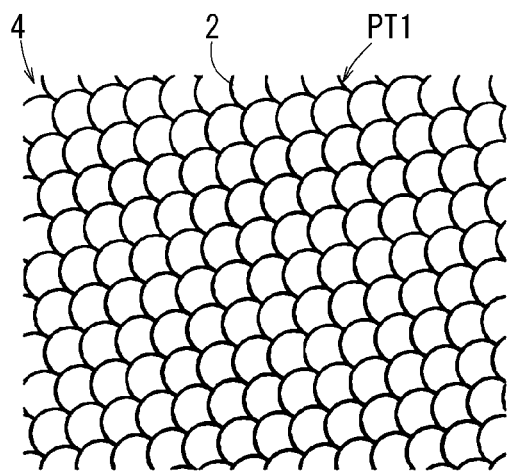
FIGS. 46A to 46C are enlarged plan views of the pattern according to comparative examples.
Figure 46B:
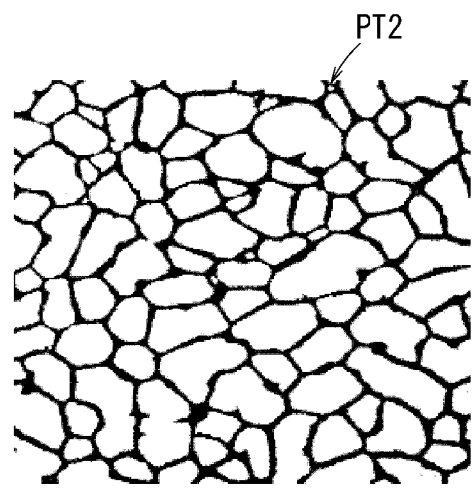
Figure 46C:
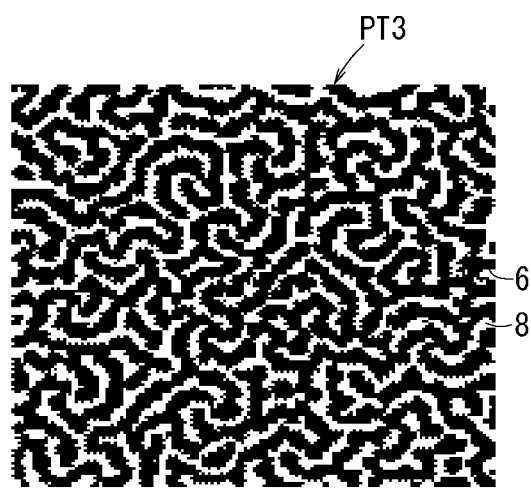

The spectrum Spc of the pattern PT1 shown in FIG. 46A has a wide peak (range of 2 cycles/mm to 30 cycles/mm) having about 10 cycles/mm as the apex. In addition, the spectrum Spc of the pattern PT2 shown in FIG. 46B has a wide peak (range of 3 cycles/mm to 20 cycles/mm) having about 3 cycles/mm as the center. Further, the spectrum Spc of the pattern PT3 shown in FIG. 46C has a slightly narrow peak (range of 8 cycles/mm to 18 cycles/mm) having about 10 cycles/mm as the center. In contrast, the spectrum Spc of the mesh pattern 20 (written as M in this diagram; the same in FIG. 16 described hereinafter) has a narrow peak having about 8.8 cycles/mm as the center.

Figure 13:
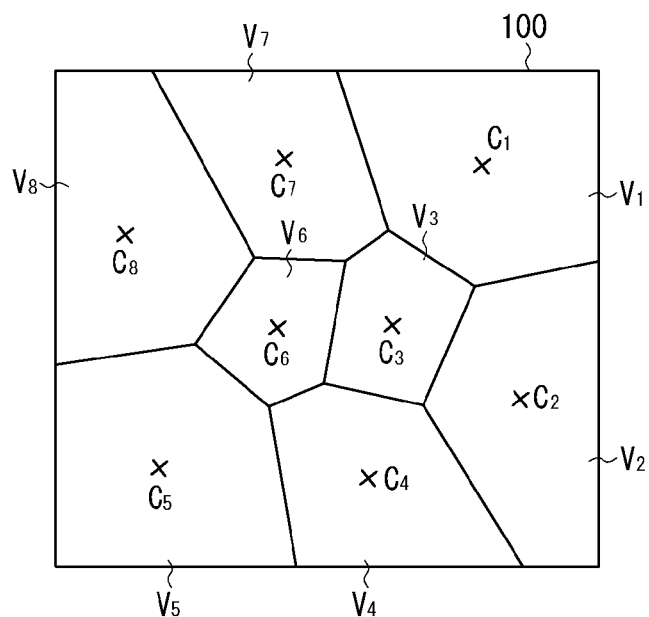
FIG. 13 is an explanatory diagram showing the centroid positions of the respective regions shown in FIG. 9B.

The relationship between the characteristics of the spectrum Spc shown in FIG. 10C and the centroid position of each mesh shape 22 will be described below. As shown in FIG. 13, it is assumed that, for the same planar region 100 as in FIG. 3B, the polygonal regions $V_1$ to $V_8$ are determined using the Voronoi diagram described above. In addition, respective points $C_1$ to $C_8$ included in the regions $V_1$ to $V_8$ indicate the geometric position of the centroid of each region.

Figure 14:
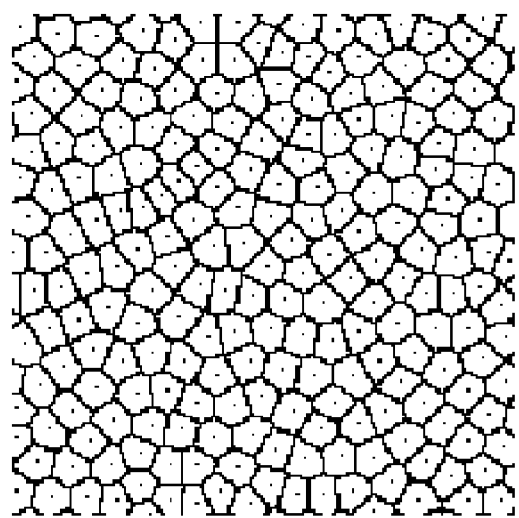
FIG. 14 is a schematic explanatory diagram showing the relationship between the mesh pattern and the centroid position of each mesh shape.

FIG. 14 is a schematic explanatory diagram showing the relationship between the mesh pattern 20 according to the present embodiment and the centroid position of each mesh shape 22.

Figure 15A:
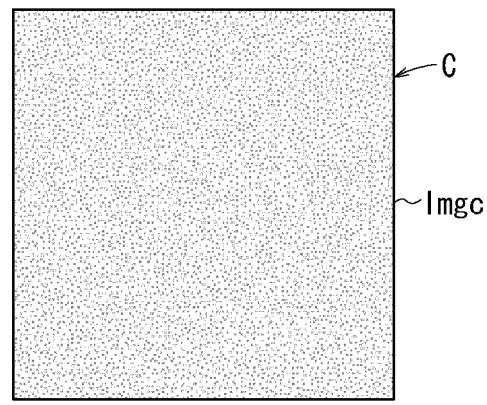
FIG. 15A is a schematic explanatory diagram visualizing the image data representing the centroid position distribution of the mesh shapes included in the mesh pattern shown in FIG. 14.

FIG. 15A is a schematic explanatory diagram visualizing image data (hereinafter, referred to as "centroid image data Imgc") representing the two-dimensional distribution of the centroid position (hereinafter, referred to as centroid position distribution C) of the respective mesh shapes 22 included in the mesh pattern 20 shown in FIG. 14. As is understood from this diagram, the centroid position distribution C is appropriately dispersed without the respective centroid positions overlapping each other.

Figure 15B:
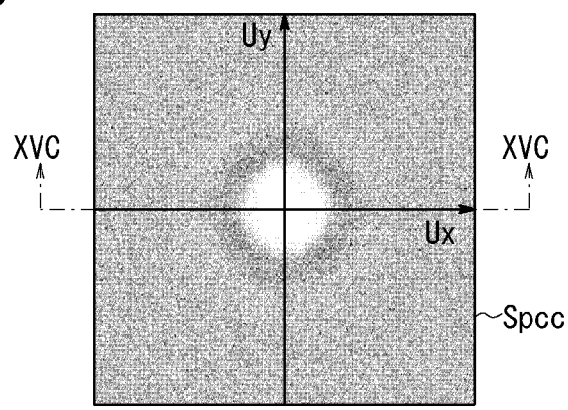
FIG. 15B is a distribution map of the power spectrum obtained by performing the FFT on the centroid image data shown in FIG. 15A.

FIG. 15B is a distribution map of the two-dimensional power spectrum (hereinafter, simply referred to as a centroid spectrum Spcc) obtained by performing the FFT on the centroid image data Imgc shown in FIG. 15A. Here, the horizontal axis of the distribution map indicates a spatial frequency with respect to the X-axis direction, and the vertical axis thereof indicates a spatial frequency with respect to the Y-axis direction. In addition, the intensity level (value of the spectrum) decreases as the display density of each spatial frequency band decreases, and the intensity level increases as the display density increases. In the example of this diagram, the distribution of the centroid spectrum Spcc is isotropic and has one circular peak.

Figure 15C:
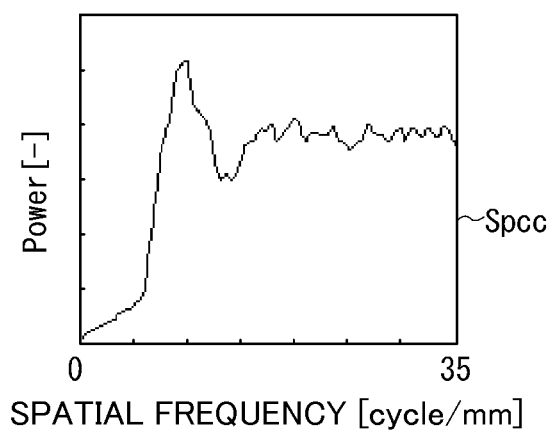
FIG. 15C is a cross-sectional view taken along the line XVC-XVC of the power spectrum distribution map shown in FIG. 15B.

FIG. 15C is a cross-sectional view taken along the line XVC-XVC of the distribution of the centroid spectrum Spcc shown in FIG. 15B. Since the centroid spectrum Spcc is isotropic, FIG. 15C is equivalent to the radial distribution for all angular directions. As is understood from this diagram, the intensity level in the low spatial frequency band is low, and a peak width in the middle spatial frequency band is large. Further, the centroid spectrum Spcc has so-called high-pass type characteristics in which the intensity level in the high spatial frequency band is high compared with that in the low spatial frequency band. That is, according to the terminology of the image engineering, the centroid image data Imgc shown in FIG. 15A can be said to represent a design having the characteristics of "blue noise".

The power spectrum of the centroid position distribution C in the conductive sheets 10 and 11 can be acquired by the following process. First, the image data Img representing the design of the mesh pattern 20 is acquired, each mesh shape 22 (closed space) is identified, the centroid position (for example, dot of one pixel) is calculated to obtain the centroid image data Imgc, and then, the two-dimensional power spectrum is calculated. Thereby, the power spectrum (centroid spectrum Spcc) of the centroid position distribution C is obtained.

Figure 16:
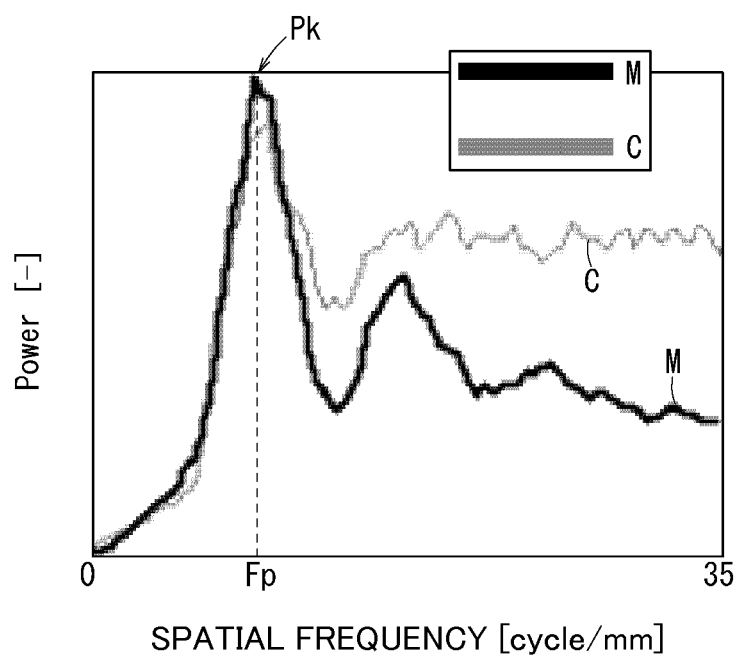
FIG. 16 is a comparison diagram of the graphs shown in FIGS. 10C and 15C.

FIG. 16 is a comparison diagram of the graphs shown in FIGS. 10C and 15C. Specifically, the spectrum Spc of the mesh pattern 20 is compared with the centroid spectrum Spcc of the centroid position distribution C. For convenience, the intensities of the spectrum Spc and the centroid spectrum Spcc are normalized so that the values of the maximum peaks Pk are equal.

According to this diagram, the peaks Pk have the same spatial frequency Fp, and the value thereof is equivalent to 8.8 cycles/mm. In the high spatial frequency band exceeding the spatial frequency Fp, the intensity of the spectrum Spc decreases gradually, while the intensity of the centroid spectrum Spcc still maintains a high value. The reason is presumably that the components of the mesh pattern 20 are line segments, each of which has a predetermined width and which cross each other, and in contrast, the components of the centroid position distribution C are points.

Figure 17A:
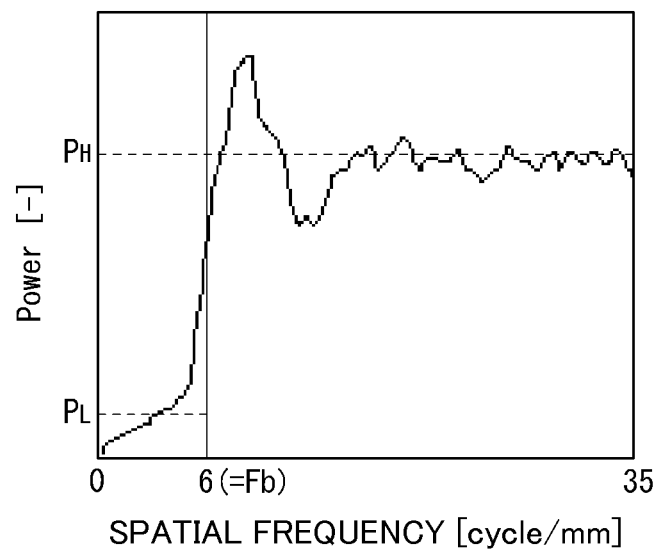
FIGS. 17A and 17B are schematic explanatory diagrams showing the characteristics of the centroid spectrum.

FIG. 17A is a schematic explanatory diagram showing the characteristics of the centroid spectrum Spcc shown in FIG. 15C. The value of the centroid spectrum Spcc increases gradually in the range of 0 to 5 cycles/mm, increases abruptly around 6 cycles/mm, and has a wide peak at about 10 cycles/mm. Then, the value of the centroid spectrum Spcc decreases gradually in the range of 10 to 15 cycles/mm, and a high value is maintained in the high spatial frequency band exceeding 15 cycles/mm.

Here, a reference spatial frequency Fb (a predetermined spatial frequency) is set to 6 cycles/mm. The average intensity (average value) of the centroid spectrum Spcc at the lower spatial frequency band side than Fb, that is, in the range of 0 to Fb [cycle/mm] is assumed to be $P_L$. The average intensity (average value) of the centroid spectrum Spcc at the higher spatial frequency band side than Fb, that is, in the range of Fb [cycle/mm] to Nyquist frequency is assumed to be $P_H$. Thus, $P_H$ is larger than $P_L$. Since the centroid spectrum Spcc has such features, the feeling of noise that the viewer visually feels is reduced. The basis thereof is as follows.

For example, the value of Pb is set to be a spatial frequency at which the visual response characteristics of human are equivalent to 5% of the maximum response. This is because this intensity level is a level at which visual recognition is difficult. In addition, as shown in FIG. 11, the visual response characteristics obtained on the basis of the Dooley-Shaw function at the viewing distance of 300 mm are used. This is because this function is well suited to the visual response characteristics of human.

That is, the spatial frequency of 6 cycle/mm equivalent to 5% of the maximum response in the Dooley-Shaw function at the distance of distinct vision of 300 mm can be used as the value of Fb. The spatial frequency of 6 cycles/mm is equivalent to a spacing of 167 μm.

Figure 17B:
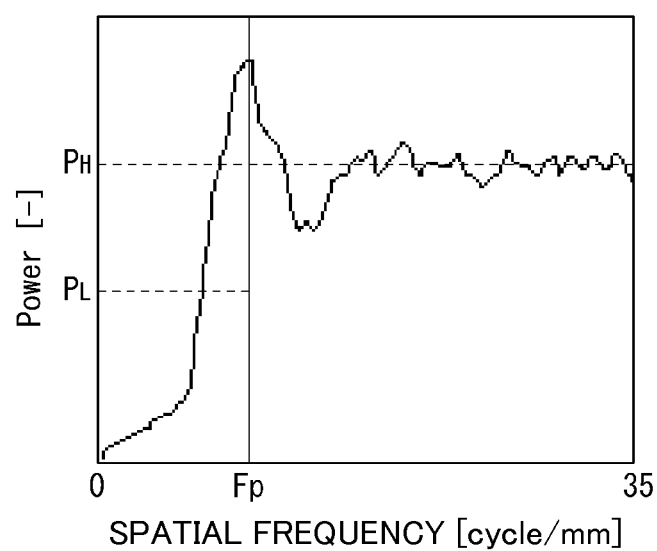

In addition, as shown in FIG. 17B, the spatial frequency Fp when the value of the centroid spectrum Spcc is the greatest may be set as the reference spatial frequency Fb. Even in this case, the relationship ($P_H > P_L$) described above is satisfied.

Incidentally, the first evaluation value EV1 characterizing the balance of the intensity of the centroid spectrum Spcc is calculated by the following Expression (1) using the average intensities $P_H$ and $P_L$.

[Equation 1]

$$EV1 = \frac{1}{1 + e^{c(P_H - P_L)}} \quad (1)$$

Here, c is a positive constant corresponding to the slope of the curve at $P_H=P_L$. The right side of Expression (1) is so-called sigmoid function, and the first evaluation value EV1 is always a value equal to or greater than 0. When the value of the average intensity $P_H$ is sufficiently large, the first evaluation value EV1 approaches 0. On the other hand, when the value of the average intensity $P_H$ is sufficiently small, the first evaluation value EV1 approaches 1. That is, as the first evaluation value EV1 approaches 0, the centroid spectrum Spcc represents the characteristics of the "blue noise".

[Second Evaluation Value V2]

Figure 18A:
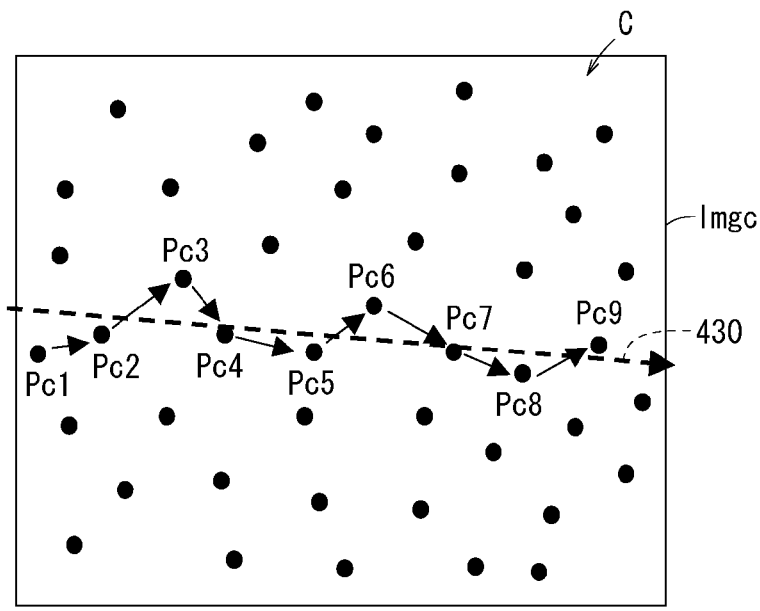
FIGS. 18A and 18B are explanatory diagrams schematically showing a method of calculating the RMS of the respective centroid positions, which are disposed along a predetermined direction, with respect to a direction perpendicular to the predetermined direction.
Figure 18B:
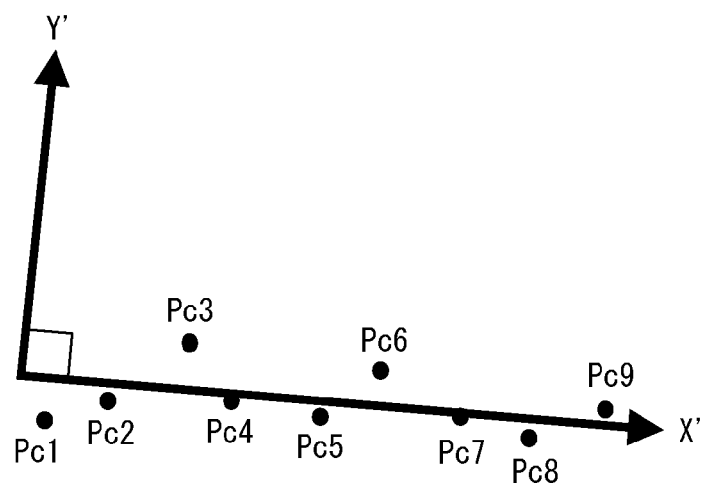

FIGS. 18A and 18B are explanatory diagrams schematically showing a method of calculating the root mean square (RMS) deviation of the respective centroid positions, which are disposed along a predetermined direction, with respect to a direction perpendicular to the predetermined direction.

As shown in FIG. 18A, first, a centroid position Pc1 as an initial position is arbitrarily selected from the centroid position distribution C. Then, a centroid position Pc2, which is closest to the centroid position Pc1, is selected. Then, a centroid position Pc3, which is closest to the centroid position Pc2, is selected from the remaining centroid position distribution C excluding the centroid position Pc1 already selected. Subsequently, "N" centroid positions which are sufficient statistically (in the example shown in this diagram, for the convenience of explanation, centroid positions Pc1 to Pc9 of nine points) are similarly selected. Then, the regression line of the centroid positions Pc1 to Pc9 is calculated, and this straight line is defined as a reference axis 430. This regression line may be determined by using known analysis methods including the least squares method.

As shown in FIG. 18B, the reference axis 430 (in this diagram, written as an X' axis) and a crossing axis 432 (in this diagram, written as a Y' axis), which is perpendicular to the reference axis 430, are set. Then, the RMS of each of the centroid positions Pc1 to Pc9, which are disposed along the X'-axis direction (predetermined direction), with respect to the Y'-axis direction (orthogonal direction) is calculated.

Subsequently, the centroid position Pc1 (initial position) is randomly selected from the centroid position distribution C, and a trial to calculate the RMS is repeated M times. Hereinafter, the value of the RMS obtained in an m-th (m=1, 2, . . . , M) trial is written as RMS(m). RMS(m) is calculated by the following Expression (2).

[Equation 2]

$$RMS(m) = \sqrt{\frac{\sum_{k=1}^{N} Y'^2_{mk}}{N-1}} \quad (2)$$

Here, Y'mk corresponds to the Y' coordinate of the k-th centroid position Pck in the X'Y' coordinate system in the m-th trial. As is understood from Expression (2), RMS(m) is always a value of 0 or more, and it can be said that the noise characteristic is improved as the RMS(m) approaches 0.

The second evaluation value EV2 is calculated by Expression (3) using the RMS(m) obtained in each trial and the average value RMSave thereof.

[Equation 3]

$$EV2 = \sqrt{\frac{\sum_{m=1}^{M} (RMS(m) - RMS_{ave})^2}{M-1}} \quad (3)$$

As is understood from Expression (3), the second evaluation value EV2 is always a value of 0 or more, and it can be said that the regularity of the centroid position distribution C is high as the second evaluation value EV2 approaches 0. When the centroid position distribution C is regular (for example, periodical), the value of the RMS is approximately fixed regardless of the selection result of the initial position Pc1. As a result, a variation in RMS(m) of each trial is reduced, and the value of the second evaluation value EV2 is reduced. In this case, since the regularity of the centroid position distribution C is high, synchronization (interference) between the arrangement position of each opening 18 and the arrangement position of each pixel 32 (the red subpixel 32r, the green subpixel 32g, and the blue subpixel 32b) occurs, and this tends to become noticeable as a color noise.

On the other hand, as shown in the example of FIG. 18A, in the case of the centroid position distribution C that is appropriately dispersed, the value of the RMS changes depending on the selection result of the initial position Pc1. As a result, the value of the RMS(m) in each trial varies, and the value of the second evaluation value EV2 is increased. In this case, since the regularity of the centroid position distribution C is low, synchronization (interference) between the arrangement position of each opening 18 and the arrangement position of each pixel 32 (the red subpixel 32r, the green subpixel 32g, and the blue subpixel 32b) does not occur. Accordingly, color noise is suppressed.

The second evaluation value EV2 may be equal to or greater than 15 μm, for example, in a range of 15 μm or more and 65 μm or less. It is preferable that the second evaluation value EV2 be in a range of 26 μm or more and 65 μm or less, and a range of 26 μm or more and 36 μm or less is more preferable.

Incidentally, as shown in the examples of FIGS. 1A and 2A, in the case of the mesh pattern 20 filled with polygonal shapes, the shape of each opening 18 (or each mesh shape 22) is uniquely determined. Therefore, it is easy to calculate the opening area and the first and second evaluation values EV1 and EV2. However, the opening area of the opening 18 may not be uniquely determined due to the deformation and the like of the mesh shape 22. Therefore, in the claims and description of the present application, in order to clarify the definition of the first and second evaluation values EV1 and EV2, the opening area is defined as follows.

FIGS. 19A to 19D are schematic explanatory diagrams of examples (first to third examples) in which other elements are added in a region of the opening 18a that is topologically closed. In these examples, elements (line elements) that form each closed region are extracted in advance, and the opening area of the opening 18 excluding elements other than the extracted line elements is calculated.

Figure 19A:
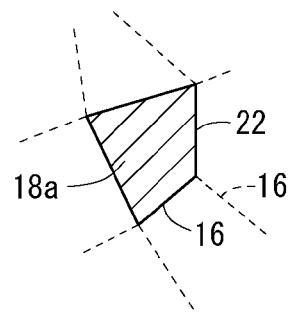
FIGS. 19A to 19D are schematic explanatory diagrams of examples (first to third examples) in which other elements are added in a region of an opening that is topologically closed.

As shown in FIG. 19A, the opening area of the opening 18a that is topologically closed is calculated as the area of a hatched region. Since the opening 18a has a geometrically perfect quadrangular shape, the opening area can be uniquely calculated.

Figure 19B:
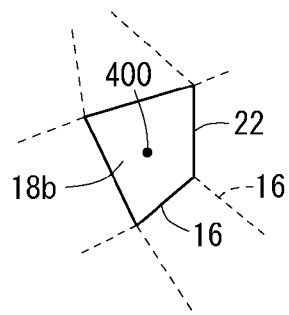

As shown in FIG. 19B as a first example, an opening 18b in which a point element 400 is formed in a portion (for example, a central portion) of the opening 18a shown in FIG. 19A is considered. In this case, the opening area of the opening 18b is calculated as the area of a region excluding the point element 400. That is, the opening 18b is treated equivalently with the opening 18a (refer to FIG. 19A).

Figure 19C:
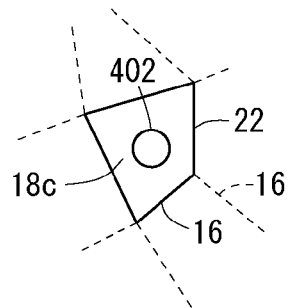

As shown in FIG. 19C as a second example, an opening 18c in which a circular line element 402 is formed in a portion of the opening 18a shown in FIG. 19A is considered. In this case, the opening area of the opening 18c is calculated as the area of a region excluding the line element 402. That is, the opening 18c is treated equivalently with the opening 18a (refer to FIG. 19A).

Figure 19D:
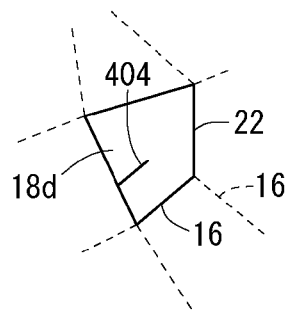

As shown in FIG. 19D as a third example, an opening 18d having a line element 404 (so-called beard) that crosses the boundary line (in the example shown in this diagram, one side of the quadrangle) of the opening 18a shown in FIG. 19A and protrudes toward the inside of the opening 18a is considered. In this case, the opening area of the opening 18d is calculated as the area of a region excluding the line element 404. That is, the opening 18d is treated equivalently with the opening 18a (refer to FIG. 19A).

FIGS. 20A to 20D are schematic explanatory diagrams of examples (fourth to sixth examples) in which the mesh shape 22 is not formed since it is topologically open. In these examples, a closed region (hereinafter, referred to as a temporary region) is determined by supplementing the shortest virtual line for each line surrounding the opening 18, and the area of the temporary region is calculated as the opening area of the opening 18.

However, it is defined that the opening area can be calculated only when the sum of the length of the supplemented virtual line is equal to or less than 20% of the total length of the boundary line that determines the temporary region. This is because each opening 18 cannot be specified any longer if the sum of the length of the supplemented virtual line exceeds 20% of the total length of the boundary line that determines the temporary region.

Figure 20A:
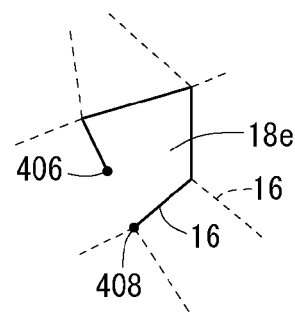
FIGS. 20A to 20D are schematic explanatory diagrams of examples (fourth to sixth examples) in which a mesh shape is not formed due to being topologically open.
Figure 20B:
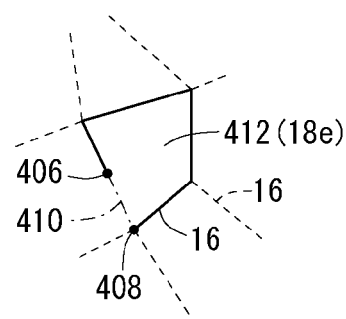

As shown in FIG. 20A as a fourth example, the line surrounding an opening 18e has a shape in which a part of the boundary line of the opening 18a (refer to FIG. 19A) is missing. In this case, as shown in FIG. 20B, a temporary region 412 having the same shape as the opening 18a (refer to FIG. 19A) is determined by supplementing the shortest path (that is, a straight virtual line 410) between first and second end points 406 and 408. Therefore, the opening area of the opening 18e is calculated as the area of the temporary region 412. That is, the opening 18e is treated equivalently with the opening 18a (refer to FIG. 19A).

Figure 20C:
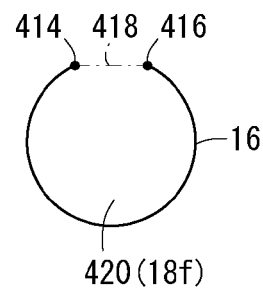

As shown in FIG. 20C as a fifth example, the line surrounding an opening 18f has an arc shape in which a part of the circumference is missing. In this case, a temporary region 420 is determined by supplementing the shortest path (that is, a straight virtual line 418) between first and second end points 414 and 416. Therefore, the opening area of the opening 18f is calculated as the area of the temporary region 420.

Figure 20D:
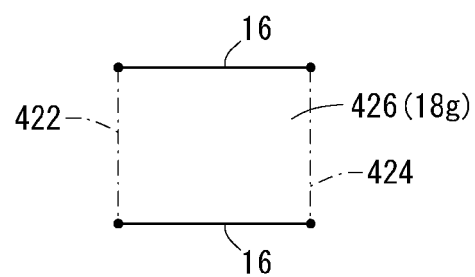

As shown in FIG. 20D as a sixth example, an opening 18g is assumed to be an open region interposed between a pair of parallel lines. In this case, a temporary region 426 having a rectangular shape is determined by supplementing virtual lines 422 and 424 connecting the end points of the parallel lines. However, since the sum of the lengths of the supplemented virtual lines 422 and 424 exceeds 20% of the total length of the boundary line that determines the temporary region 426, it is not possible to calculate the opening area. Accordingly, this is excluded from the calculation of the first and second evaluation values EV1 and EV2.

Thus, the noise characteristics of the conductive sheets 10 and 11 can be quantified in various ways using the first evaluation value EV1 (refer to Expression (1)) and the second evaluation value EV2 (refer to Expressions (2) and (3)).

Subsequently, the effects obtained when setting the relative refractive index nr1 of the transparent base 12 with respect to the first protective layer 26a to a value close to 1 will be described in detail with reference to FIGS. 21A to 22B. For easy understanding, a part of the configuration of the conductive sheet 11 is omitted, and only the transparent base 12, the first conductive portion 14a, and the first protective layer 26a are shown.

Figure 21A:
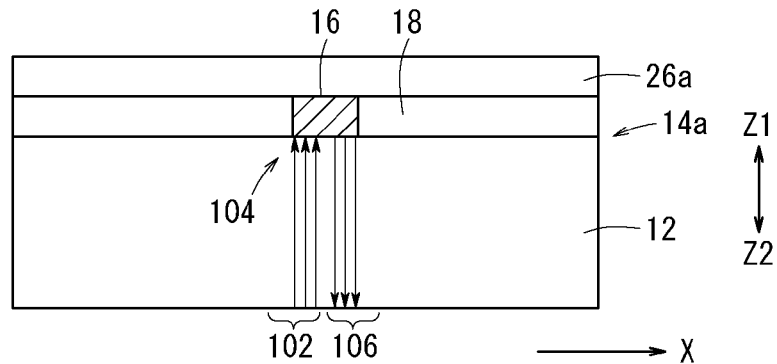
FIG. 21A is a schematic explanatory diagram showing the path of parallel light irradiated toward the thin metal wire.

As shown in FIG. 21A, parallel light 102 emitted from the display unit 30 side (refer to FIG. 4) enters inside of the transparent base 12 and moves straight along the arrow Z1 direction. Then, almost all of the parallel light 102 is reflected in the arrow Z2 direction, as reflected component 106, on a first interface 104 between the transparent base 12 and the thin metal wire 16. That is, depending on the presence or absence of the thin metal wire 16 formed of a non-translucent material, a difference in the amount of light transmitted through the conductive sheet 11 becomes large. As a result, shading according to the shape of the mesh pattern 20 becomes noticeable, and thus moire is easily generated. In contrast, in the case of a conductive sheet using a conductive material (typically, ITO) having high translucency, there is little influence described above.

Hereinafter, an optical phenomenon when the refractive index difference between the transparent base 12 and the first protective layer 26a is large, that is, an optical phenomenon when the relative refractive index nr1 is away from 1 will be described with reference to FIGS. 21B and 21C.

Figure 21B:
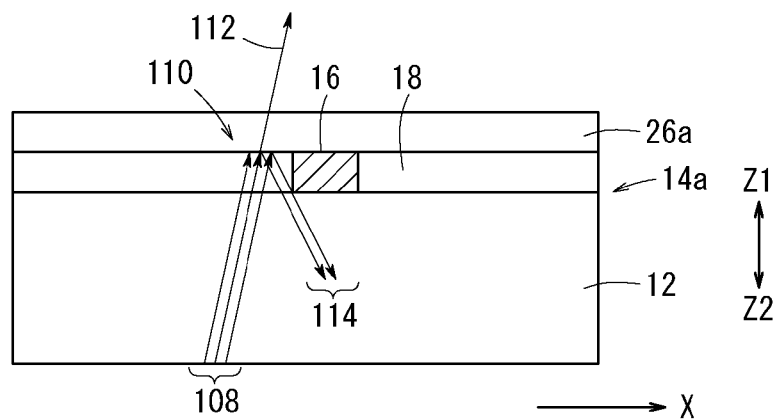
FIG. 21B is a schematic explanatory diagram showing the path of obliquely incident light irradiated toward the thin metal wire.

As shown in FIG. 21B, light that is slightly inclined with respect to the arrow Z1 direction (obliquely incident light 108) enters inside of the transparent base 12, and moves straight to a second interface 110 between the first conductive portion 14a (opening 18) and the first protective layer 26a. Then, a part of the obliquely incident light 108 is transmitted (to be straight component 112), and the remaining light is reflected (to be reflected component 114) due to the refraction phenomenon on the second interface 110. At this time, since the relative refractive index nr1 is away from 1, the interface transmittance is reduced, and the amount of light of the straight component 112 (or the reflected component 114) is relatively decreased (or increased).

Figure 21C:
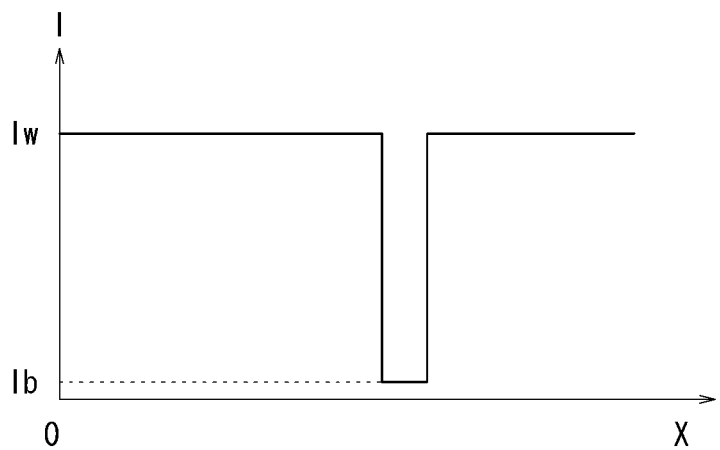
FIG. 21C is a graph showing the intensity distribution of transmitted light in FIG. 21B.

For example, as shown in FIG. 21C, it is assumed that the amount of light of I=Iw at a position corresponding to the opening 18 and the amount of light of I=Ib at a position corresponding to the thin metal wire 16 are detected after the light is transmitted through the conductive sheet 11. In this case, the optical intensity due to the thin metal wire 16 is expressed as $\Delta D1 = -\log(Ib/Iw)$ with the detected amount of light in the opening 18 as a reference.

Next, an optical phenomenon when the refractive index difference between the transparent base 12 and the first protective layer 26a is small, that is, an optical phenomenon when the relative refractive index nr1 is a value close to 1 will be described with reference to FIGS. 22A and 22B.

When the relative refractive index nr1 is a value close to 1, the interface transmittance approaches 1 (the interface reflectance approaches 0) as is easily derived from the optical considerations. Therefore, the amount of light of straight component 116 (or reflected component 118) is relatively increased (or decreased) compared with that in the case shown in FIG. 21B. In other words, the amount of light passing through the inside of the transparent base 12 without being scattered is uniformly increased regardless of the position of the thin metal wire 16 formed of a non-translucent material. Hereinafter, for the convenience of explanation, it is assumed that the detected amount of light has increased by $\epsilon$ (positive value).

Figure 22A:
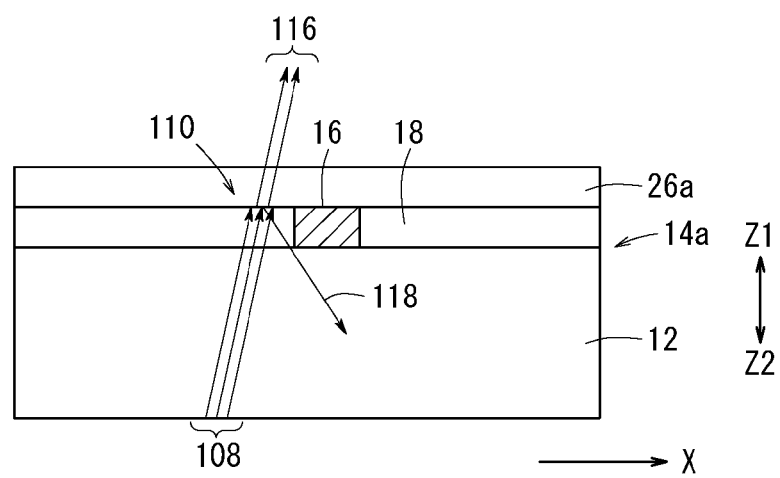
FIG. 22A is a schematic explanatory diagram showing the path of obliquely incident light irradiated toward the thin metal wire in the configuration according to the present invention.
Figure 22B:
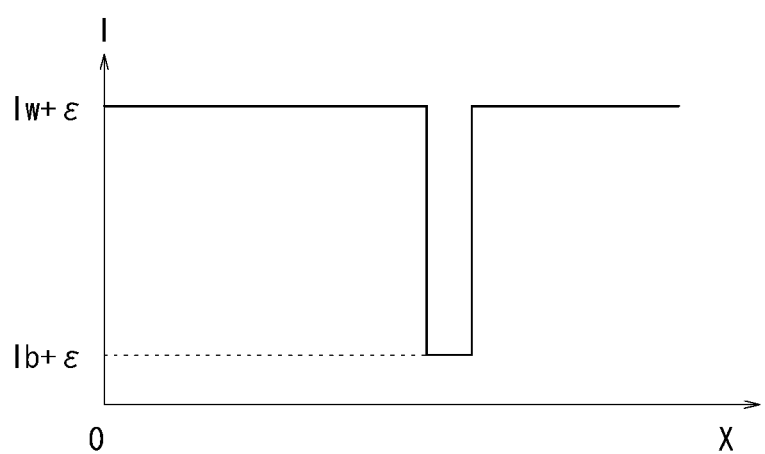
FIG. 22B is a graph showing the intensity distribution of transmitted light in FIG. 22A.

At this time, as shown in FIGS. 22A and 22B, the amount of light of $I=Iw+\epsilon$ and the amount of light of $I=Ib+\epsilon$ are detected at a position corresponding to the opening 18 and at a position corresponding to the thin metal wire 16, respectively, after the transmission of the light. The optical intensity due to the thin metal wire 16 is expressed as $\Delta D2=-\log\{(Ib+\epsilon)/(Iw+\epsilon)\}$ with the detected amount of light in the opening 18 as a reference.

When $Iw>Ib\geq 0$ and $\epsilon>0$, the inequality of $(Ib/Iw)<(Ib+\epsilon)/(Iw+\epsilon)$ is satisfied. Accordingly, the relationship of $\Delta D1>\Delta D2$ is always satisfied. That is, the contrast of the optical intensity due to the thin metal wire 16 can be reduced by setting the relative refractive index nr1 of the transparent base 12 and the first protective layer 26a to a value close to 1. As a result, in plan view of the display device 40, the design of the thin metal wire 16 is less likely to be visible to the user.

The above is true for the relationship between the transparent base 12 and the second protective layer 26b as well as the relationship between the transparent base 12 and the first protective layer 26a. It is preferable that the relative refractive indices nr1 and nr2 be 0.86 to 1.15, and 0.91 to 1.08 is more preferable. In particular, it is further preferable that the first protective layer 26a and/or the second protective layer 26b be formed of the same material as the transparent base 12 since nr1=1 (nr2=1) is satisfied.

As described above, since the relative refractive index nr1 of the transparent base 12 with respect to the first protective layer 26a and/or the relative refractive index nr2 of the transparent base 12 with respect to the second protective layer 26b are set to 0.86 to 1.15, the amount of light (straight components 116) that moves straight on the interface between the transparent base 12 and the first protective layer 26a and/or the interface between the transparent base 12 and the second protective layer 26b, of light (obliquely incident light 108) that is incident slightly obliquely with respect to the normal direction (arrow Z1 direction) of the transparent base 12, is relatively increased. That is, the amount of light passing through the transparent base 12 without being scattered is uniformly increased regardless of the position of the thin metal wire 16 formed of a non-translucent material. Accordingly, since the contrast of the optical intensity due to the thin metal wire 16 can be reduced, the design of the thin metal wire 16 is less likely to be visible to the viewer (user). In particular, in the mesh pattern 20 in which different mesh shapes 22 are arrayed without space, it is possible to suppress the occurrence of the granular feeling of noise. Accordingly, the above configuration is more effective for the mesh pattern 20 in which different mesh shapes 22 are arrayed without space. It is needless to say that the effects described above be obtained not only when each mesh shape 22 is a polygonal shape but also when each mesh shape 22 has various shapes.

Next, the effects obtained by providing the first dummy pattern 76a in the conductive sheet 11 will be described with reference to FIGS. 23A to 24C. For easy understanding, the configuration of the first protective layer 26a and the like is omitted, and an optical phenomenon will be described on the assumption that the influence due to the light refraction effect is little.

Figure 23A:
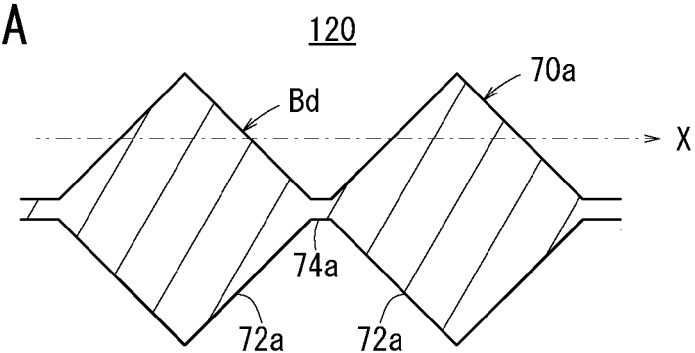
FIG. 23A is a schematic plan view of a first sensor portion according to a reference example.

FIG. 23A is a schematic plan view of a first sensor portion 120 according to a reference example. The first sensor portion 120 is configured to include only the first conductive patterns 70a, and has a form in which there is no first dummy pattern 76a (refer to FIGS. 5A and 6).

Figure 23B:
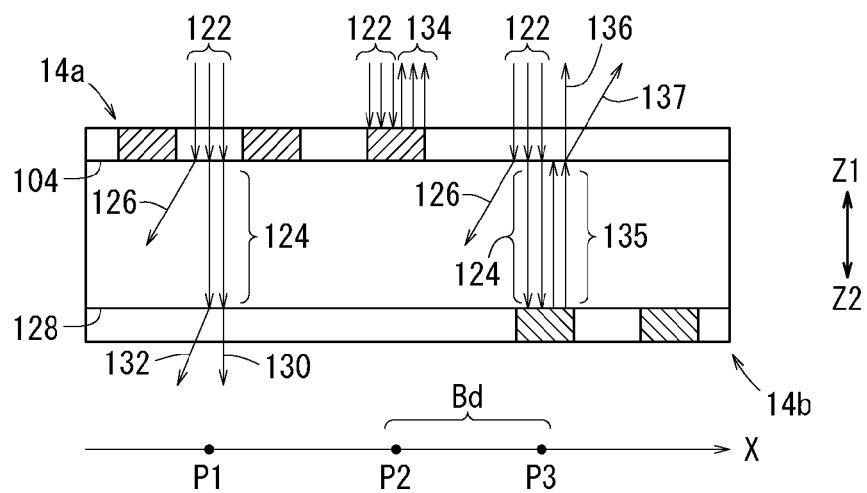
FIG. 23B is a schematic explanatory diagram showing the path of external light incident on the first sensor portion shown in FIG. 23A.

FIG. 23B is a schematic explanatory diagram showing the path of external light 122 incident on the first sensor portion 120. This diagram is equivalent to the schematic cross-sectional view of the first conductive pattern 70a near the boundary Bd shown in FIG. 23A.

The position P1 is equivalent to a position where no thin metal wire 16 is present in both the first and second conductive portions 14a and 14b. The external light 122 emitted from the outside of the display device 40 (refer to FIG. 4) enters inside of the conductive sheet 11 and moves straight approximately in parallel along the arrow Z2 direction. Then, almost all of the external light 122 is transmitted in the arrow Z2 direction on the first interface 104 between the opening 18 and the transparent base 12. At this time, a part of the transmitted light moves straight along the arrow Z2 direction as straight component 124, and a part of the remaining light is scattered as scattering component 126. Then, almost all of the straight component 124 is transmitted in the arrow Z2 direction on a third interface 128 between the transparent base 12 and the opening 18. A part of the transmitted light moves straight along the arrow Z2 direction as straight component 130, and a part of the remaining light is scattered as scattering component 132. As a result, most of the external light 122 emitted to the position P1 is released in the arrow Z2 direction of the conductive sheet 11.

The position P2 is equivalent to a position where the thin metal wire 16 is present in the first conductive portion 14a and the thin metal wire 16 is not present in the second conductive portion 14b. Most of the external light 122 emitted from the outside of the display device 40 (refer to FIG. 4) is reflected in the arrow Z1 direction, as reflected component 134, on the surface of the first conductive portion 14a (thin metal wire 16 formed of a non-translucent material).

The position P3 is equivalent to a position where the thin metal wire 16 is not present in the first conductive portion 14a and the thin metal wire 16 is present in the second conductive portion 14b. The external light 122 emitted from the outside of the display device 40 (refer to FIG. 4) enters inside of the conductive sheet 11 and moves straight approximately in parallel along the arrow Z2 direction. Then, almost all of the external light 122 is transmitted in the arrow Z2 direction on the first interface 104. At this time, a part of the transmitted light moves straight along the arrow Z2 direction as the straight component 124, and a part of the remaining light is scattered as the scattering component 126. Then, almost all of the straight component 124 is reflected in the arrow Z1 direction, as reflected component 135, on the third interface 128 (surface of the thin metal wire 16 formed of a non-translucent material). Then, the reflected component 135 moves straight through the transparent base 12 along the arrow Z1 direction, and almost all of the reflected component 135 is transmitted in the arrow Z1 direction on the first interface 104. As a result, a part of the external light 122 emitted to the position P3 is released to the outside (arrow Z1 direction side) of the conductive sheet 11 as straight component 136 (or scattering component 137).

As described above, it is understood that the amount of reflected light Ir (reflected light 134) at the position P2 is larger than the amount of reflected light Ir (straight component 136) at the position P3. This is due to a difference in optical path lengths to reach the position of the thin metal wire 16 (equivalent to twice the thickness of the transparent base 12).

Figure 23C:
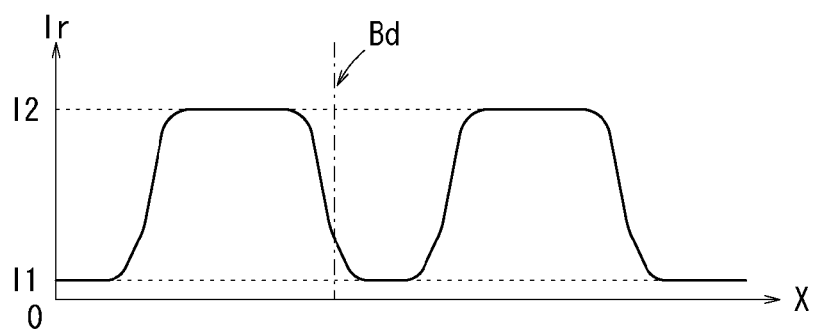
FIG. 23C is a graph showing the intensity distribution of reflected light in the first sensor portion shown in FIG. 23A.

FIG. 23C is a graph showing the intensity distribution of reflected light in the first sensor portion 120 shown in FIG. 23A. The horizontal axis of the graph indicates the position in the arrow X direction, and the vertical axis of the graph indicates the intensity of reflected light (the amount of reflected light Ir). The amount of reflected light Ir means the amount of light reflected toward the one surface side (arrow Z1 direction side) of the conductive sheet 11 when the uniform external light 122 enters regardless of the position in the arrow X direction.

As a result, at a position where the first conductive pattern 70a is not present in the first sensor portion 120, the amount of reflected light Ir is a minimum value (Ir=I1). At a position where the first conductive pattern 70a is present in the first sensor portion 120, the amount of reflected light Ir is a maximum value (Ir=I2). That is, the amount of reflected light Ir has a characteristic according to the regular arrangement of the first sensing portion 72a, in other words, a periodic characteristic in which the minimum value (I1) and the maximum value (I2) are alternately repeated.

In contrast, in the case of a conductive sheet using a conductive material (typically, ITO) having high translucency, the amount of reflected light Ir is equal to approximately 0 (I1=I2=0). For this reason, there is almost no contrast (brightness difference) due to the presence or absence of the first conductive pattern 70a. That is, compared with the case where the thin metal wire 16 is applied to the first conductive pattern 70a, there is almost no influence described above.

Figure 24A:
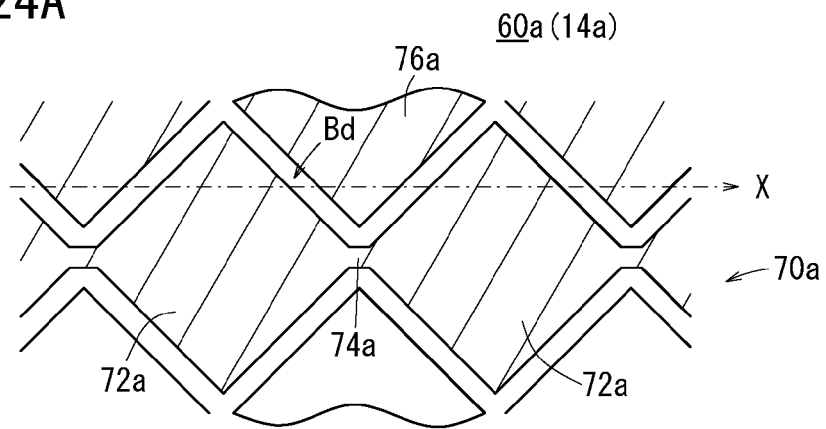
FIG. 24A is a schematic explanatory diagram of the first sensor portion according to the present embodiment.

Meanwhile, FIG. 24A is a schematic plan view of the first sensor portion 60a (refer to FIGS. 5A and 6) according to the present embodiment. The first sensor portion 60a is configured to include the first conductive pattern 70a and the first dummy pattern 76a.

Figure 24B:
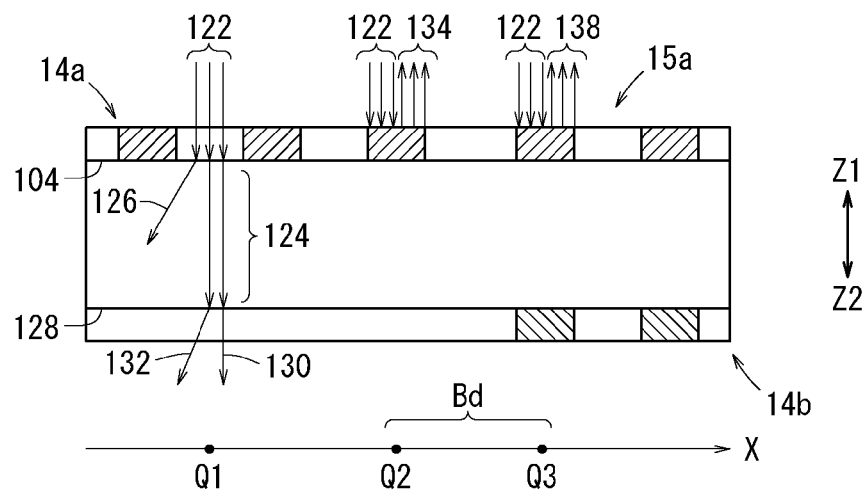
FIG. 24B is a schematic explanatory diagram showing the path of external light incident on the first sensor portion shown in FIG. 24A.

FIG. 24B is a schematic explanatory diagram showing the path of the external light 122 incident on the first sensor portion 60a. This diagram is equivalent to the schematic cross-sectional view of the first conductive pattern 70a near the boundary Bd shown in FIG. 24A.

Explanation regarding a position Q1 corresponding to the position P1 will be omitted since it is the same as that shown in FIG. 23B. This is the same for a position Q2 corresponding to the position P2.

At a position Q3 corresponding to the position P3, most of the external light 122 emitted from the outside of the display device 40 (refer to FIG. 4) is reflected in the arrow Z1 direction, as reflected component 138, on the surface of the first dummy electrode portion 15a (thin metal wire 16 formed of a non-translucent material). That is, the conductive sheet 11 reflects the external light 122 to the same extent as the position Q2 regardless of the presence or absence of the thin metal wire 16 in the second conductive portion 14b.

Figure 24C:
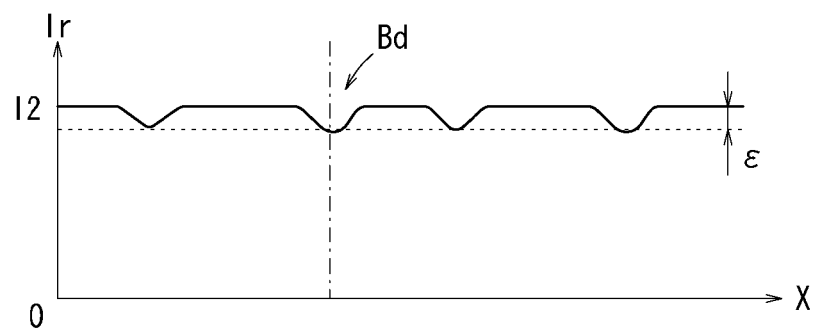
FIG. 24C is a graph showing the intensity distribution of reflected light in the first sensor portion shown in FIG. 24A.

As a result, as shown in FIG. 24C, the amount of reflected light Ir has a uniform characteristic of Ir=I2 regardless of the regular arrangement of the first sensing portion 72a. In a spacing portion of the first conductive portion 14a and the first dummy electrode portion 15a, a tendency that the amount of reflected light Ir is reduced slightly (by an amount of E) is observed. By reducing the width of the spacing portion, the shape of the first sensing portion 72a is much less likely to be visible.

As described above, since the wiring density of the first dummy pattern 76a disposed in the first opening portion 75a between the adjacent first conductive patterns 70a is equal to the wiring density of the first conductive pattern 70a, the light reflectance in a planar region of the first dummy pattern 76a for the external light 122 from one main surface side is approximately the same as the light reflectance in a planar region of the first conductive pattern 70a. That is, it is possible to make the intensity distribution of reflected light (reflected components 134 and 138) uniform regardless of the regular arrangement of the first sensing portion 72a. Accordingly, even in a configuration in which an electrode formed of the thin metal wire 16 is formed on both surfaces of the transparent base 12, it is possible to suppress the visibility of the first sensing portion 72a (or the second sensor 72b) due to the external light 122 as a light source of the reflected light.

Figure 25:
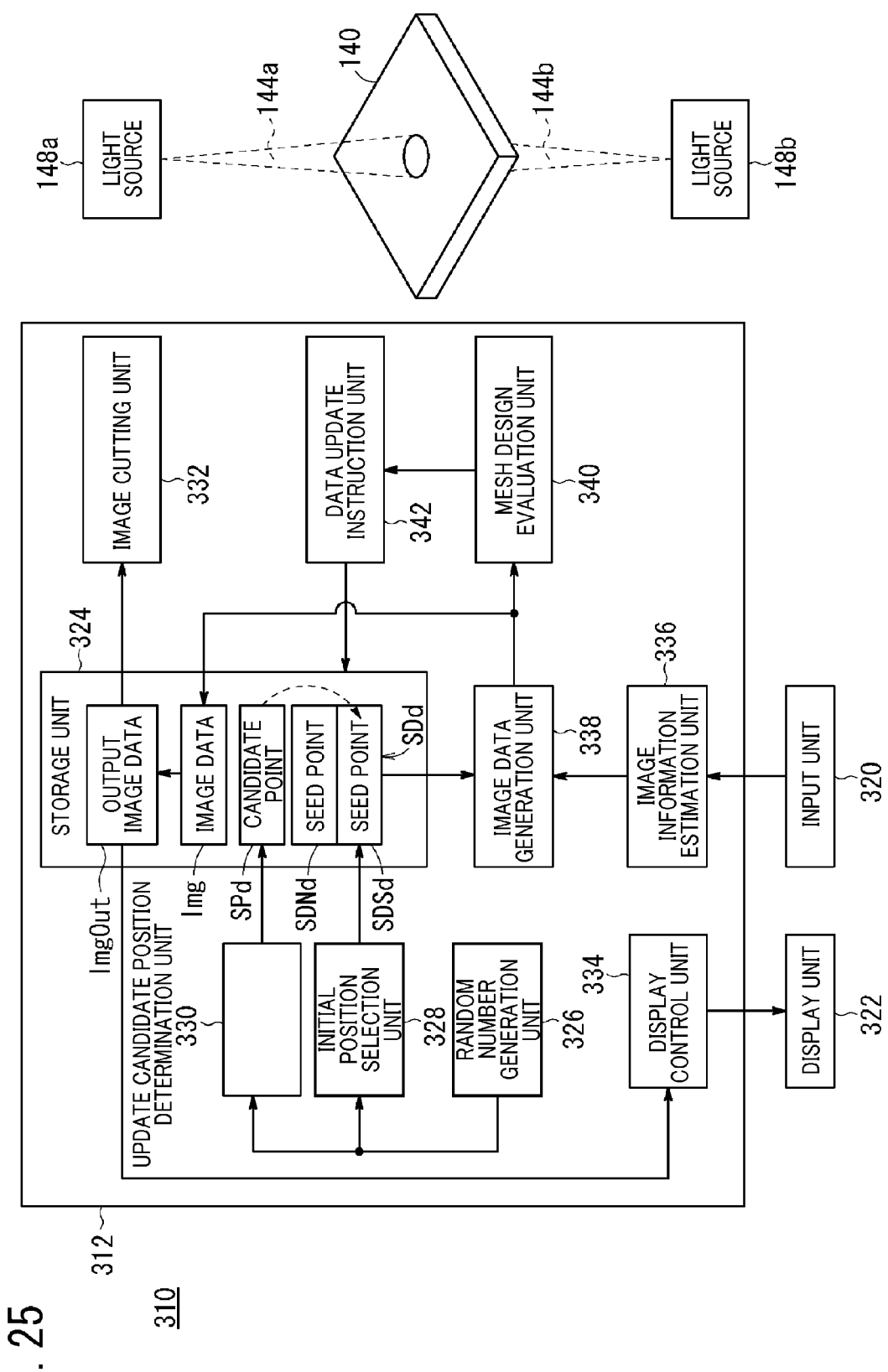
FIG. 25 is a block diagram showing the schematic configuration of a manufacturing apparatus for producing the conductive sheet according to the present embodiment.

FIG. 25 is a block diagram showing the schematic configuration of a manufacturing apparatus 310 for producing the conductive sheets 10 and 11 according to the present embodiment.

The manufacturing apparatus 310 basically includes: an image generation apparatus 312 that generates the image data Img (including output image data ImgOut) representing a design (wiring shape) corresponding to the mesh pattern 20; a first light source 148a that irradiates one main surface of a conductive sheet (photosensitive material 140; refer to FIG. 36A) with first light 144a to expose the conductive sheet in the manufacturing process in order to implement the design represented by the output image data ImgOut generated by the image generation apparatus 312; a second light source 148b that irradiates the other main surface of the photosensitive material 140 with second light 144b to expose the photosensitive material 140 on the basis of the output image data ImgOut; an input unit 320 that inputs various conditions for generating the image data Img (including the viewing information of the mesh pattern 20 or the black matrix 34) to the image generation apparatus 312; and a display unit 322 that displays a GUI image to assist the input work using the input unit 320, the stored output image data ImgOut, and the like.

The image generation apparatus 312 includes: a storage unit 324 that stores the image data Img, the output image data ImgOut, position data SPd of a candidate point SP, and position data SDd of a seed point SD; a random number generation unit 326 that generates a random number by generating a pseudo-random number; an initial position selection unit 328 that selects the initial position of the seed point SD from a predetermined two-dimensional image region using the random number generated by the random number generation unit 326; an update candidate position determination unit 330 that determines the position of the candidate point SP (excluding the position of the seed point SD) from the two-dimensional image region using the random number described above; an image cutting unit 332 that cuts out first image data and second image data (to be described later) from the output image data ImgOut; and a display control unit 334 that performs control to display various images on the display unit 322.

The seed point SD includes a first seed point SDN that is not to be updated and a second seed point SDS that is to be updated. In other words, the position data SDd of the seed point SD includes position data SDNd of the first seed point SDN and position data SDSd of the second seed point SDS.

In addition, a control unit (not shown) which includes a CPU and the like can realize various controls regarding image processing by reading and executing a program recorded on the recording medium (ROM (not shown) or the storage unit 324).

The image generation apparatus 312 further includes: an image information estimation unit 336 that estimates image information corresponding to the mesh pattern 20 on the basis of viewing information (to be described in detail later) input through the input unit 320; an image data generation unit 338 that generates the image data Img, which represents a design corresponding to the mesh pattern 20, on the basis of the image information supplied from the image information estimation unit 336 and the position of the seed point SD supplied from the storage unit 324; a mesh design evaluation unit 340 (evaluation value calculation unit) that calculates an evaluation value EVP for evaluating the design of the mesh shape 22 on the basis of the image data Img generated by the image data generation unit 338; and a data update instruction unit 342 (image data determination unit) that gives an instruction regarding the update/non-update of data, such as the seed point SD and the evaluation value EVP, or regarding the determination of the output image data ImgOut, on the basis of the evaluation value EVP calculated by the mesh design evaluation unit 340.

Figure 26:
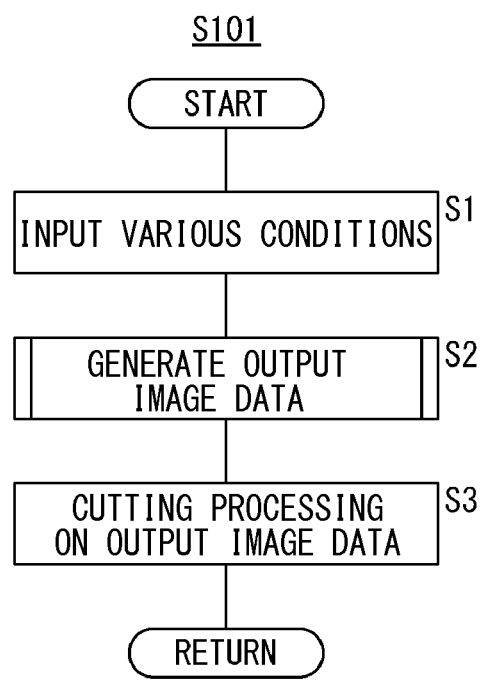
FIG. 26 is a flowchart provided to explain the operation of an image generation apparatus shown in FIG. 25.

Hereinafter, a method of generating image data, which is supplied to form the output of the mesh pattern 20, will be described while mainly referring to the flowchart of FIG. 26 and the configuration block diagram of FIG. 25.

In step S1, the input unit 320 inputs various kinds of information required for the determination of the wiring shape of the mesh pattern 20. The operator inputs viewing information regarding the visibility of the mesh pattern 20 through the display unit 322. The viewing information of the mesh pattern 20 is various kinds of information contributing to the shape or the optical intensity of the mesh pattern 20. For example, the viewing information of the mesh pattern 20 may include at least one of the material, color value, light transmittance, light reflectance, cross-sectional shape, and thickness of the thin metal wire 16. In addition, at least one of the material, color value, light transmittance, light reflectance, and film thickness of the transparent base 12 may be included.

Then, the image information estimation unit 336 estimates image information corresponding to the mesh pattern 20 on the basis of the various kinds of information input through the input unit 320. For example, the number of pixels in the vertical direction of output image data ImgOut can be calculated on the basis of the vertical size of the mesh pattern 20 and the image resolution of the output image data ImgOut. In addition, the number of pixels corresponding to the line width of the thin metal wire 16 can be calculated on the basis of the width of the wiring line and the image resolution described above. Further, it is possible to estimate the number of openings 18 and the number of seed points SD on the basis of the light transmittance of the thin metal wire 16, the light transmittance of the transparent base 12, a total transmittance required, and the width of the wiring line.

Then, the output image data ImgOut is generated (step S2). Prior to explaining the method of generating the output image data ImgOut, a method of evaluating the image data Img will be described first. In the present embodiment, evaluation is performed on the basis of the evaluation value EVP quantifying the noise characteristics (for example, granular noise).

The reference evaluation value EV0 is calculated by the following Expression (4) assuming that the value of the spectrum Spc is F(Ux, Uy).

[Equation 4]

$$EV0 = \{\int_{-U_{max}}^{U_{max}} \int_{-U_{max}}^{U_{max}} VTF(\sqrt{U_x^2 + U_y^2}) F(U_x, U_y) dU_x dU_y\}^{1/2} \quad (4)$$

According to the theorem of Wiener-Khintchine, a value obtained by integrating the spectrum Spc in the entire spatial frequency band corresponds to the square of the RMS. A value obtained by multiplying the spectrum Spc by VTF and integrating the new spectrum Spc in the entire spatial frequency band is an evaluation index that approximately matches the visual characteristics of human. The reference evaluation value EV0 can be referred to as RMS after correction using the visual response characteristics of human. Similarly to the normal RMS, the reference evaluation value EV0 is always a value of 0 or more, and it can be said that the noise characteristic is improved as the value approaches 0.

The actual visual response characteristics of human have a value smaller than 1 in the vicinity of 0 cycle/mm, and thus have so-called band pass filter characteristics. In the present embodiment, however, as illustrated in FIG. 11, contribution to the reference evaluation value EV0 is increased by setting the value of the VTF to 1 even in a very low spatial frequency band. Thus, the effect of suppressing the periodicity due to the repeated arrangement of the mesh patterns 20 is obtained.

Other than the above reference evaluation value EV0, the evaluation value EVP can be calculated by the following Expression (5) using the first and second evaluation values EV1 and EV2 described above.

[Equation 5]

$$EVP = \sum_{j=0}^{2} \alpha j \cdot EVj \quad (5)$$

Here, αj (j=0 to 2) is a coefficient that determines the specific gravity of the respective evaluations. It is needless to say that not only the value of the coefficient αj but also the calculation expression of the evaluation value EVP can be modified in various ways according to the target level (allowable range) or the evaluation function for determining the mesh pattern 20.

For example, the degree of variation for the spectrum Spc in the angular direction (first evaluation value EV1) or for the centroid position along a predetermined direction (second evaluation value EV2) may be quantified using various statistical values. Here, the "statistical values" are calculated values that are calculated using a statistical method. For example, the "statistical values" may be not only a mean and a standard (RMS) deviation but also a mode, a central value, a maximum value, and a minimum value. In addition, it is also possible to perform statistical processing, such as a histogram, and then quantify the degree of variation from the shape and the like.

Hereinafter, a specific method of determining the output image data ImgOut on the basis of the aforementioned evaluation value EVP will be described. For example, it is possible to use a method of sequentially repeating the generation of a dot pattern including a plurality of seed points SD, the generation of the image data Img based on the plurality of seed points SD, and the evaluation based on the evaluation value EVP. Here, various optimization methods can be used as the algorithm of determining the positions of the plurality of seed points SD. For example, as an optimization technique to determine the dot pattern, it is possible to use various search algorithms, such as a constructive algorithm or a sequential improvement algorithm. A neural network, a genetic algorithm, a simulated annealing method, and a void-and-cluster method can be mentioned as specific examples.

Figure 27:
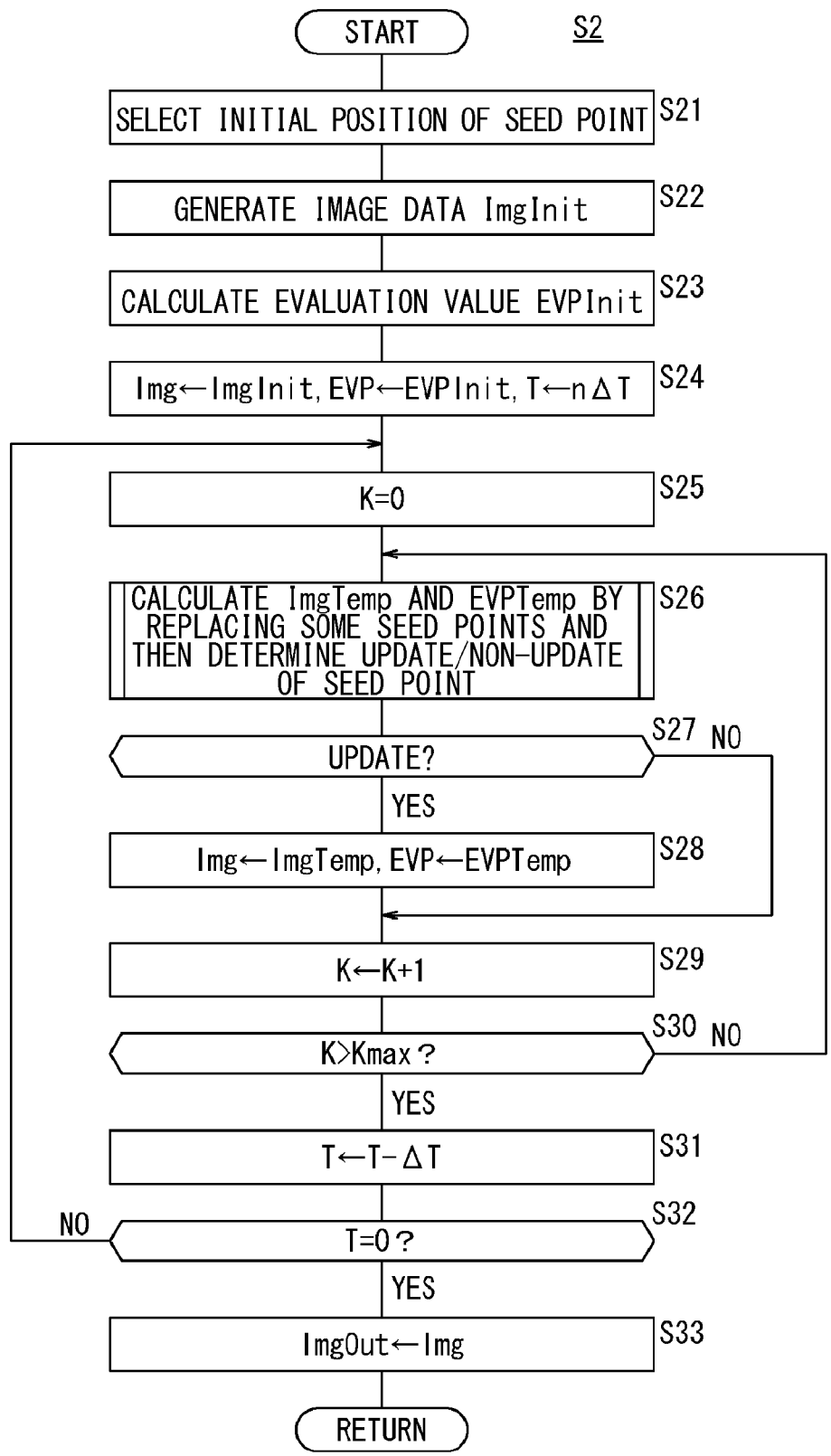
FIG. 27 is a flowchart for a method of generating output image data (step S2 of FIG. 26).

In the present embodiment, a method of optimizing the design of the mesh pattern 20 based on the simulated annealing method (hereinafter, referred to as an SA method) will be described while mainly referring to the flowchart of FIG. 27 and the functional block diagram of FIG. 25. The SA method is a stochastic search algorithm that imitates the "annealing method" for obtaining the robust iron by striking the iron in a high temperature state.

In step S21, the initial position selection unit 328 selects the initial position of each seed point SD. Prior to the selection of the initial position, the random number generation unit 326 generates a random number using a pseudorandom number generation algorithm. Then, the initial position selection unit 328 determines the initial position of each seed point SD randomly using the random number supplied from the random number generation unit 326. Here, the initial position selection unit 328 selects the initial position of each seed point SD as an address of the pixel on the image data Img, and sets it as a position where the seed points SD do not overlap each other.

In step S22, the image data generation unit 338 generates image data ImgInit as initial data. The image data generation unit 338 generates the image data ImgInit (initial data) representing a design corresponding to the mesh pattern 20 on the basis of the position data SDd or the number of seed points SD supplied from the storage unit 324 and the image information supplied from the image information estimation unit 336.

Prior to the generation of the image data Img (including the image data ImgInit), definitions of the pixel address and the pixel value are determined in advance.

Figure 28A:
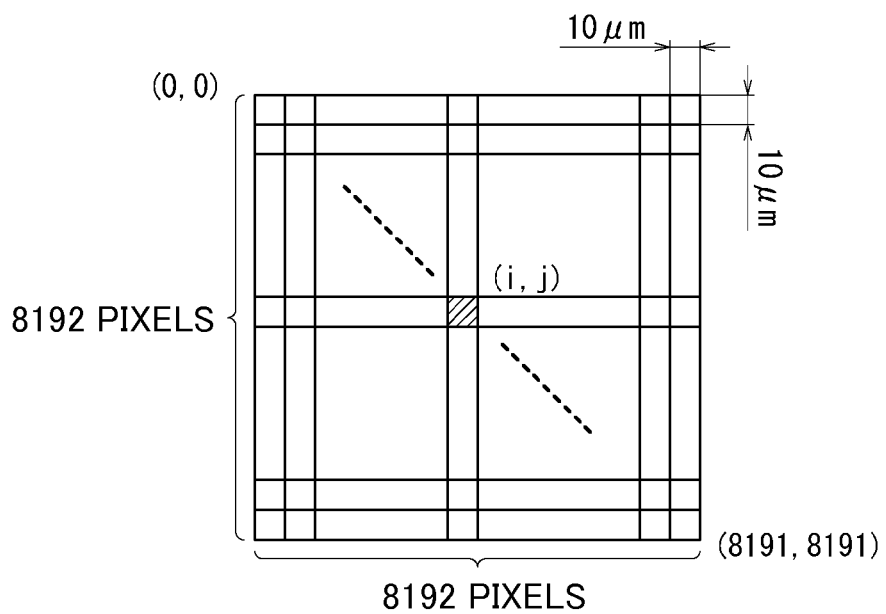
FIG. 28A is an explanatory diagram showing the definition of the pixel address in image data.

FIG. 28A is an explanatory diagram showing the definition of the pixel address in the image data Img. For example, it is assumed that the pixel size is 10 μm and the number of pixels in the image data is 8192 each in the horizontal and vertical direction. For convenience of explanation of the FFT calculation process to be described later, the number of horizontal and vertical pixels in the image data is set to be the power of 2 (for example, 13 power of 2). In this case, the entire image region of the image data Img is equivalent to a rectangular region of about 82-mm square.

Figure 28B:
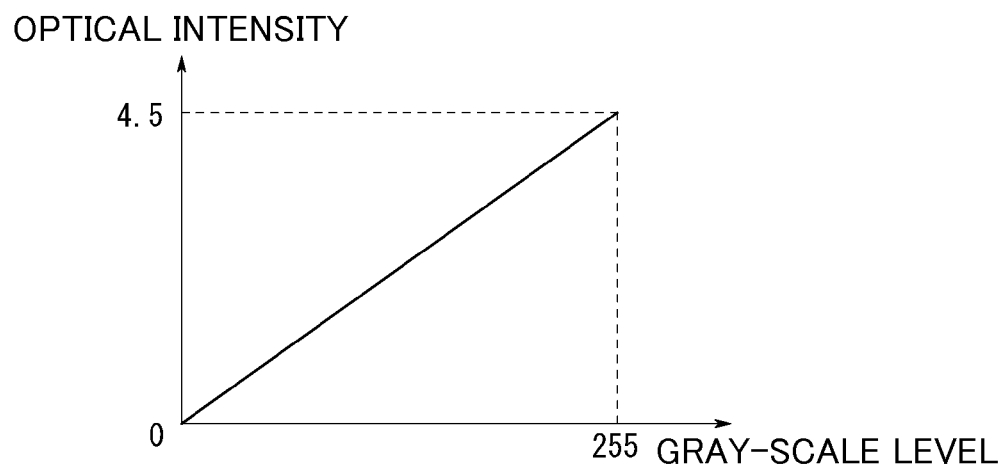
FIG. 28B is an explanatory diagram showing the definition of the pixel value in image data.

FIG. 28B is an explanatory diagram showing the definition of the pixel value in the image data Img. For example, the number of gray-scale levels per pixel is set to 8 bits (256 gray-scale levels). The optical intensity 0 is made to correspond to the pixel value 0 (minimum value), and the optical intensity 4.5 is made to correspond to the pixel value 255 (maximum value). In the pixel values 1 to 254 therebetween, values are determined so as to have a linear relationship with the optical intensity. The definition of the pixel value may be color values, such as tristimulus values XYZ or RGB and L*a*b*, as well as the optical intensity.

In this manner, the image data generation unit 338 generates the image data ImgInit corresponding to the mesh pattern 20 on the basis of the data definition of the image data Img and the image information estimated by the image information estimation unit 336 (step S22).

Figure 29A:
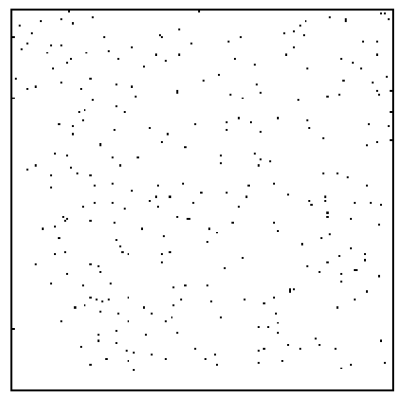
FIG. 29A is a schematic diagram of the initial positions of seed points.
Figure 29B:
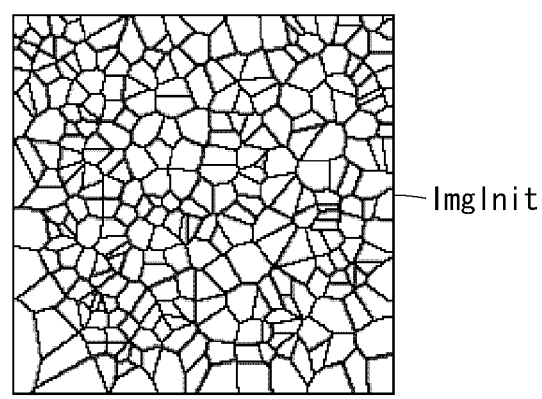
FIG. 29B is a Voronoi diagram based on the seed points shown in FIG. 29A.

The image data generation unit 338 determines the initial state of the mesh pattern 20 shown in FIG. 29B using various region determination algorithms (for example, a Voronoi diagram and a Delaunay diagram) with the initial position (refer to FIG. 29A) of the seed point SD as a reference.

Incidentally, when the size of the image data Img is very large, the amount of arithmetic processing for optimization becomes enormous. In this case, the processing capacity and the processing time of the image generation apparatus 312 are required. In addition, since the size of the image data Img (output image data ImgOut) is large, the memory capacity to store the image data Img is also required. Therefore, a method of making the image data Img have a repeated shape by regularly arranging unit image data ImgE satisfying predetermined boundary conditions is effective. Hereinafter, the specific method will be described in detail with reference to FIGS. 30 and 31.

Figure 30:
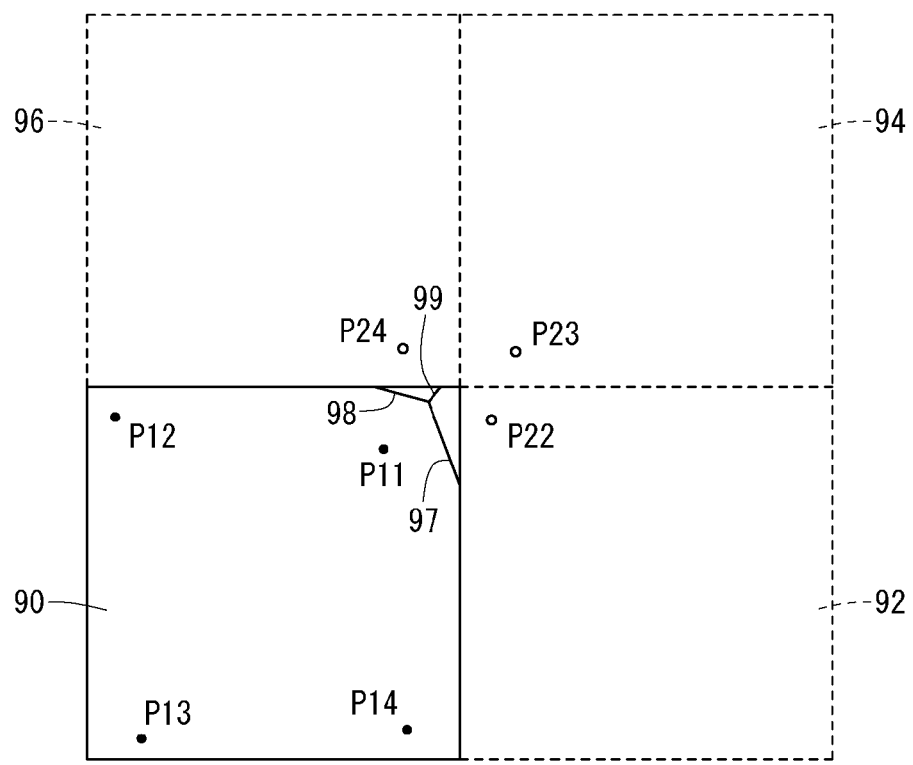
FIG. 30 is a schematic explanatory diagram showing a method of determining a design (wiring shape) at the end of a unit region.
Figure 31:
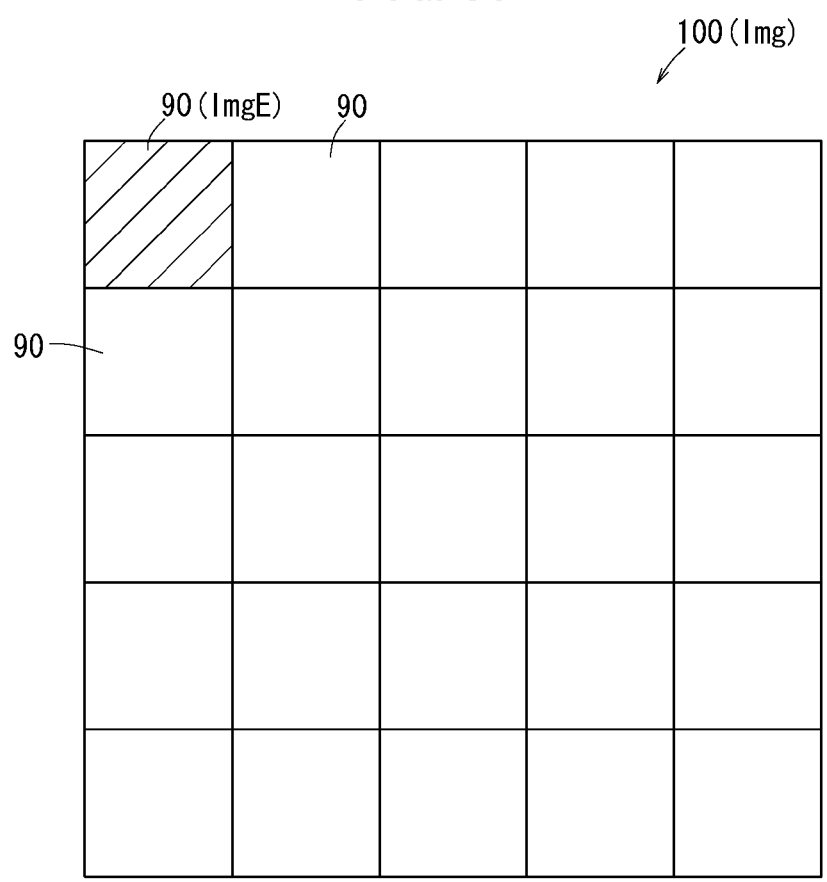
FIG. 31 is a schematic explanatory diagram showing a result when image data is generated by arraying unit image data regularly.

FIG. 30 is a schematic explanatory diagram showing a method of determining a design at the end of a unit region 90. FIG. 31 is a schematic explanatory diagram showing the result when the unit image data ImgE is regularly arrayed to generate the image data Img.

As shown in FIG. 30, in the unit region 90 having an approximately square shape, points $P_{11}$ to $P_{14}$ are disposed in the upper right corner, upper left corner, lower left corner, and lower right corner, respectively. For the convenience of explanation, only four points of the points $P_{11}$ to $P_{14}$ present in the unit region 90 are expressed, and other points are omitted.

A virtual region 92 (indicated by a dotted line) having the same size as the unit region 90 is disposed adjacent to the right side of the unit region 90. On the virtual region 92, a virtual point $P_{22}$ is disposed so as to correspond to the position of the point $P_{12}$ in the unit region 90. In addition, a virtual region 94 (indicated by a dotted line) having the same size as the unit region 90 is disposed adjacent to the upper right side of the unit region 90. On the virtual region 94, a virtual point $P_{23}$ is disposed so as to correspond to the position of the point $P_{13}$ in the unit region 90. Further, a virtual region 96 (indicated by a dotted line) having the same size as the unit region 90 is disposed adjacent to the upper side of the unit region 90. On the virtual region 96, a virtual point $P_{24}$ is disposed so as to correspond to the position of the point $P_{14}$ in the unit region 90.

Then, under this condition, the image data generation unit 338 determines a design (wiring shape) in the upper right corner of the unit region 90 according to the Voronoi diagram (splitting method).

In the relationship between the point $P_{11}$ and the virtual point $P_{22}$, a division line 97, which is a set of points whose distances from the point $P_{11}$ and the virtual point $P_{22}$ are equal, is determined. In addition, in the relationship between the point $P_{11}$ and the virtual point $P_{24}$, a division line 98, which is a set of points whose distances from the point $P_{11}$ and the virtual point $P_{24}$ are equal, is determined. Further, in the relationship between the virtual point $P_{22}$ and the virtual point $P_{24}$, a division line 99, which is a set of points whose distances from the virtual points $P_{22}$ and $P_{24}$ are equal, is determined. By these division lines 97 to 99, a pattern in the upper right corner of the unit region 90 is determined. Similarly, patterns at all ends of the unit region 90 are determined. Hereinafter, image data in the unit region 90 generated in this manner is referred to as the image data ImgE.

As shown in FIG. 31, the image data Img is generated in the planar region 100 by arraying the unit image data ImgE regularly facing in the same direction and in the horizontal and vertical directions. Since the design is determined according to the boundary conditions shown in FIG. 30, seamless connection can be made between the upper and lower ends of the unit image data ImgE and between the right and left ends of the unit image data ImgE.

By this configuration, it is possible to reduce the size of the unit image data ImgE. As a result, it is possible to reduce the amount of arithmetic processing and the data size. In addition, moire due to the mismatch of the seam is not generated. The shape of the unit region 90 is not limited to the square shown in FIGS. 30 and 31, and any shape that can be arrayed without space, such as a rectangle, a triangle, and a hexagon, can be used.

In step S23, the mesh design evaluation unit 340 calculates an evaluation value EVPInit as an initial value. In the SA method, the evaluation value EVP serves as a cost function. The mesh pattern evaluation unit 340 acquires the spectrum Spc by performing a fast Fourier transformation (FFT) on the image data ImgInit, and then calculates the evaluation value EVP on the basis of the spectrum Spc. It is needless to say that the calculation expression of the evaluation value EVP can be modified in various ways according to the target level (allowable range) or the evaluation function for determining the mesh pattern 20.

In step S24, the storage unit 324 temporarily stores the image data ImgInit generated in step S22 as Img and the evaluation value EVPInit calculated in step S23 as EVP. At the same time, an initial value $n\Delta T$ (n is a natural number, and $\Delta T$ is a positive real number) is substituted for the pseudo-temperature T.

In step S25, the mesh design evaluation unit 340 initializes a variable K. That is, 0 is substituted for K.

Then, in a state where some of the seed points SD (second seed point SDS) are replaced with candidate points SP, image data ImgTemp is generated and evaluation value EVPTemp is calculated, and then "update" or "non-update" of the seed point SD is determined (step S26). This step S26 will be described in more detail with reference to the flowchart of FIG. 32 and the functional block diagram of FIG. 25.

In step S261, the update candidate position determination unit 330 extracts and determines the candidate point SP from the predetermined planar region 100. The update candidate position determination unit 330 determines a position, which does not overlap any position of the seed point SD in the image data Img, for example, using the random number supplied from the random number generation unit 326. The number of candidate points SP may be 1 or more. In an example shown in FIG. 33A, the number of current seed points SD is 8 (points $P_1$ to $P_8$), while the number of candidate points SP is 2 (points $Q_1$ and $Q_2$).

Figure 33A:
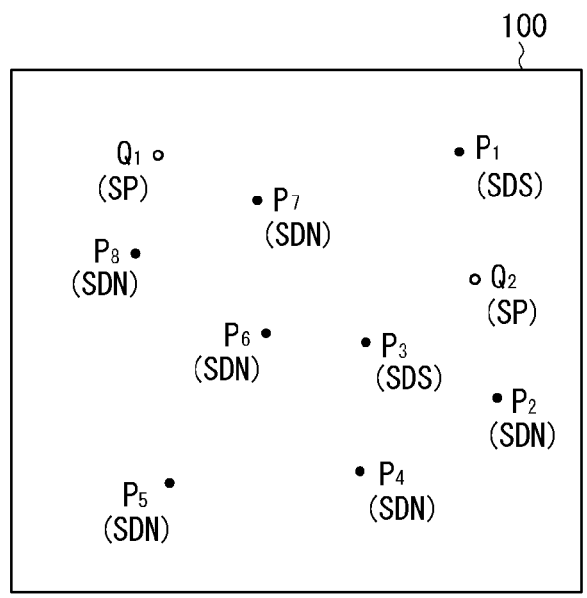
FIG. 33A is an explanatory diagram showing the positional relationship of first seed points, second seed points and candidate points in an image region.
Figure 33B:
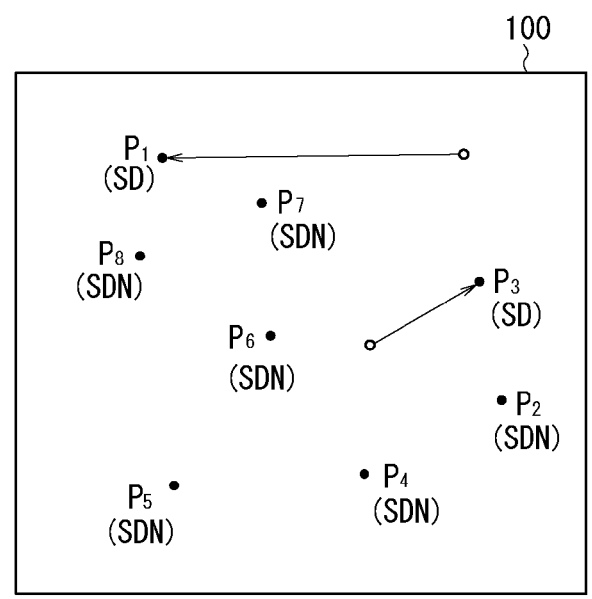
FIG. 33B is an explanatory diagram showing a result when the position of the seed point is updated by exchanging the second seed point for the candidate point.

In step S262, some of the seed points SD are exchanged for the candidate points SP at random. The update candidate position determination unit 330 correlates the seed point SD, which is exchanged for (or updated to) a candidate point SP, with the candidate point SP at random. In FIG. 33A, it is assumed that the point $P_1$ is correlated with the point $Q_1$ and the point $P_3$ is correlated with the point $Q_2$. As shown in FIG. 33B, the point $P_1$ is exchanged for the point $Q_1$, and the point $P_3$ is exchanged for the point $Q_2$. Here, the points $P_2$ and $P_4$ to $P_8$ not to be exchanged (or not to be updated) are referred to as a first seed point SDN, and the points $P_1$ and $P_3$ to be exchanged (or to be updated) are referred to as a second seed point SDS.

In step S263, the image data generation unit 338 generates the image data ImgTemp on the basis of the exchanged new seed point SD (refer to FIG. 33B) and the image information estimated by the image information estimation unit 336 (refer to the explanation of step S1). In this case, since the same method as in step S22 (refer to FIG. 27) is used, explanation thereof will be omitted.

In step S264, the mesh design evaluation unit 340 calculates the evaluation value EVPTemp on the basis of the image data ImgTemp. In this case, since the same method as in step S23 (refer to FIG. 27) is used, explanation thereof will be omitted.

In step S265, the data update instruction unit 342 calculates an update probability Prob of the position of the seed point SD. Here, the "update of the position" refers to determining the seed point SD obtained by temporary exchange in step S262 (that is, the first seed point SDN and the candidate point SP) as the new seed point SD.

Specifically, the probability of updating or non-updating the seed point SD is calculated according to the metropolis criterion. The update probability Prob is given by the following Expression (6).

[Equation 6]

$$P_{rob} = \begin{cases} 1 & (\text{if } EVPTemp < EVP) \\ \exp\left(-\dfrac{EVPTemp - EVP}{T}\right) & (\text{if } EVPTemp \geq EVP) \end{cases} \quad (6)$$

Here, T indicates a pseudo-temperature, and the update rule of the seed point SD changes from "stochastic" to "deterministic" as the temperature approaches the absolute temperature (T=0).

In step S266, the data update instruction unit 342 determines whether or not to update the position of the seed point SD according to the calculated update probability Prob. For example, whether or not to update the position of the seed point SD may be stochastically determined using the random number supplied from the random number generation unit 326. The data update instruction unit 342 gives an instruction of "update" to the storage unit 324 when the seed point SD is updated, and gives an instruction of "non-update" to the storage unit 324 when the seed point SD is not updated (steps S267 and S268).

Thus, step S26 of determining whether to replace (update) some of the seed points SD (second seed point SDS) with the candidate points SP or not (non-update) is completed.

Referring back to FIG. 27, according to the instruction of either "update" or "non-update" of the position of the seed point SD, whether or not to update the seed point SD is determined (step S27). The process proceeds to the next step S28 when the seed point SD is updated, and the process skips step S28 and proceeds to step S29 when the seed point SD is not updated.

In step S28, when updating the seed point SD, the storage unit 324 overwrites the image data Img, which is currently stored, to replace it with the image data ImgTemp calculated in step S263. In addition, the storage unit 324 overwrites the evaluation value EVP, which is currently stored, to replace it with the evaluation value EVPTemp calculated in step S264. Further, the storage unit 324 overwrites the position data SDSd of the second seed point SDS, which is currently stored, to replace it with the position data SPd of the candidate point SP calculated in step S261. Then, the process proceeds to the next step S29.

In step S29, the data update instruction unit 342 adds 1 to the value of K at the present time.

In step S30, the data update instruction unit 342 performs a size comparison between the value of K at the present time and the value of Kmax determined in advance. When the value of K is smaller than Kmax, the process returns to step S26 to repeat the steps S26 to S29. When K>Kmax is satisfied, the process proceeds to the next step S31.

In step S31, the data update instruction unit 342 subtracts ΔT from the pseudo-temperature T. The variation of the pseudo-temperature T may be the multiplication of the constant δ (0<δ<1) instead of the subtraction of ΔT. In this case, a predetermined value is subtracted from the probability Prob (bottom) shown in Expression (6).

In step S32, the data update instruction unit 342 determines whether or not the pseudo-temperature T at the present time is equal to 0. When T is not equal to 0, the process returns to step S25 to repeat the steps S25 to S31. On the other hand, when T is equal to 0, the data update instruction unit 342 notifies the storage unit 324 that the evaluation based on the SA method has been completed.

In step S33, the storage unit 324 overwrites the contents of the image data Img, which has been updated last in step S28, to replace it with the output image data ImgOut. Thus, the generation of the output image data ImgOut (step S2) is ended.

Since the image data Img representing the design of the mesh pattern 20 obtained by arraying different mesh shapes 22 is generated, the evaluation value EVP is calculated by quantifying the degree of variation of the centroid position of each mesh shape 22 on the basis of the image data Img, and a piece of image data Img is determined as the output image data ImgOut on the basis of the evaluation value EVP and predetermined evaluation conditions, it is possible to determine each mesh shape 22 having noise characteristics which satisfy the predetermined evaluation conditions. In other words, by controlling the shape of the mesh pattern 20 appropriately, it is possible to suppress the generation of both the moire and the granular feeling of noise.

It is preferable to calculate the first evaluation value EV1 on the basis of the centroid spectrum Spcc for the centroid position distribution C. Further, regarding the centroid position distribution C, it is preferable that the statistical value of the centroid position, which is disposed along the reference axis 430, with respect to the crossing axis 432 be calculated as the second evaluation value EV2.

The output image data ImgOut may be image data representing wiring shapes of electrodes for various devices such as an inorganic EL device, an organic EL device, or a solar cell, as well as the touch panel 44. In addition to electrodes, applications can also be made to a transparent heating element that generates heat when a current is caused to flow (for example, a defroster of a vehicle) and an electromagnetic shielding material to block electromagnetic waves.

Referring back to FIG. 26, finally, the image cutting unit 332 cuts two or more first conductive patterns 70a, two or more first dummy patterns 76a, and two or more second conductive patterns 70b from the shape of the planar region 100 (design of the mesh pattern 20) represented by the output image data ImgOut (step S3).

Figure 34A:
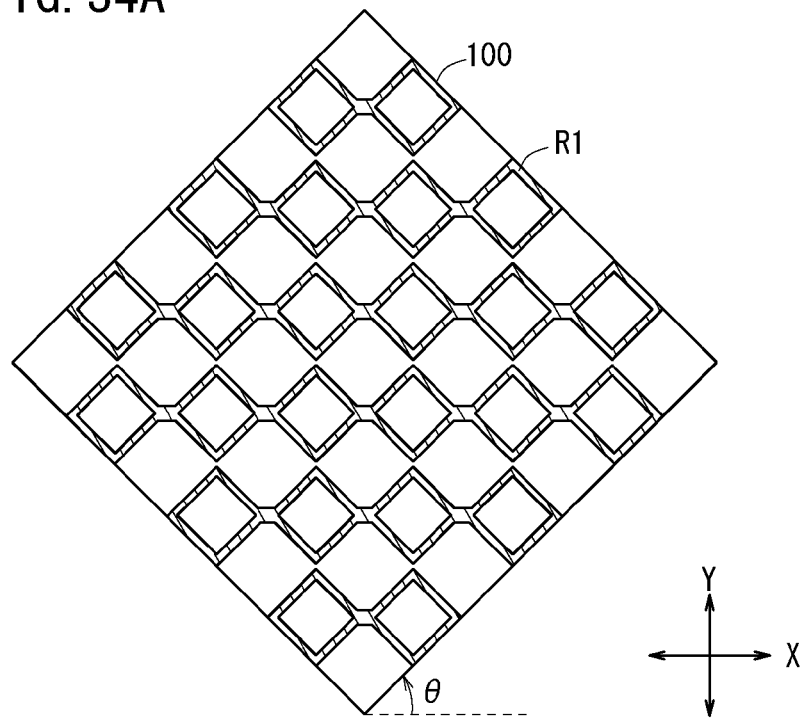
FIG. 34A is a schematic explanatory diagram showing a result of the cutting of a first conductive pattern and a first dummy pattern.
Figure 34B:
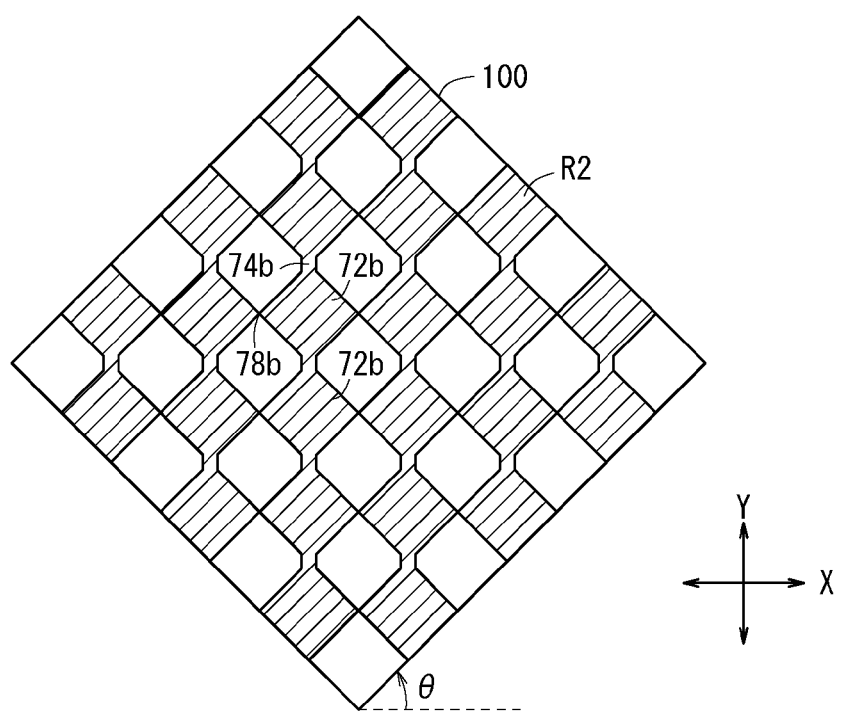
FIG. 34B is a schematic explanatory diagram showing a result of the cutting of a second conductive pattern.

FIG. 34A is a schematic explanatory diagram showing a result of the cutting of the first conductive pattern 70a and the first dummy pattern 76a. FIG. 34B is a schematic explanatory diagram showing a result of the cutting of the second conductive pattern 70b.

By cutting a portion excluding a first region R1 (hatched region) from the planar region 100 shown in FIG. 34A, first image data representing a design on one main surface side (arrow s1 direction side in FIG. 2B) of the transparent base 12 is generated. The first region R1 has a shape in which a plurality of rhombic frames are connected to each other in the arrow X direction. That is, the first image data represents two or more first conductive patterns 70a and two or more first dummy patterns 76a (refer to FIG. 6 and the like).

By cutting out only a second region R2 (hatched region) from the planar region 100 shown in FIG. 34B, second image data representing a design on the other main surface side (arrow s2 direction side in FIG. 2B) of the transparent base 12 is generated. The second image data represents two or more second conductive patterns 70b (refer to FIG. 7 and the like). A region excluding the second region R2 (blank region in the planar region 100 shown in FIG. 34B) corresponds to the position of each first conductive pattern 70a.

In FIGS. 34A and 34B, the planar region 100 is disposed in a state of being inclined by a predetermined angle (for example, θ=45°) compared with FIG. 31. That is, the angle θ formed by the arrangement direction of the unit image data ImgE and the extending direction of the first conductive pattern 70a (or the second conductive pattern 70b) is not 0° (0°<θ<90°). Thus, since the first conductive pattern 70a (or the second conductive pattern 70b) is inclined by the predetermined angle θ with respect to the arrangement direction of the repeated shape of the mesh pattern 20, it is possible to suppress the generation of moire between the first sensing portion 72a (or the second sensing portion 72b) and the repeated shape described above. It is needless to say that θ may be 0° if the moire is not generated. For the same reason, it is preferable to make the size of the repeated shape larger than the size of the first sensing portion 72a (or the first sensing portion 72b).

The output image data ImgOut, the first image data, and the second image data that are generated are used in forming the output of the thin metal wire 16. For example, when producing the conductive sheets 10 and 11 using exposure, the output image data ImgOut, the first image data, and the second image data are used to make the pattern of the photomask. When producing the conductive sheets 10 and 11 by printing including screen printing and ink jet printing, the output image data ImgOut, the first image data, and the second image data are used as printing data.

Next, as a method for forming the first conductive pattern 70a, the first dummy pattern 76a, and the second conductive pattern 70b (hereinafter, may be referred to as the first conductive pattern 70a or the like), for example, a method may be employed in which a photosensitive material having an emulsion layer containing photosensitive silver halide on the transparent base 12 is exposed and development processing is performed on the resultant to form a metal silver portion and a light-transmissive portion corresponding to an exposed portion and an unexposed portion, respectively, thereby forming the first conductive pattern 70a and the like. Further, the metal silver portion may be caused to carry conductive metal by performing physical development and/or plating processing on the metal silver portion. A production method shown below can be preferably adopted for the conductive sheet 11 shown in FIG. 2B. That is, in the method, by performing one-shot exposure on the photosensitive silver halide emulsion layers formed on both surfaces of the transparent base 12, the first conductive pattern 70a and the first dummy pattern 76a are formed on one main surface of the transparent base 12, and the second conductive pattern 70b is formed on the other main surface of the transparent base 12.

A specific example of this conductive sheet producing method will be described with reference to FIGS. 35 to 37.

Figure 35:
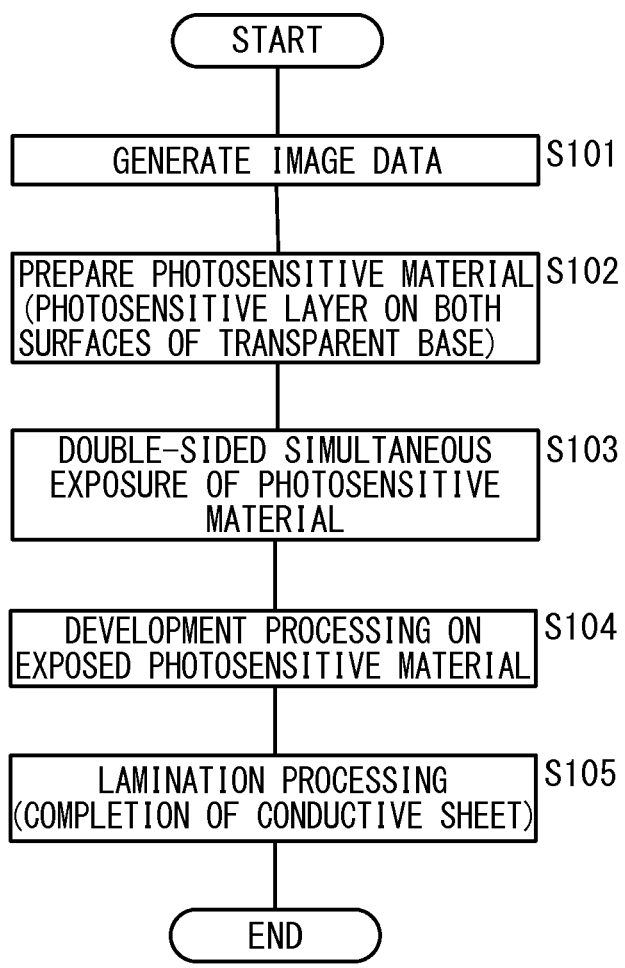
FIG. 35 is a flowchart showing a method of producing a conductive sheet according to the present embodiment.

First, in step S101 of FIG. 35, image data provided to form an output of the mesh pattern 20 is generated. This step is performed according to the flowchart of FIG. 27. That is, in the steps of generating the output image data, image data representing the design of a mesh pattern obtained by arraying different mesh shapes is generated, an evaluation value is calculated by quantifying the degree of variation of the centroid position of each mesh shape on the basis of the generated image data, and a piece of image data is determined as output image data on the basis of the calculated evaluation value and predetermined evaluation conditions. Since the specific method has already been described above, the explanation herein will be omitted.

Hereinafter, in plan view, described in detail is the process for obtaining a conductive sheet, in which a mesh pattern is formed on a base by outputting and forming a conductive wire on the base in accordance with the output image data determined as described above.

Figure 36A:
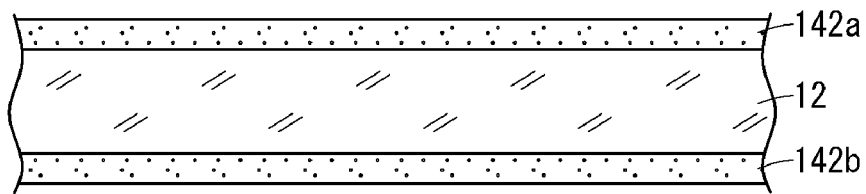
FIG. 36A is a cross-sectional view showing the produced photosensitive material in which a part thereof is omitted.

In step S102 of FIG. 35, a long photosensitive material 140 is prepared. As shown in FIG. 36A, the photosensitive material 140 includes a transparent base 12, a photosensitive silver halide emulsion layer formed on one main surface of the transparent base 12 (hereinafter, referred to as a first photosensitive layer 142a), and a photosensitive silver halide emulsion layer formed on the other main surface of the transparent base 12 (hereinafter, referred to as a second photosensitive layer 142b).

The photosensitive material 140 is exposed in step S103 of FIG. 35. In this exposure processing, a first exposure processing for the first photosensitive layer 142a in which the first photosensitive layer 142a is exposed along the first exposure pattern by irradiating light toward the transparent base 12 and a second exposure processing for the second photosensitive layer 142b in which the second photosensitive layer 142b is exposed along the second exposure pattern by irradiating light toward the transparent base 12 are performed (double-sided simultaneous exposure). In the example shown in FIG. 36B, the first light 144a (parallel light) is irradiated to the first photosensitive layer 142a through a first photomask 146a and second light 144b (parallel light) is irradiated to the second photosensitive layer 142b through a second photomask 146b while transporting the long photosensitive material 140 in one direction. The first light 144a is obtained by converting light emitted from a first light source 148a into parallel light using a first collimator lens 150a en route, and the second light 144b is obtained by converting light emitted from a second light source 148b into parallel light using a second collimator lens 150b en route.

Figure 36B:
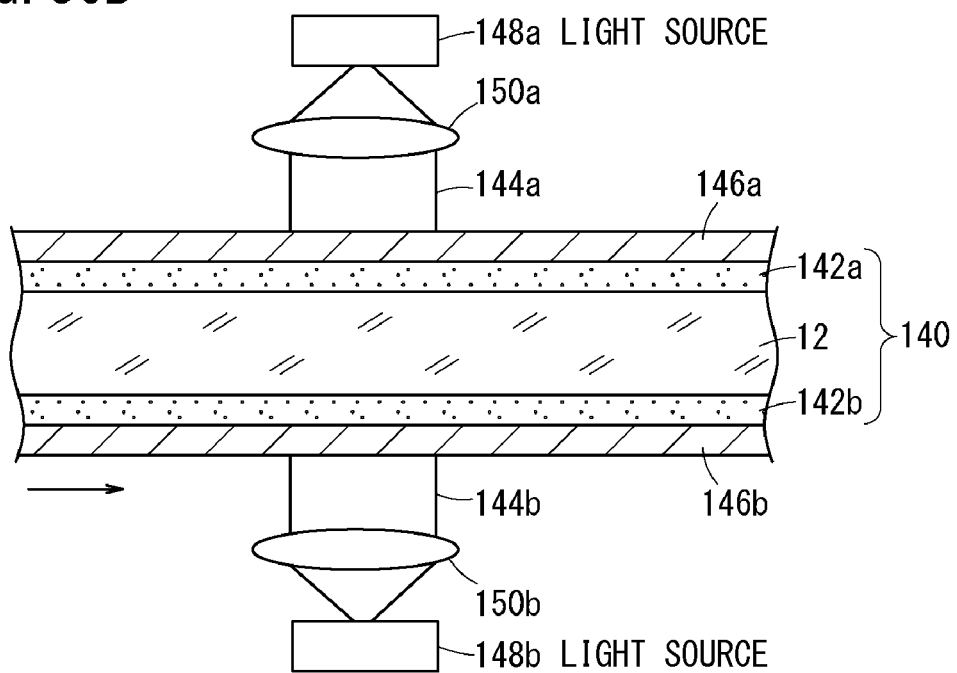
FIG. 36B is a schematic explanatory diagram showing double-sided simultaneous exposure to the photosensitive material.

In the example shown in FIG. 36B, a case is shown in which two light sources (first and second light sources 148a and 148b) are used. However, light emitted from one light source may be divided through an optical system, and the respective lights divided may be irradiated to the first and second photosensitive layers 142a and 142b as the first light 144a and the second light 144b.

Then, in step S104 of FIG. 35, the photosensitive material 140 after exposure is developed. Since the exposure time and development time of the first and second photosensitive layers 142a and 142b variously change depending on the type of the first and second light sources 148a and 148b, the type of developer, and the like, the preferable numerical range cannot be categorically determined. However, the exposure time and the development time are adjusted so as to realize the development rate of 100%.

In the first exposure processing of the production method according to the present embodiment, as shown in FIG. 37, the first photomask 146a is disposed on the first photosensitive layer 142a so as to be brought into close contact with each other, for example, and the first light 144a is irradiated from the first light source 148a, which is disposed so as to face the first photomask 146a, toward the first photomask 146a to expose the first photosensitive layer 142a. The first photomask 146a is configured to include a glass substrate formed of transparent soda glass and a mask pattern (first exposure pattern 152a) formed on the glass substrate. Therefore, a portion along the first exposure pattern 152a formed on the first photomask 146a, of the first photosensitive layer 142a, is exposed by the first exposure processing. A spacing of about 2 μm to 10 μm may be provided between the first photosensitive layer 142a and the first photomask 146a.

Similarly, in the second exposure processing, the second photomask 146b is disposed on the second photosensitive layer 142b so as to be brought into close contact with each other, for example, and the second light 144b is irradiated from the second light source 148b, which is disposed so as to face the second photomask 146b, toward the second photomask 146b to expose the second photosensitive layer 142b. Similar to the first photomask 146a, the second photomask 146b is configured to include a glass substrate formed of transparent soda glass and a mask pattern (second exposure pattern 152b) formed on the glass substrate. Therefore, a portion along the second exposure pattern 152b formed on the second photomask 146b, of the second photosensitive layer 142b, is exposed by the second exposure processing. In this case, a spacing of about 2 μm to 10 μm may be provided between the second photosensitive layer 142b and the second photomask 146b.

In the first exposure processing and the second exposure processing, the irradiation timing of the first light 144a from the first light source 148a and the irradiation timing of the second light 144b from the second light source 148b may be the same or may be different. If both the irradiation timings are the same, it is possible to reduce the processing time since the first and second photosensitive layers 142a and 142b can be exposed simultaneously by one exposure processing.

Finally, in step S105 of FIG. 35, the conductive sheet 11 is completed by performing lamination processing on the photosensitive material 140 after the development processing. Specifically, the first protective layer 26a is formed on the first photosensitive layer 142a side, and the second protective layer 26b is formed on the second photosensitive layer 142b side. These protect the first and second sensor portions 60a and 60b.

In this way, electrodes of the touch panel 44 can be easily formed by using the production method employing the aforementioned double-sided one-shot exposure. As a result, it is possible to make the touch panel 44 thin (have a low profile).

Although the example described above is a production method for forming the first conductive pattern 70a and the like using a photosensitive silver halide emulsion layer, there are the following production methods as other production methods.

For example, the first conductive pattern 70a and the like may be formed by exposing and developing a photoresist film on a copper foil, which is formed on the transparent base 12, to form a resist pattern and etching the copper foil exposed from the resist pattern. Alternatively, the first conductive pattern 70a and the like may be formed by printing paste containing metal particulates on the transparent base 12 and performing metal plating on the paste. Alternatively, the first conductive pattern 70a and the like may be printed and formed on the transparent base 12 by using a screen printing plate or a gravure printing plate. Alternatively, the first conductive pattern 70*a* and the like may be formed on the transparent base 12 using an ink jet.

Subsequently, modifications (first to fifth modifications) of the conductive sheet 11 according to the present embodiment will be described with reference to FIGS. 38 to 44. In the modifications, the same reference numerals as those in the present embodiment are given to the same components as those in the present embodiment, and detailed explanation thereof will be omitted.

[First Modification]

A touch panel 160 may be of a resistance film type (and further, a digital type and an analog type) instead of a capacitive type. Hereinafter, the structure and the principle of operation will be described with reference to FIGS. 38 to 40.

The digital resistance film type touch panel 160 includes a lower panel 162, an upper panel 164 disposed so as to face the lower panel 162, an adhesive frame layer 166 that bonds the lower and upper panels 162 and 164 together at the edges of those and electrically insulates the lower and upper panels 162 and 164 from each other, and a flexible printed circuit (FPC) 168 interposed between the lower and upper panels 162 and 164.

Figure 39A:
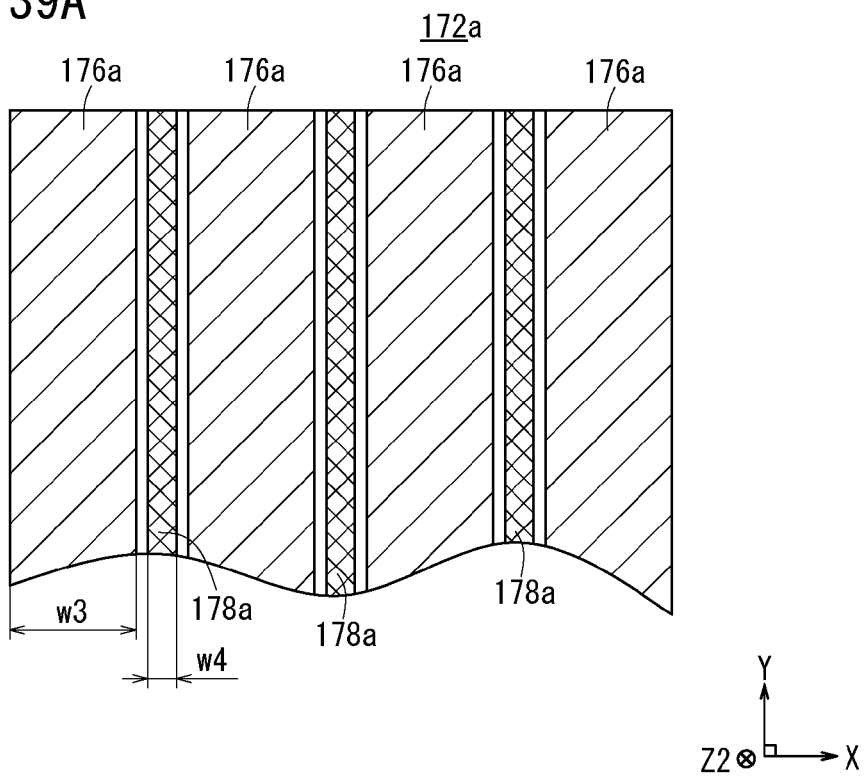
FIG. 39A is a partially enlarged plan view of a first sensor portion shown in FIG. 38.

As shown in FIGS. 38 and 39A, the upper panel 164 includes a first transparent base 170*a* formed of a flexible material (for example, resin) and a first sensor portion 172*a* and a first terminal wiring portion 174*a* that are formed on one main surface (arrow Z2 direction side) of the first transparent base 170*a*. The first sensor portion 172*a* includes two or more first conductive patterns 176*a* formed by a plurality of thin metal wires 16. The belt-like first conductive patterns 176*a* extend in the arrow Y direction, and are arrayed at equal intervals in the arrow X direction. Each of the first conductive patterns 176*a* is electrically connected to the FPC 168 through the first terminal wiring portion 174*a*. Between the first conductive patterns 176*a*, a belt-like first dummy pattern 178*a* is disposed.

Figure 39B:
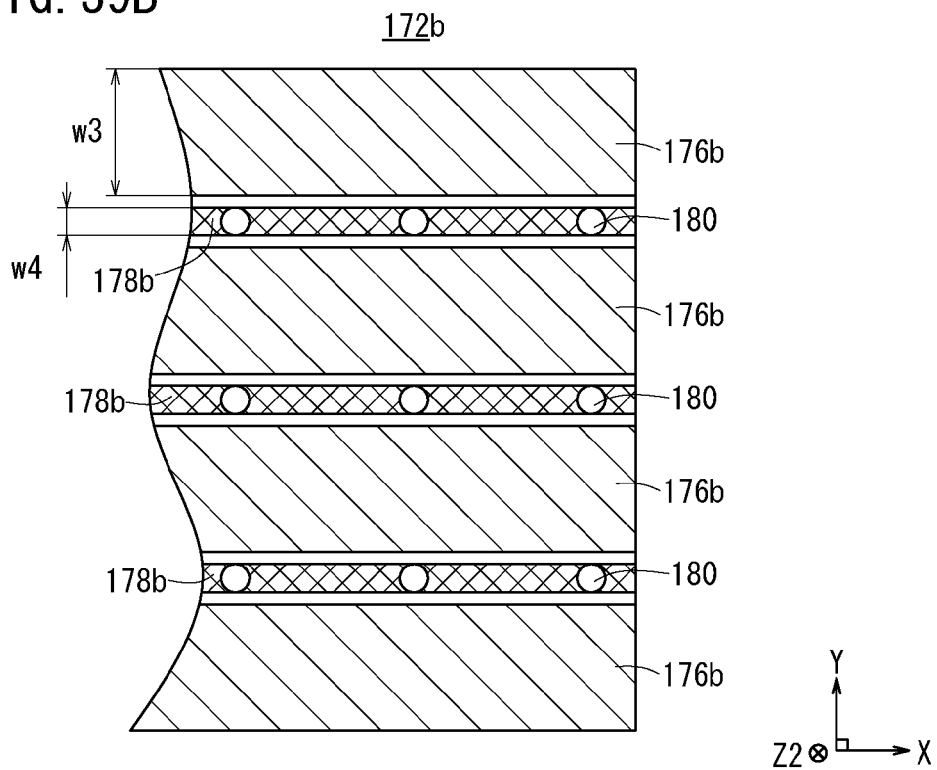
FIG. 39B is a partially enlarged plan view of a second sensor portion shown in FIG. 38.

As shown in FIGS. 38 and 39B, the lower panel 162 includes a second transparent base 170*b* formed of a high-rigidity material (for example, glass), a second sensor portion 172*b* and a second terminal wiring portion 174*b* that are formed on one main surface (arrow Z1 direction side) of the second transparent base 170*b*, and a number of dot spaces 180 disposed at predetermined intervals on the second sensor portion 172*b*. The second sensor portion 172*b* includes two or more second conductive patterns 176*b* formed by a plurality of thin metal wires 16. The belt-like second conductive patterns 176*b* extend in the arrow X direction, and are arrayed at equal intervals in the arrow Y direction. Each of the second conductive patterns 176*b* is electrically connected to the FPC 168 through the second terminal wiring portion 174*b*. Between the second conductive patterns 176*b*, a belt-like second dummy pattern 178*b* is disposed.

Figure 40:
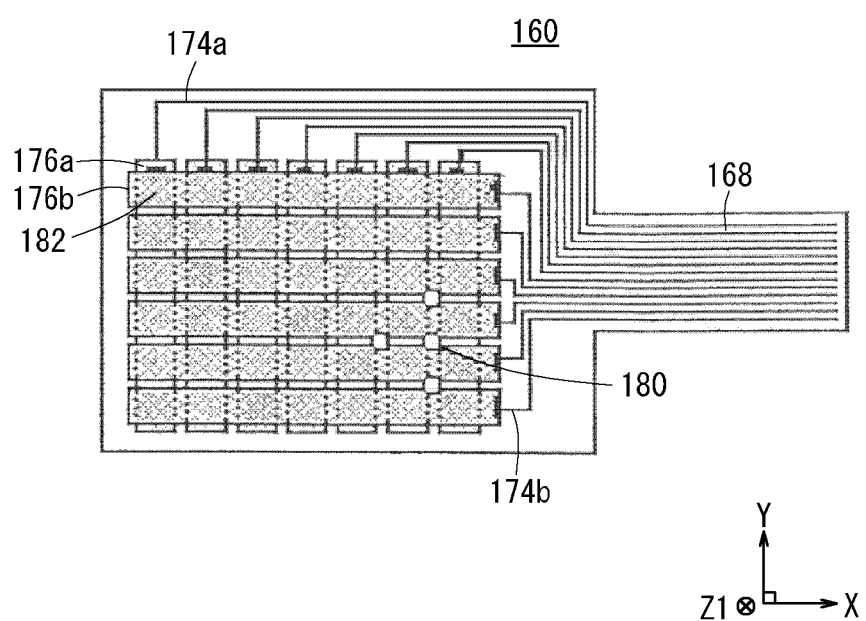
FIG. 40 is a front view of the touch panel shown in FIG. 38 in which a part of the touch panel is omitted.

As shown in FIGS. 38 and 40, in a state where the upper and lower panels 164 and 162 are bonded together, the first sensor portion 172*a* is disposed so as to be spaced apart from the second sensor portion 172*b* by a predetermined distance through each dot spacer 180. In addition, a number of approximately square overlapping regions 182 are formed by making the first and second conductive patterns 176*a* and 176*b* cross each other. Further, each dot spacer 180 is disposed at a position where the first and second dummy patterns 178*a* and 178*b* cross each other. That is, a positional relationship is established in which one dot spacer 180 is disposed in each of the four corners of each overlapping region 182.

Next, the operation of a touch panel 160 will be described. In response to pressure from the input surface (main surface of the first transparent base 170*a* on the arrow Z1 side), the flexible first transparent base 170*a* is bent concavely. Then, a part of the first conductive pattern 176*a* is brought into contact with a part of the second conductive pattern 176*b* in a portion that corresponds to one overlapping region 182 surrounded by four dot spacers 180 and closest to the pressing position. Under this condition, by applying a voltage through the FPC 168, a potential gradient is generated between the upper and lower panels 164 and 162. That is, an input position in the arrow X direction (X axis) can be detected by reading a voltage from the upper panel 164 through the FPC 168. Similarly, an input position in the arrow Y direction (Y axis) can be detected by reading a voltage from the lower panel 162.

Here, the width w3 of the first conductive pattern 176*a* (or the second conductive pattern 176*b*) may be variously set according to the resolution. For example, about 1 mm to 5 mm is preferable. The width w4 of the first dummy pattern 178*a* (or the second dummy pattern 178*b*) is preferably in a range of 50 μm to 200 μm in terms of insulation from the first conductive pattern 176*a* (or the second conductive pattern 176*b*) and the sensitivity of the touch panel 160.

The structure of the mesh pattern 20 shown in FIG. 2A appears when parts of the single hatched regions (first and second conductive patterns 176*a* and 176*b*) and the double hatched regions (first and second dummy patterns 178*a* and 178*b*), which are shown in FIGS. 39A and 39B, are enlarged. That is, it is preferable to determine the wiring shape by which both of the suppression of moire generation and the reduction of granular feeling of noise can be realized under the state in which the upper and lower panels 164 and 162 are superimposed.

[Second Modification]

The contour shape of a first conductive pattern 192*a* and/or a second conductive pattern 192*b* may be different from the shape in the present embodiment. Hereinafter, first and second sensor portions 190*a* and 190*b* having an approximately lattice-shaped pattern macroscopically in plan view, without forming the first sensing portion 72*a* (refer to FIG. 5A) and the second sensing portion 72*b* (refer to FIG. 5B), will be described with reference to FIGS. 41A and 41B.

Figure 41A:
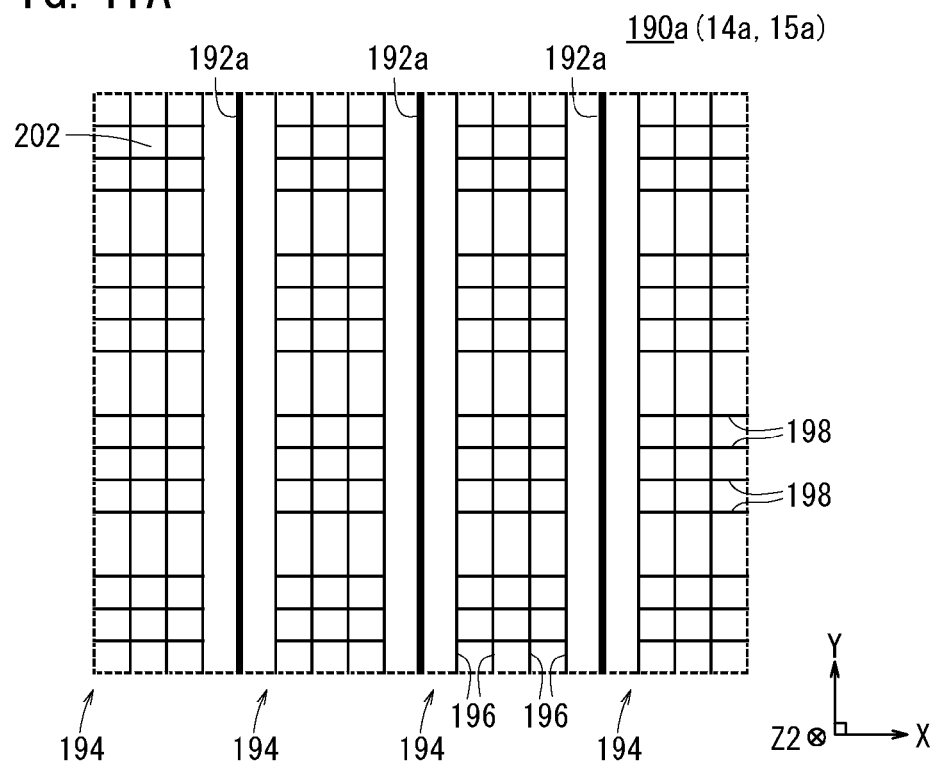
FIG. 41A is a partially enlarged plan view of a first sensor portion according to a second modification.
Figure 41B:
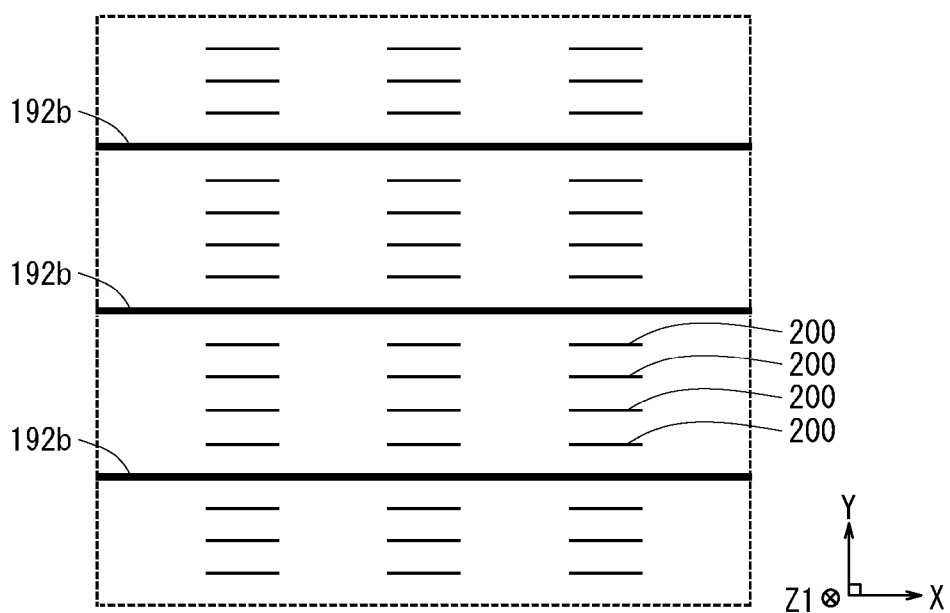
FIG. 41B is a partially enlarged plan view of a second sensor portion according to the second modification.

FIG. 41A is a partially enlarged view of the first sensor portion 190*a* (the first conductive portion 14*a* and the first dummy electrode portion 15*a*), and FIG. 41B is a partially enlarged view of the second sensor portion 190*b* (the second conductive portion 14*b* and the second dummy electrode portion 15*b*). For the convenience of explanation, in FIGS. 41A and 41B, only the contour of the mesh pattern 20 formed by a plurality of thin metal wires 16 is shown in a single line. That is, when a part of each single line shown in FIGS. 41A and 41B is enlarged, the structure of the mesh pattern 20 shown in FIG. 2A appears.

As shown in FIG. 41A, two or more first conductive patterns 192*a* formed by a plurality of thin metal wires 16 are provided in a portion corresponding to the first sensor portion 190*a*. The first conductive patterns 192*a* extend in the arrow Y direction, and are arrayed at equal intervals in the arrow X direction perpendicular to the arrow Y direction. The first conductive pattern 192*a* is different from the second conductive pattern 70*b* (refer to FIG. 5B), and has an approximately constant line width. Between the first conductive patterns 192*a*, a lattice-shaped first dummy pattern 194 is disposed. The first dummy pattern 194 is configured to include four long line patterns 196, which extend in the arrow Y direction and are disposed at equal intervals, and a number of short line patterns 198, which are disposed so as to cross the four long line patterns 196. The short line patterns 198 have the same length, and are disposed at equal intervals in the arrow Y direction with the four short line patterns 198 as a unit.

As shown in FIG. 41B, two or more second conductive patterns 192b formed by a plurality of thin metal wires 16 are provided in a portion corresponding to the second sensor portion 190b. The second conductive patterns 192b extend in the arrow X direction, and are arrayed at equal intervals in the arrow Y direction perpendicular to the arrow X direction. The second conductive pattern 192b is different from the first conductive pattern 70a (refer to FIG. 5A), and has an approximately constant line width. Between the second conductive patterns 192b, a number of linear second dummy patterns 200 extending in the arrow X direction are disposed. The second dummy patterns 200 all have the same length, and are disposed at equal intervals in the arrow Y direction with the four second dummy patterns 200 as a unit.

That is, the designs formed in the first sensor portion 190a (refer to FIG. 41A) and the second sensor portion 190b (refer to FIG. 41B) complement each other in plan view, and a lattice shape having a unit defined by a lattice element 202 is completed. Even with this configuration, the same effects as the present invention can be obtained.

[Third Modification]

A conductive sheet 210 may be formed by two sheet members (first and second sheet members 212a and 212b).

Figure 42:
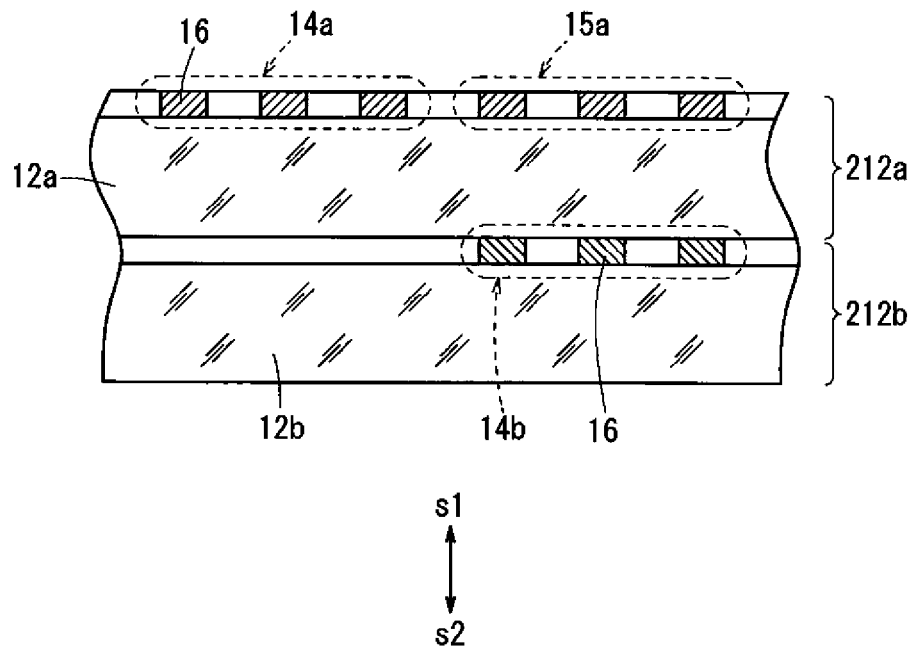
FIG. 42 is a cross-sectional view of a conductive sheet according to a third modification in which a part of the conductive sheet is omitted.

As shown in FIG. 42, the conductive sheet 210 is formed by laminating the second sheet member 212b and the first sheet member 212a in order from the lower side. The first sheet member 212a includes a first conductive portion 14a and a first dummy electrode portion 15a that are formed on one main surface (arrow s1 direction side) of a first transparent base 12a. The second sheet member 212b includes a second conductive portion 14b formed on one main surface (arrow s1 direction side) of a second transparent base 12b. That is, it can be said that the first conductive portion 14a and the like are formed on one main surface (arrow s1 direction side) of the first transparent base 12a and the second conductive portion 14b and the like are formed on the other main surface (arrow s2 direction side) of the first transparent base 12a.

Even if the conductive sheet 210 is formed in this manner, the same effects as in the present embodiment are obtained. In addition, another layer may be interposed between the first and second sheet members 212a and 212b. Further, as long as the first and second conductive portions 14a and 14b are insulated from each other or the first dummy electrode portion 15a and the second conductive portion 14b are insulated from each other, they may be disposed so as to face each other.

[Fourth Modification]

A dummy electrode portion (first and second dummy electrode portions 15a and 15b) may be provided not only on one surface of the conductive sheet 220 but also on both surfaces thereof.

Figure 43:
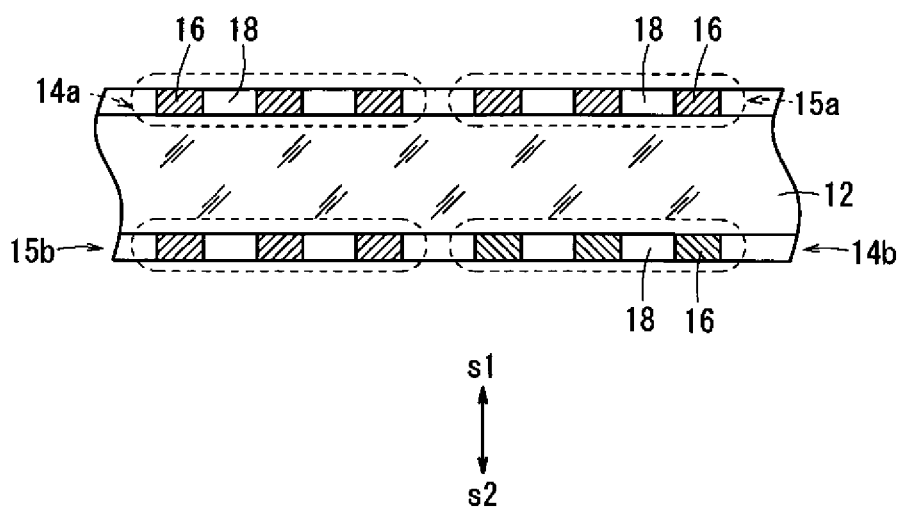
FIG. 43 is a cross-sectional view of a conductive sheet according to a fourth modification in which a part of the conductive sheet is omitted.

As shown in FIG. 43, not only the second conductive portion 14b but also the second dummy electrode portion 15b is formed on the other main surface (arrow s2 direction side) of the transparent base 12. Here, the second dummy electrode portion 15b is disposed so as to be spaced apart from the second conductive portion 14b by a predetermined distance. That is, the second dummy electrode portion 15b is in a state where it is electrically insulated from the second conductive portion 14b.

Thus, by providing a dummy electrode portion on both surfaces of the transparent base 12, the effects of the present invention can be obtained in either case of arranging the conductive sheet 220 frontward and backward when mounting the conductive sheet 220 into the display device 40 (refer to FIG. 4). On the contrary, in terms of production cost, it is also possible to adopt a configuration in which no dummy electrode portion is provided on either surface of the transparent base 12.

[Fifth Modification]

The conductive sheet 230 may have an anisotropic mesh pattern 232.

Figure 44:
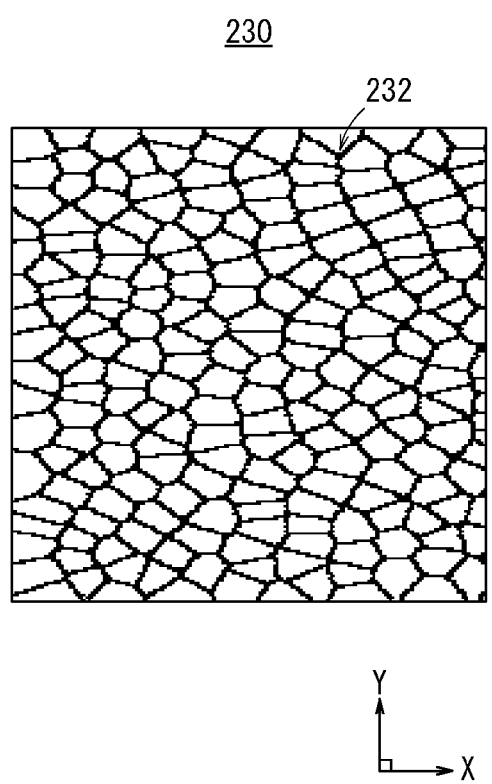
FIG. 44 is a partially enlarged plan view of a conductive sheet according to a fifth modification.

FIG. 44 is a partially enlarged plan view of the conductive sheet 230 having the mesh pattern 232, the shape of the conductive sheet 230 being optimized under the conditions in which the black matrices 34 are superimposed (refer to FIG. 3).

As is understood from FIGS. 10A and 44, the design of the mesh pattern 232 (each opening 18) is a horizontally long shape in general, compared with the design of the mesh pattern 20. The reason thereof is estimated as follows.

When the red subpixel 32r, the green subpixel 32g, and the blue subpixel 32b are disposed in the arrow X direction as shown in FIG. 3, one pixel 32 is divided into respective ⅓ regions. Accordingly, the noise granularity of the high spatial frequency component increases. On the other hand, in the arrow Y direction, only a spatial frequency component equivalent to the arrangement period of the black matrix 34 is present, and there are no other spatial frequency components. Accordingly, the design of the mesh pattern 232 is determined so as to reduce the visibility of the arrangement period. That is, wiring lines extending in the arrow Y direction are made such that the distance between the wiring lines is as narrow as possible and the wiring lines are regularly disposed between the black matrices 34.

As described above, it is possible to optimize the mesh pattern 232 in consideration of the design of the structure pattern including the black matrix 34. That is, the granular feeling of noise is reduced at the time of observation in the actual use mode, and the visibility of an object for observation is greatly improved. This is particularly effective when the actual use mode of the conductive sheet 230 is known.

Next, explanation will be given focusing on a production method using a silver halide photosensitive material, which is particularly a preferable mode in the conductive sheets 10 and 11 according to the present embodiment.

The method for producing the conductive sheets 10 and 11 according to the present embodiment includes the following three modes depending on the form of a photosensitive material and development processing.

(1) Mode in which a black-and-white photosensitive silver halide photosensitive material not containing physical development nuclei is chemically developed or thermally developed to form a metal silver portion on the photosensitive material.

(2) Mode in which a black-and-white photosensitive silver halide photosensitive material containing physical development nuclei in a silver halide emulsion layer is dissolved and physically developed to form a metal silver portion on the photosensitive material.

(3) Mode in which a black-and-white photosensitive silver halide photosensitive material not containing physical development nuclei and an image receiving sheet having a non-photosensitive layer containing physical development nuclei are made to overlap each other and diffusion transfer development is performed to form a metal silver portion on the non-photosensitive image receiving sheet.

The mode of (1) is an integrated black-and-white development type, and a translucent conductive film is formed on the photosensitive material. Developed silver obtained is chemically developed silver or thermally developed silver, and its activity is high in the subsequent plating or physical development processing in that it is a filament of high specific surface.

In the mode of (2), in an exposed portion, silver halide particles near the physical development nuclei are dissolved and deposited on the development nuclei, and accordingly, a translucent conductive film, such as a light-transmissive conductive film, is formed on the photosensitive material. This is also an integrated black-and-white development type. Since the developing action is a deposition on the physical development nuclei, developed silver is highly active, but has a spherical shape of low specific surface.

In the mode of (3), silver halide particles in an unexposed portion are dissolved and diffused to be deposited on the development nuclei on the image receiving sheet, and accordingly, a translucent conductive film, such as a light-transmissive conductive film, is formed on the image receiving sheet. This is a so-called a separate type, and the image receiving sheet is used by being peeled from the photosensitive material.

In any of the modes, it is possible to select any development processing of the negative type development processing and the reversal development processing (in the case of a diffusion transfer method, the negative type development processing becomes possible by using an auto-positive type photosensitive material as the photosensitive material).

Chemical development, thermal development, dissolution physical development, and diffusion transfer development referred to herein are typically the terms that are used in the art, and are explained in general textbooks of photographic chemistry, for example, "Photochemistry" written by Shin-ichi Kikuchi (Kyoritsu Publishing Co., published in 1955) and "The Theory of Photographic Processes, 4th ed." written by C. E. K. Mees (Mcmillan, Inc. published in 1977). This case is an invention related to liquid processing, but as other development methods, techniques for applying the thermal development method can also be referred to. For example, it is possible to apply the techniques disclosed in JP 2004-184693 A, JP 2004-334077 A, and JP 2005-010752 A and the techniques disclosed in the specifications of Japanese Patent Application Nos. 2004-244080 and 2004-085655.

Here, the configuration of each layer of the conductive sheets 10 and 11 according to the present embodiment will be described in detail below.

[Transparent Base 12]

As the transparent base 12, a plastic film, a plastic plate, a glass plate, and the like can be mentioned.

As materials of the plastic film and the plastic plate described above, it is possible to use polyesters including polyethylene terephthalate (PET) and polyethylene naphthalate (PEN), polymethylmethacrylate (PMMA), polypropylene (PP), polystyrene (PS), and triacetyl cellulose (TAC), for example.

As the transparent base 12, a plastic film or a plastic plate having a melting point of about 290° C. or lower is preferable. In particular, in terms of optical transparency, workability, or the like, PET is preferable.

[Silver Salt Emulsion Layer]

A silver salt emulsion layer serving as the thin metal wire 16 of each of the first and second laminate portions 28a and 28b contains not only silver salt and binder but also additives such as solvent or dye.

<1. Silver Salt>

As silver salts used in the present embodiment, inorganic silver salts such as silver halides and organic silver salts such as silver acetate can be mentioned. In the present embodiment, it is preferable to use silver halides which are excellent in characteristics as an optical sensor.

The coating amount of silver (coating amount of silver salt) in the silver salt emulsion layer is preferably 1 $g/m^2$ to 30 $g/m^2$, more preferably 1 $g/m^2$ to 25 $g/m^2$, and still more preferably 5 $g/m^2$ to 20 $g/m^2$, in terms of silver. By setting the coating amount of silver to fall within the above range, it is possible to cause the conductive sheets 10 and 11 to have a desired surface resistance.

<2. Binder>

As binders used in the present embodiment, for example, gelatin, polyvinyl alcohol (PVA), polyvinyl pyrrolidone (PVP), polysaccharides such as starch, cellulose and its derivatives, polyethylene oxide, polyvinyl amine, chitosan, polylysine, polyacrylic acid, polyalginic acid, poly hyaluronic acid, carboxymethyl cellulose, and the like can be mentioned. These have neutral, anionic, and cationic properties depending on the ionicity of the functional group.

The content of the binder contained in the silver salt emulsion layer of the present embodiment is not limited in particular, and can be appropriately determined in a range where dispersibility and adhesiveness can be exhibited. As the content of the binder in the silver salt emulsion layer, 1/4 or more is preferable, and 1/2 or more is more preferable, in terms of silver/binder volume ratio. The silver/binder volume ratio is preferably 100/1 or less, and 50/1 or less is more preferable. The silver/binder volume ratio of 1/1 to 4/1 is still more preferable. Most preferably, the silver/binder volume ratio is 1/1 to 3/1. By setting the silver/binder volume ratio in the silver salt emulsion layer to fall within the above range, it is possible to suppress a variation in the resistance value even if the coating amount of silver is adjusted. Therefore, it is possible to obtain the conductive sheet 10 having a uniform surface resistance. The silver/binder volume ratio can be calculated by converting the silver salt amount/binder amount of materials (ratio by weight) into the silver amount/binder amount (ratio by weight) and then converting the silver amount/binder amount (ratio by weight) into the silver amount/binder amount (volume ratio).

<3. Solvent>

The solvent used to prepare the silver salt emulsion layer is not particularly limited. For example, water, organic solvents (for example, alcohols such as methanol, ketones such as acetone, amides such as formamide, sulfoxides such as dimethyl sulfoxide, esters such as ethyl acetate, and ethers), ionic liquids, and mixture solvents of these can be mentioned.

<4. Other Additives>

As various additives used in the present embodiment, known additives can be preferably used without being particularly limited.

[First and Second Protective Layers 26a and 26b]

As the first and second protective layers 26a and 26b, similarly to the transparent base 12, a plastic film, a plastic plate, a glass plate, and the like can be mentioned. As materials of the plastic film and the plastic plate described above, for example, it is possible to use PET, PEN, PMMA, PP, PS, TAC, and the like.

The thickness of each of the first and second protective layers 26a and 26b is not particularly limited, and can be appropriately selected depending on the purpose. For example, 5 µm to 100 µm is preferable, 8 µm to 50 µm is more preferable, and 10 µm to 30 µm is particularly preferable.

Next, each of the steps of the method for producing the conductive sheets 10 and 11 will be described.

[Exposure]

In the present embodiment, the case is included in which the first conductive portion 14a, the second conductive portion 14b, the first dummy electrode portion 15a, and the like are formed using a printing method. However, except for the printing method, the first conductive portion 14a, the second conductive portion 14b, the first dummy electrode portion 15a, and the like are formed by exposure, development, and the like. That is, exposure is performed on a photosensitive material having a silver salt-containing layer provided on the transparent base 12 or performed on a photosensitive material coated with photopolymer for photolithography. Exposure can be performed using electromagnetic waves. As electromagnetic waves, for example, lights such as visible light and ultraviolet light and radiations such as X-ray can be mentioned. For exposure, a light source having a wavelength distribution may be used, or a light source of a specific wavelength may be used.

[Development Processing]

In the present embodiment, development processing is further performed after exposing the emulsion layer. The development processing can be performed using the technique of normal development processing used for silver halide photographic films, photographic papers, films for printing plate, emulsion masks for photomask, and the like.

The development processing in the present invention can include fixing processing that is performed for the purpose of stabilization by removing the silver salt of an unexposed portion. The fixing processing in the present invention can be performed using the technique of fixing processing used for silver halide photographic films, photographic papers, films for printing plate, emulsion masks for photomask, and the like.

It is preferable to perform washing processing or stabilization processing on the photosensitive material subjected to the development processing and the fixing processing.

The mass of a metal silver portion included in the exposed portion after the development processing is preferably a content of 50% by mass or more of the mass of silver contained in the exposed portion before exposure, and 80% by mass or more is more preferable. If the mass of silver contained in the exposed portion is equal to or greater than 50% by mass of the mass of silver contained in the exposed portion before exposure, high conductivity can be obtained and thus it is preferable.

Through the above steps, the conductive sheets 10 and 11 are obtained. Calendering processing may be further performed on the conductive sheets 10 and 11 after the development processing, and by calendering processing, the surface resistance of the conductive sheets 10 and 11 can be adjusted to obtain a desired surface resistance. It is preferable that the surface resistance of the obtained conductive sheets 10 and 11 be in a range of 0.1 Ω/sq. to 300 Ω/sq.

The surface resistance set depends on the application of the conductive sheets 10 and 11. For example, in the case of touch panel applications, 1 Ω/sq. to 70 Ω/sq. is preferable, 5 Ω/sq. to 50 Ω/sq. is more preferable, and 5 Ω/sq. to 30 Ω/sq. is still more preferable. In the case of electromagnetic wave shielding applications, 10 Ω/sq. or less is preferable, and 0.1 Ω/sq. to 3 Ω/sq. is more preferable.

[Physical Development and Plating Processing]

In the present embodiment, in order to improve the conductivity of the metal silver portion formed by the exposure and development processing described above, physical development and/or plating processing for causing the metal silver portion to carry conductive metal particles may be performed. In the present invention, conductive metal particles may be carried on the metal silver portion by either physical development or plating processing, or conductive metal particles may be carried on the metal silver portion by combination of physical development and plating processing. A metal silver portion after being subjected to physical development and/or plating processing is referred to as a "conductive metal portion".

The "physical development" in the present embodiment refers to depositing metal particles on nuclei of metal or metal compound by reducing metal ions, such as silver ions, with a reducing agent. This physical development is used for an instant B&W film, an instant slide film, printing plate production, and the like, and in the present invention, it is possible to use the technique. The physical development may be performed simultaneously with development processing after exposure, or may be separately performed after development processing.

In the present embodiment, as the plating processing, it is possible to use an electroless plating (chemical reduction plating or displacement plating), an electroplating, or both the electroless plating and electroplating. As electroless plating in the present embodiment, it is possible to use known electroless plating techniques. For example, it is possible to use an electroless plating technique used for a printed wiring board and the like. The electroless plating is preferably an electroless copper plating.

In the method for producing the conductive sheets 10 and 11 according to the present embodiment, steps, such as plating and the like, do not necessarily need to be performed. This is because a desired surface resistance can be obtained by adjusting the coating amount of silver in the silver salt emulsion layer and the silver/binder volume ratio in the present production method.

[Oxidation Processing]

In the present embodiment, it is preferable to perform oxidation processing on the metal silver portion after the development processing and the conductive metal portion formed by physical development and/or plating processing. By performing oxidation processing, for example, when metal is slightly deposited on a light-transmissive portion, it is possible to remove the metal so that the transmittance of the light-transmissive portion becomes approximately 100%.

[Film Hardening Processing after Development Processing]

After performing development processing on the silver salt emulsion layer, it is preferable to perform hardening processing by immersing the resultant in the hardening agent. As the hardening agent, for example, glutaraldehyde, adipaldehyde, dialdehydes such as 2,3-dihydroxy-1,4-dioxane, and boric acid disclosed in JP 2-141279 A can be mentioned.

A functional layer, such as an antireflection layer or a hard coat layer, may be given to the conductive sheets 10 and 11 according to the present embodiment.

[Calendering Processing]

The metal silver portion after the development processing may be smoothed by performing calendering processing. By the calendering processing, the conductivity of the metal silver portion is noticeably increased. The calendering processing can be performed using a calender roll. Usually, the calender roll includes a pair of rolls.

As rolls for the calendering processing, metal rolls or plastic rolls made of resin such as epoxy, polyimide, polyamide, and polyimidoamide, are used. In particular, when an emulsion layer is provided on both surfaces, it is preferable to perform calendaring processing using a pair of metal rolls. When an emulsion layer is provided on one surface, a combination of a metal roll and a plastic roll may be used in terms of anti-wrinkling. The lower limit of linear pressure is equal to or greater than 1960 N/cm (200 kgf/cm; when converted into surface pressure, 699.4 kgf/cm$^2$), and more preferably equal to or greater than 2940 N/cm (300 kgf/cm; when converted into surface pressure, 935.8 kgf/cm$^2$). The upper limit of linear pressure is equal to or less than 6880 N/cm (700 kgf/cm).

Preferably, the application temperature of smoothing processing represented by the calender roll is 10° C. (no temperature control) to 100° C. The more preferable temperature is in a range of 10° C. (no temperature control) to 50° C. although it changes depending on the wiring density or shape of the metal mesh pattern or the metal wiring pattern and the binder type.

[Lamination Processing]

In order to protect the first and second sensor portions 60a and 60b, a protective layer may be formed on the silver salt emulsion layer. Adjustment of adhesiveness can be freely performed by providing the first adhesive layer 24a (or the second adhesive layer 24b) between the protective layer and the silver salt emulsion layer.

As materials of the first and second adhesive layers 24a and 24b, wet laminate adhesives, dry laminate adhesives, or hot melt adhesives can be mentioned. In particular, dry laminate adhesives, by which many kinds of materials can be bonded and which have high bonding speed, are preferable. Specifically, amino resin adhesives, phenolic resin adhesives, chloroprene rubber adhesives, nitrile rubber adhesives, epoxy adhesives, urethane adhesives, reaction type acrylic adhesives, and the like can be used as dry laminate adhesives. Among these adhesives, it is preferable to use OCA (Optical Clear Adhesive; registered trademark) manufactured by Sumitomo 3M Limited, which is an acrylic adhesive having a low acid value.

As drying conditions, a temperature environment of 30° C. to 150° C. and 1 minute to 30 minutes are preferable. A drying temperature of 50° C. to 120° C. is particularly preferable.

Instead of providing the adhesive layer described above, the interlayer adhesive force can be adjusted by performing surface treatment on at least one of the transparent base 12 and the protective layer. In order to increase the adhesive force with respect to the silver salt emulsion layer described above, for example, corona discharge treatment, flame treatment, ultraviolet irradiation treatment, high-frequency radiation treatment, glow discharge irradiation treatment, active plasma irradiation treatment, laser beam irradiation treatment, and the like may be performed.

The present invention can be used by being appropriately combined with the techniques disclosed in Japanese Unexamined Patent Application Publications and International Publication Pamphlets respectively listed in the following Tables 1 and 2. Notations of "JP", "A", "Pamphlet", and the like are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2005-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

Hereinafter, the present invention will be described more specifically by way of examples of the present invention. In the present invention, materials, amounts, ratios, processings, processing procedures, and the like shown in the following examples can be appropriately modified without departing from the gist of the present invention. Therefore, the scope of the present invention should not be construed as being limited by the examples shown below.

The surface resistivity, visibility (granular feeling of noise), and brightness change rate in the display device 40 including the conductive sheet 11 of examples 1 to 13, comparative examples 1 to 3, and reference examples 1 to 4 were evaluated.

Examples 1 to 13, Comparative Examples 1 to 3, and Reference Examples 1 to 4

(Silver Halide Photosensitive Material)

An emulsion containing iodobromochloride silver particles (I=0.2 mol %, Br=40 mol %) having an average sphere-equivalent diameter of 0.1 μm was prepared. The emulsion contained gelatin of 10.0 g with respect to Ag of 150 g in an aqueous medium.

$K_3Rh_2Br_9$ and $K_2IrCl_6$ were added to the emulsion so that the concentration became $10^{-7}$ (mol/mol Ag) to dope silver bromide particles with Rh ions and Ir ions. $Na_2PdCl_4$ was added to the emulsion and further, the emulsion was subjected to gold-sulfur sensitization using chloroauric acid and sodium thiosulfate. Then, together with a gelatin hardening agent, the emulsion was coated on a transparent base (here, polyethylene terephthalate (PET) having a refractive index of n0=1.64) so that the coating amount of silver became 10 g/m$^2$. In this case, the Ag/gelatin volume ratio was set to 2/1.

The emulsion was coated on the PET support having a width of 300 mm so as to have a coating width of 250 mm for 20 m, and each of both ends of the support was cut by 30 mm each so that 240 mm of the central portion of the coating width was left, thereby a roll-shaped silver halide photosensitive material was obtained.

(Generation of an Exposure Pattern)

Using the SA method (refer to FIG. 27 and the like) described in the present embodiment, the output image data ImgOut representing the mesh pattern 20 (refer to FIG. 2A) which was filled with the polygonal mesh shapes 22 without space, was generated.

As the preparation conditions of the mesh pattern 20, the total transmittance, the thickness of the transparent base 12, the width of the thin metal wire 16, and the thickness of the thin metal wire 16 were set to 93%, 20 μm, 20 μm, and 10 μm, respectively. The size of the unit region 90 in both the horizontal and vertical directions was 5 mm, and the image resolution thereof was 3500 dot per inch (dpi). The initial position of the seed point SD was randomly determined using the Mersenne twister, and each mesh shape 22 of the polygonal shape was determined according to the Voronoi diagram. By regularly arranging the unit image data ImgE using the method shown in FIGS. 30 and 31, the output image data ImgOut having a repeated shape was formed. It was confirmed later that the desired conductive sheet 11 was produced by the output image data ImgOut.

Then, as shown in FIGS. 34A and 34B, a first exposure pattern including a region excluding the first region R1 and a second exposure pattern including the second region R2 were prepared by cutting out the wiring shape in the planar region 100.

For comparison, exposure patterns representing the patterns PT1 to PT3 (refer to FIGS. 46A to 46C) according to the conventional examples were also generated. These are referred to as comparative examples 1 to 3.

Meanwhile, by changing the value of the coefficient αj (j=1 and 2) variously for the evaluation value EVP shown in Expression (5), nine types of mesh patterns 20 having different regularities (randomness) of the arrangement of the mesh shapes 22 were obtained. Hereinafter, these are set as reference example 3, example 7, example 8, example 9, example 10, example 11, example 12, example 13, and reference example 4 in order of high regularity (in order of low randomness). With respect to the examples 1 to 6 and the reference examples 1 and 2 to be described later, the mesh pattern 20 having the same shape as in the example 10 was used.

(Exposure)

Exposure was performed on both surfaces of the transparent base 12 of A4 size (210 mm×297 mm). The exposure was performed using parallel light from a high-pressure mercury lamp as a light source through the photomasks of the first exposure pattern (corresponding to the first conductive portion 14a side) and the second exposure pattern (corresponding to the second conductive portion 14b side) described above.

(Development Processing)

Formulation of Developer 1L:
hydroquinone 20 g
sodium sulfite 50 g
potassium carbonate 40 g
ethylenediaminetetraacetic acid 2 g
potassium bromide 3 g
polyethylene glycol 2000 1 g
potassium hydroxide 4 g
adjusted to pH 10.3
Formulation of Fixer 1L:
ammonium thiosulfate liquid (75%) 300 ml
Ammonium sulfite monohydrate 25 g
1,3-diaminopropane tetraacetic acid 8 g
acetic acid 5 g
aqueous ammonia (27%) 1 g
adjusted to pH 6.2

Using the processing agent described above, the exposed photosensitive material was processed under the processing conditions (development: 35° C., 30 seconds, fixation: 34° C., 23 seconds, and washing water flow: 5 L/minute, 20 seconds) using an automatic developing machine FG-710PTS manufactured by Fuji Photo Film Co., Ltd.

(Lamination Processing)

The first and second protective layers 26a and 26b formed of the same material were each bonded to the two sides of the developed photosensitive materials, respectively. As will be described later, a protective film having a different refractive index n1 was used for each sample of the conductive sheet 10. In addition, a commercially available adhesive tape (NSS50-1310; New Tac Kasei Co. Ltd., 50 μm in thickness) was used as the first adhesive layer 24a and the second protective layer 26b (refer to FIG. 2B). After bonding the first and second protective layers 26a and 26b, autoclaving of 20-minute heating under the environment of 0.5 atmospheric pressure and 40° C. was performed in order to prevent the generation of bubbles.

For the convenience of evaluation, the first protective layer 26a obtained by cutting out a part of the sheet was used. That is, a difference between a case where the first protective layer 26a was formed (refractive index n1) and a case where the first protective layer 26a was not formed (air layer of the refractive index 1.00) could be seen at once. Hereinafter, a display portion corresponding to the cutout portion of the first protective layer 26a is referred to as a region "with no protective layer", and the remaining display portion is referred to as a region "with a protective layer".

Example 1

The conductive sheet 11 according to the example 1 was prepared using polychlorotrifluoroethylene (PCTTE) having a refractive index of n1=1.42 as the first protective layer 26a. In this case, the relative refractive index nr1 is nr1=(1.42/1.64)=0.86.

Example 2, Examples 7 to 13, Comparative Examples 1 to 3, and Reference Examples 3 and 4

The conductive sheet 11 according to the example 2 was prepared using polymethylmethacrylate (PMMA) having a refractive index of n1=1.50 as the first protective layer 26a. In this case, the relative refractive index nr1 is nr1=(1.50/1.64)=0.91.

With respect to the comparative example 1 corresponding to the pattern PT1 (refer to FIG. 46A), the comparative example 2 corresponding to the pattern PT2 (refer to FIG. 46B), the comparative example 3 corresponding to the pattern PT3 (refer to FIG. 46C), the examples 7 to 13 corresponding to the mesh pattern 20 (refer to FIG. 2A), and the reference examples 3 and 4, each sample coated with polymethylmethacrylate was prepared.

Example 3

The conductive sheet 11 according to the example 3 was prepared using polystyrene (PS) having a refractive index of n1=1.60 as the first protective layer 26a. In this case, the relative refractive index nr1 is nr1=(1.60/1.64)=0.97.

Example 4

The conductive sheet 11 according to the example 4 was prepared using polythiourethane (PTU) having a refractive index of n1=1.70 as the first protective layer 26a. In this case, the relative refractive index nr1 is nr1=(1.70/1.64)= 1.03.

Example 5

The conductive sheet 11 according to the example 5 was prepared using high refractive index glass having a refractive index of n1=1.78 as the first protective layer 26a. In this case, the relative refractive index nr1 is nr1=(1.78/1.64)= 1.08.

Example 6

The conductive sheet 11 according to the example 6 was prepared using ultra-high refractive index glass having a refractive index of n1=1.90 as the first protective layer 26a. In this case, the relative refractive index nr1 is nr1=(1.90/1.64)=1.15.

Reference Example 1

The conductive sheet 11 according to the reference example 1 was prepared using tetrafluoroethylene (FEP) having a refractive index of n1=1.34 as a first protective layer. In this case, the relative refractive index nr1 is nr1=(1.34/1.64)=0.81.

Reference Example 2

The conductive sheet 11 according to the reference example 2 was prepared using ultra-high refractive index glass having a refractive index of n1=1.98 as a first protective layer. In this case, the relative refractive index nr1 is nr1=(1.98/1.64)=1.20.

[Evaluation]

Each sample according to the examples 1 to 13, the comparative examples 1 to 3, and the reference examples 1 and 2 was bonded onto the display screen of the display unit 30. As the display unit 30, a commercially available color liquid crystal display (11.6-inch screen size, 1366×768 dots, and 192-μm pixel pitch in both the horizontal and vertical directions) was used.

(Surface Resistance Measurement)

In order to evaluate the uniformity of the surface resistivity, the surface resistivity of each sample of the example 2 and the comparative examples 1 to 3 was measured at 10 arbitrary locations using the Loresta GP (model number MCP-T610) series 4-point probe (ASP) manufactured by Dia Instruments Co., and the average value was taken.

(Granular Feeling of Noise)

Under the conditions in which white color (maximum brightness) was displayed by controlling the display of the display unit 30, three researchers performed sensory evaluation of the granular feeling of noise (feeling of roughness). This evaluation was digitized taking into consideration a feeling of noise of the brightness due to the mesh shape 22 and a feeling of noise of the color due to the structure of the subpixels comprehensively. The viewing distance from the display screen was set to 300 mm, and the indoor illuminance was set to 300 lx.

In this sensory evaluation, comparative observation with respect to the visual recognition result in the region "with no protective layer" (display region where the first protective layer 26a was not formed) was performed. Specifically, 5 points were scored when the granular feeling of noise in the region "with a protective layer" was improved significantly compared with that in the region "with no protective layer", 4 points were scored when it was improved, 3 points were scored when there was no change, 2 points were scored when it became worse, and 1 point was scored when it became worse significantly. The average value of the point scores given by the researchers was regarded as the evaluation value of the granular feeling of noise.

(Brightness Change Rate)

Under the conditions in which white color (maximum brightness) was displayed by controlling the display of the display unit 30, the brightness on the display screen was measured. LS-100 (manufactured by Konica Minolta, Inc.) was used as the luminance meter. The measurement distance from the display screen was set to 300 mm, the measurement angle was set to 2°, and the indoor illuminance was set to 1 lx or lower.

Assuming that the brightness in the region "with no protective layer" was La [$cd/m^2$] and the brightness in the region "with a protective layer" was Lb [$cd/m^2$], the brightness change rate (unit: %) was calculated as 100×(Lb−La)/La. In addition, in consideration of the in-plane uniformity, a measurement position within the region "with a protective layer" was set near the boundary of the region "with no protective layer".

(Relationship Between Irregularity and Visibility)

Sensory evaluation was performed in order to examine the relationship between the irregularity and the visibility of the mesh pattern 20 which was filled with the polygonal mesh shapes 22 without space. Specifically, individual evaluations of moire, feeling of roughness and color noise and an overall evaluation were performed in three grades for the samples according to the examples 7 to 13 and the reference examples 3 and 4.

The case where moire was not noticeable was evaluated to be "A", the case where moire was viewed but caused no problems was evaluated to be "B", and the case where moire was noticeable was evaluated to be "C". The average of evaluations by the researchers was set as the moire evaluation result.

The case where the feeling of roughness was not noticeable was evaluated to be "A", the case where the feeling of roughness was viewed but caused no problems was evaluated to be "B", and the case where the feeling of roughness was noticeable was evaluated to be "C". The average of evaluations by the researchers was set as the feeling of roughness evaluation result.

The case where color noise was not noticeable was evaluated to be "A", the case where color noise was viewed but caused no problems was evaluated to be "B", and the case where color noise was noticeable was evaluated to be "C". The average of evaluations by the researchers was set as the color noise evaluation result.

The case where the visibility of the display screen was good was evaluated to be "A", the case where any uncomfortable feeling was sensed but the level of the visibility was sufficient was evaluated to be "B", and the case where the visibility was poor was evaluated to be "C". The average of evaluations by the researchers was set as the visibility evaluation result.

[Results]

(Surface Resistance Measurement)

In the example 2 and the comparative examples 1 to 3, the surface resistivity was at a level that could be sufficiently put to practical use as a transparent electrode, and translucency was also good. In particular, a variation in the surface resistivity was the smallest in the example 2 (conductive sheet 11 according to the present invention).

(Granular Feeling of Noise)

[1] Regarding the visibility between the patterns, good evaluations were obtained in order of the samples of the example 2, the comparative example 3, the comparative example 1, and the comparative example 2. This order is same as the order of the smallest area to the larger areas formed by the peak of the power spectrum shown in FIG. 12. In particular, it was confirmed that the granular feeling of noise in the example 2 (conductive sheet 11 according to the present invention) was not even noticeable.

Figure 45:
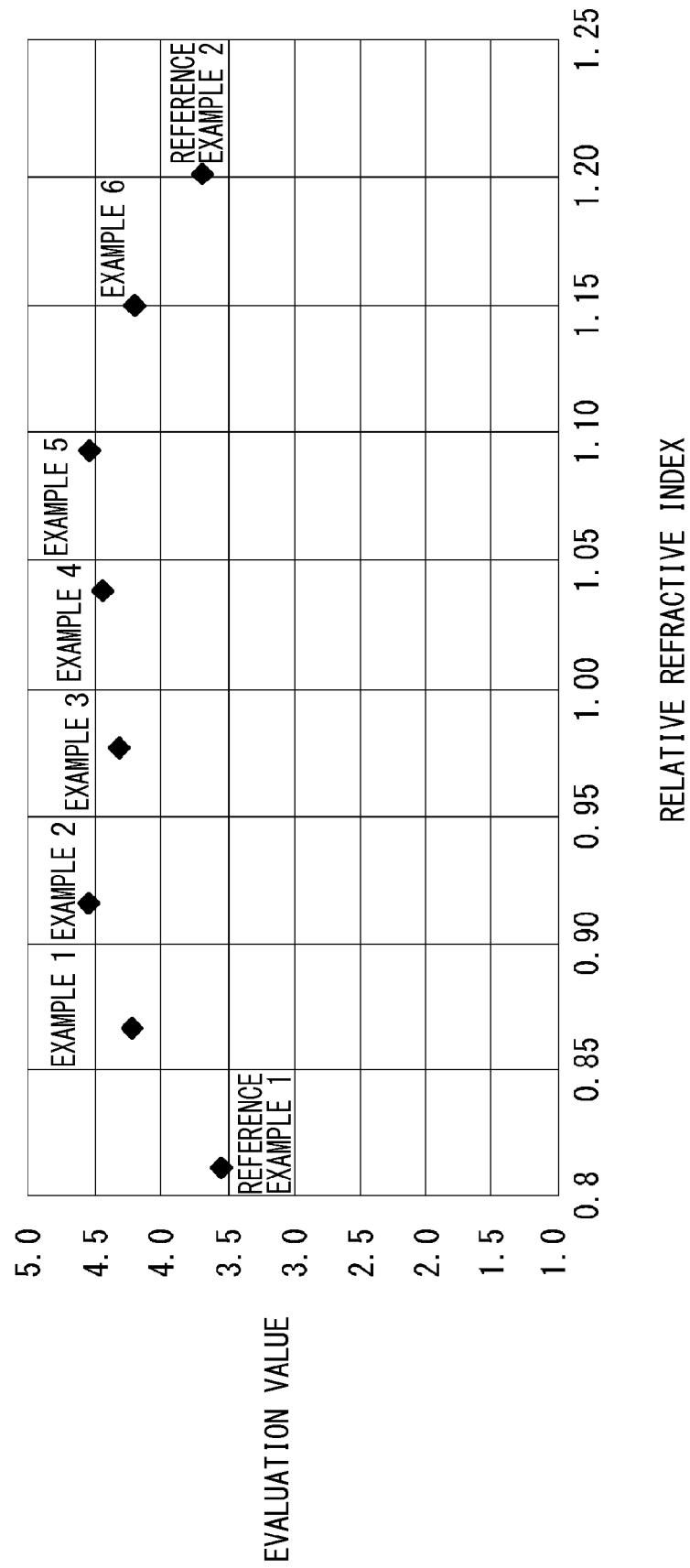
FIG. 45 is an explanatory diagram showing a result of sensory evaluation according to the present embodiment.

[2] As shown in FIG. 45, in the examples 1 to 6 and the reference examples 1 and 2, the evaluation values exceeded 3, and the reduction effect of the granular feeling of noise was obtained by eliminating the air layer. Among them, in the examples 1 to 6, the evaluation values exceeded 4, and the noticeable effect was observed compared with the reference examples 1 and 2. That is, a conclusion that the granular feeling of noise could be suppressed when the relative refractive index nr1 satisfied the relationship of $0.86 \leq nr1 \leq 1.15$ was obtained.

(Brightness Change Rate)

As shown in Table 3, in the examples 1 to 6 and the reference examples 1 and 2, the brightness change rate was a positive value, and the brightness on the display screen was improved by eliminating the air layer (air gap).

TABLE 3

|  | Brightness change rate (%) |
| --- | --- |
| Reference example 1 | 15.1 |
| Example 1 | 18.9 |
| Example 2 | 21.7 |
| Example 3 | 21.9 |
| Example 4 | 21.2 |
| Example 5 | 20.0 |
| Example 6 | 16.5 |
| Reference example 2 | 14.1 |

Among them, in the examples 2 to 5, the brightness change rate exceeded 20%, and the difference of the degree that can be identified with the naked eye was observed compared with the examples 1 and 6 and the like. That is, a conclusion that the display brightness could be improved when the relative refractive index nr1 satisfied the relationship of $0.91 \leq nr1 \leq 1.08$ was obtained.

[Supplementary Explanation]

Other than the examples described above, as a result of the same evaluation performed by variously changing the preparation conditions of the conductive sheet 11, the following findings were obtained.

(1) The material of the transparent base 12 was not limited to PET, and the same experimental result was obtained regardless of the material in a range satisfying the relationship of the relative refractive indices nr1 and nr2 described above. In addition, even if the second protective layer 26b was formed of a different material from the first protective layer 26a, the experimental result was the same in the range satisfying the relationship described above.

(2) The effect of reducing the granular feeling of noise was obtained by setting one of the relative refractive indices nr1 and nr2 to 0.86 or higher and 1.15 or lower. In addition, the noticeable reduction effect was obtained by setting both the relative refractive indices nr1 and nr2 to 0.86 or higher and 1.15 or lower.

(3) The effect in which the amount of light emitted to the outside through a display screen, that is, the display brightness was improved was obtained by setting one of the relative refractive indices nr1 and nr2 to 0.91 or higher and 1.08 or lower. In addition, the noticeable improvement effect was obtained by setting both the relative refractive indices nr1 and nr2 to 0.91 or higher and 1.08 or lower.

(4) Even if the conductive sheet 11 was disposed in a state where the top and bottom surfaces were reversed, approximately the same evaluation result as described above was obtained.

(Relationship Between Irregularity and Visibility)

In the following Table 4, results of individual evaluations of moire, feeling of roughness, and color noise and an overall evaluation for the samples according to the examples 7 to 13 and the reference examples 3 and 4 are shown.

TABLE 4

|  | Second evaluation value EV2 [μm] | Moire | Feeling of roughness | Color noise | Overall evaluation |
| --- | --- | --- | --- | --- | --- |
| Reference example 3 | 11 | C | A | B | C |
| Example 7 | 15 | B | A | B | B |
| Example 8 | 20 | B | A | B | B |
| Example 9 | 26 | A | A | A | A |
| Example 10 | 31 | A | A | A | A |
| Example 11 | 36 | A | A | A | A |
| Example 12 | 48 | A | B | A | B |
| Example 13 | 65 | A | B | A | B |
| Reference example 4 | 80 | A | C | A | C |

Regarding moire, the evaluation an the reference example 3 was C, and it revealed that moire was noticeable. In addition, the evaluations in the examples 7 and 8 were B, and moire was recognized but was at a level causing no problems. Further, the evaluations in the examples 9 to 13 and the reference example 4 were A, and no moire was generated.

Regarding the feeling of roughness, the evaluation in the reference example 4 was C, and it revealed that the feeling of roughness was noticeable. In addition, the evaluations in the examples 12 and 13 were B, and the feeling of roughness was recognized but was at a level causing no problems. Further, the evaluations in the reference example 3 and the examples 7 to 11 were A, and the feeling of roughness was not caused.

Regarding color noise, the evaluations in the reference example 3 and the examples 7 and 8 were B, and color noise was recognized but was at a level causing no problems. In addition, the evaluations in the examples 9 to 13 and the reference example 4 were A, and no color noise was generated.

Regarding the overall evaluation, the evaluations in the reference examples 3 and 4 were C, and the visibility of the display screen was poor. In addition, the evaluations in the examples 7, 8, 12, and 13 were B, and any uncomfortable feeling was sensed but the level of the visibility was sufficient. Further, the evaluations in the examples 9 to 11 were A, and the visibility of the display screen was good.

Thus, it was confirmed that, for the centroid position distribution C of each opening 18 (or each mesh shape 22) of the mesh pattern 20, by setting the root mean square deviation of the centroid positions Pc1 to Pc9, which were disposed along the reference axis 430 (X' axis), with respect to the crossing axis 432 (Y' axis) to 15 μm or more and 65 μm or less, the generation of moire, feeling of roughness, and color noise could be suppressed.

It is needless to say that this invention is not limited to the embodiments described above and can be freely modified without departing from the gist of this invention.

For example, a program for producing a conductive sheet that causes a computer to operate in accordance with each function of the apparatus for producing the conductive sheet described in each embodiment of the present invention and a program for producing a conductive sheet that causes a computer to execute each step of the above-described method for producing the conductive sheet as a procedure are other embodiments of the present invention. Further, a computer-readable storage medium on which such a program is recorded is also one embodiment of the present invention.

What is claimed is:

1. A conductive sheet, comprising:
   a base; and
   a conductive portion that is formed on at least one main surface of the base and is formed from a plurality of thin metal wires, wherein
   a mesh pattern in which different mesh shapes are arrayed in plan view is formed by the conductive portion, and the mesh pattern is configured so
   that a two-dimensional power spectrum of a centroid position distribution of the mesh shapes is given, such that an average intensity on a spatial frequency band side higher than a predetermined spatial frequency is larger than an average intensity on a spatial frequency band side lower than the predetermined spatial frequency, and
   that a centroid position distribution of the mesh shapes is given such that, a root mean square deviation of each centroid positions of the mesh shapes which are disposed along a predetermined direction with respect to a direction perpendicular to the predetermined direction is equal to or greater than 15 μm and equal to or less than 65 μm.

2. The conductive sheet according to claim 1, wherein the predetermined spatial frequency is a spatial frequency at which visual response characteristics of human are equivalent to 5% of a maximum response.

3. The conductive sheet according to claim 2,
   wherein the visual response characteristics of human are visual response characteristics obtained based on a Dooley-Shaw function at a distance of distinct vision of 300 mm, and
   the predetermined spatial frequency is 6 cycles/mm.

4. The conductive sheet according to claim 1, wherein the predetermined spatial frequency is a spatial frequency at which a value of the two-dimensional power spectrum is maximized.

5. The conductive sheet according to claim 1, wherein each of the mesh shapes is a polygonal shape.

6. The conductive sheet according to claim 5, wherein each of the mesh shapes is determined in accordance with a Voronoi diagram based on a plurality of positions in a planar region.

7. The conductive sheet according to claim 5, wherein each of the mesh shapes is determined in accordance with a Delaunay diagram based on a plurality of positions in a planar region.

8. The conductive sheet according to claim 1, wherein the mesh pattern is formed by arraying the mesh shapes without a space.

9. The conductive sheet according to claim 1, wherein the mesh pattern includes repeated shapes.

10. The conductive sheet according to claim 1,
    wherein the conductive portion includes a first conductive portion, which is formed on one main surface of the base and is formed from a plurality of thin metal wires, and a second conductive portion, which is formed on the other main surface of the base and is formed from a plurality of thin metal wires, and
    the mesh pattern is formed by combining the first and second conductive portions.

11. The conductive sheet according to claim 10, further comprising:
    a first protective layer that is provided on the one main surface and covers the first conductive portion; and
    a second protective layer that is provided on the other main surface and covers the second conductive portion,
    wherein a relative refractive index of the base with respect to the first protective layer and/or a relative refractive index of the base with respect to the second protective layer are equal to or greater than 0.86 and equal to or less than 1.15.

12. The conductive sheet according to claim 10, further comprising:
    a first dummy electrode portion that is formed on the one main surface and is formed from a plurality of thin metal wires electrically insulated from the first conductive portion,
    wherein the first conductive portion includes a plurality of first conductive patterns which are disposed in one direction and to which a plurality of first sensing portions are respectively connected,
    the first dummy electrode portion includes a plurality of first dummy patterns disposed in an opening portion between the first conductive patterns adjacent to each other, and
    a wiring density of the first dummy patterns is equal to a wiring density of the first conductive patterns.

13. The conductive sheet according to claim 1, wherein the conductive portion is formed on one main surface of the base.

14. A touch panel comprising:
    the conductive sheet according to claim 1; and
    a detection control unit that detects a contact position or a proximity position from a main surface side of the conductive sheet.

15. A display device, comprising:
    the conductive sheet according to claim 1;
    a detection control unit that detects a contact position or a proximity position from one main surface side of the conductive sheet; and
    a display unit that displays an image on a display screen based on a display signal,
    wherein the conductive sheet is disposed on the display screen with another main surface side facing the display unit.

16. A method for producing a conductive sheet, comprising:
- a generation step of generating image data representing a design of a mesh pattern in which different mesh shapes are arrayed;
- a calculation step of calculating an evaluation value, which quantifies a degree of variation of centroid positions of the mesh shapes, based on the generated image data;
- a determination step of determining a piece of the image data as output image data based on the calculated evaluation value and predetermined evaluation conditions; and
- an output step of obtaining a conductive sheet, in which the mesh pattern is formed on a base in plan view, by outputting and forming a conductive wire on the base based on the determined output image data,
- wherein, in the calculation step,
- a predetermined spatial frequency is set,
- an average intensity on a spatial frequency band side higher than the predetermined spatial frequency and an average intensity on a spatial frequency band side lower than the predetermined spatial frequency are calculated based on the two-dimensional power spectrum of a centroid position distribution of the mesh shapes obtained based on the generated image data, and
- a trail to calculate a root mean square deviation (RMS) of each centroid positions of the mesh shapes and arbitrarily selected which are disposed along a predetermined direction with respect to a direction perpendicular to the predetermined direction based on the generated image data is repeated to obtain the RMS in each trial and the average value (RMSave) thereof and the evaluation value (EV) is calculated by using the RMS and the RMSave, and
- wherein, in the determining step,
  - a piece of the image data is determined such that,
    - the average intensity on the spatial frequency band side higher than the predetermined spatial frequency is larger than the average intensity on the spatial frequency band side lower than the predetermined spatial frequency, and
    - the evaluation value (EV) is equal to or greater than 15 μm and equal to or less than 65 μm.

17. A non-transitory computer-readable recording medium that records a program causing a computer to execute as a procedure:
- a generation step of generating image data representing a design of a mesh pattern in which different mesh shapes are arrayed;
- a calculation step of calculating an evaluation value, which quantifies a degree of variation of centroid positions of the mesh shapes, based on the generated image data; and
- a determination step of determining a piece of the image data as output image data based on the calculated evaluation value and predetermined evaluation conditions,
- wherein, in the calculation step,
- a predetermined spatial frequency is set,
- an average intensity on a spatial frequency band side higher than the predetermined spatial frequency and an average intensity on a spatial frequency band side lower than the predetermined spatial frequency are calculated based on the two-dimensional power spectrum of a centroid position distribution of the mesh shapes obtained based on the generated image data, and
- a trail to calculate a root mean square deviation (RMS) of each centroid positions of the mesh shapes and arbitrarily selected which are disposed along a predetermined direction with respect to a direction perpendicular to the predetermined direction based on the generated image data is repeated to obtain the RMS in each trial and the average value (RMSave) thereof and the evaluation value (EV) is calculated by using the RMS and the RMSave, and
- wherein, in the determining step,
  - a piece of the image data is determined such that,
    - the average intensity on the spatial frequency band side higher than the predetermined spatial frequency is larger than the average intensity on the spatial frequency band side lower than the predetermined spatial frequency, and
    - the evaluation value (EV) is equal to or greater than 15 μm and equal to or less than 65 μm.

18. The method according to claim 16, wherein the evaluation value (EV) is calculated by the following expression $$EV = \sqrt{\frac{\sum_{m=1}^{M}(RMS(m) - RMS_{ave})^2}{M-1}}$$

where M refers to the number of trails to calculate RMS, and RMS(m) refers to the value of the RMS obtained in the $m^{th}$ trail.

19. The non-transitory recording medium according to claim 17, wherein the evaluation value (EV) is calculated by the following expression $$EV = \sqrt{\frac{\sum_{m=1}^{M}(RMS(m) - RMS_{ave})^2}{M-1}}$$

where M refers to the number of trails to calculate RMS, and RMS(m) refers to the value of the RMS obtained in the $m^{th}$ trail.

* * * * *